(12) United States Patent
Onuki et al.

(10) Patent No.: US 11,968,820 B2
(45) Date of Patent: Apr. 23, 2024

(54) SEMICONDUCTOR DEVICE AND ELECTRONIC DEVICE INCLUDING THE SEMICONDUCTOR DEVICE

(71) Applicant: Semiconductor Energy Laboratory Co., Ltd., Atsugi (JP)

(72) Inventors: Tatsuya Onuki, Atsugi (JP); Yuto Yakubo, Atsugi (JP); Seiya Saito, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 442 days.

(21) Appl. No.: 17/427,934

(22) PCT Filed: Feb. 11, 2020

(86) PCT No.: PCT/IB2020/051040
§ 371 (c)(1),
(2) Date: Aug. 3, 2021

(87) PCT Pub. No.: WO2020/170067
PCT Pub. Date: Aug. 27, 2020

(65) Prior Publication Data
US 2022/0093600 A1 Mar. 24, 2022

(30) Foreign Application Priority Data
Feb. 22, 2019 (JP) ................. 2019-030030

(51) Int. Cl.
*G11C 11/00* (2006.01)
*H01L 27/12* (2006.01)
(Continued)

(52) U.S. Cl.
CPC ......... *H10B 12/00* (2023.02); *H01L 27/1207* (2013.01); *H01L 27/1225* (2013.01);
(Continued)

(58) Field of Classification Search
CPC ................................. G11C 11/4045
(Continued)

(56) References Cited

U.S. PATENT DOCUMENTS 6,392,942 B2    5/2002   Noda et al.
7,898,893 B2    3/2011   Park et al.
(Continued)

FOREIGN PATENT DOCUMENTS

CN    101388236 A    3/2009
CN    101882620 A    11/2010
(Continued)

OTHER PUBLICATIONS

International Search Report (Application No. PCT/IB2020/051040) dated Apr. 7, 2020.
(Continued)

*Primary Examiner* — Hoai V Ho
(74) *Attorney, Agent, or Firm* — Eric J. Robinson; Robinson Intellectual Property Law Office, P.C.

(57) ABSTRACT

A novel semiconductor device is provided. The semiconductor device includes a driver circuit and a first transistor layer to a third transistor layer. The first transistor layer includes a first memory cell including a first transistor and a first capacitor. The second transistor layer includes a second memory cell including a second transistor and a second capacitor. The third transistor layer includes a switching circuit and an amplifier circuit. The first transistor is electrically connected to a first local bit line. The second transistor is electrically connected to a second local bit line. The switching circuit has a function of selecting the first local bit line or the second local bit line and electrically connecting the selected local bit line to the amplifier circuit. The first transistor layer to the third transistor layer are provided over the silicon substrate. The third transistor layer (Continued)

is provided between the first transistor layer and the second transistor layer.

19 Claims, 24 Drawing Sheets

(51) Int. Cl.
*H01L 29/24* (2006.01)
*H01L 29/786* (2006.01)
*H10B 12/00* (2023.01)
*G11C 5/06* (2006.01)
*G11C 8/08* (2006.01)

(52) U.S. Cl.
CPC ........ *H01L 27/124* (2013.01); *H01L 27/1255* (2013.01); *H01L 29/24* (2013.01); *H01L 29/78648* (2013.01); *H01L 29/7869* (2013.01); *G11C 5/06* (2013.01); *G11C 8/08* (2013.01)

(58) Field of Classification Search
USPC .......................................................... 365/149
See application file for complete search history.

(56) References Cited

U.S. PATENT DOCUMENTS

| | | | |
|---|---|---|---|
| 8,514,653 B2 | 8/2013 | Park et al. | |
| 8,526,263 B2 | 9/2013 | Park et al. | |
| 8,611,121 B2 | 12/2013 | Ahn et al. | |
| 9,542,977 B2 | 1/2017 | Onuki et al. | |
| 10,304,523 B2 | 5/2019 | Kato et al. | |
| 10,395,710 B1* | 8/2019 | Abedifard ............ | G11C 7/065 |
| 2001/0013659 A1 | 8/2001 | Noda et al. | |
| 2009/0086525 A1 | 4/2009 | Park et al. | |
| 2010/0309705 A1 | 12/2010 | Ahn et al. | |
| 2012/0063208 A1 | 3/2012 | Koyama et al. | |
| 2012/0307545 A1* | 12/2012 | McAdams ............ | G11C 11/221 365/145 |
| 2017/0178745 A1* | 6/2017 | Chen ...................... | G11C 17/18 |
| 2021/0134847 A1 | 5/2021 | Yamazaki et al. | |

FOREIGN PATENT DOCUMENTS

| | | |
|---|---|---|
| EP | 2037461 A | 3/2009 |
| EP | 2249348 A | 11/2010 |
| JP | 2001-185700 A | 7/2001 |
| JP | 2009-071313 A | 4/2009 |
| JP | 2010-263211 A | 11/2010 |
| KR | 2009-0027561 A | 3/2009 |
| KR | 2010-0120080 A | 11/2010 |
| WO | WO-2016/181256 | 11/2016 |

OTHER PUBLICATIONS

Written Opinion (Application No. PCT/IB2020/051040) dated Apr. 7, 2020.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

* cited by examiner

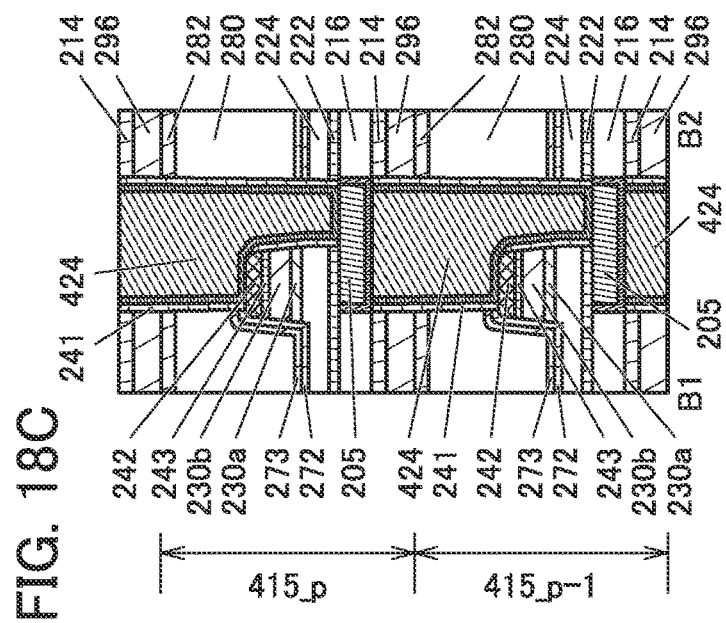
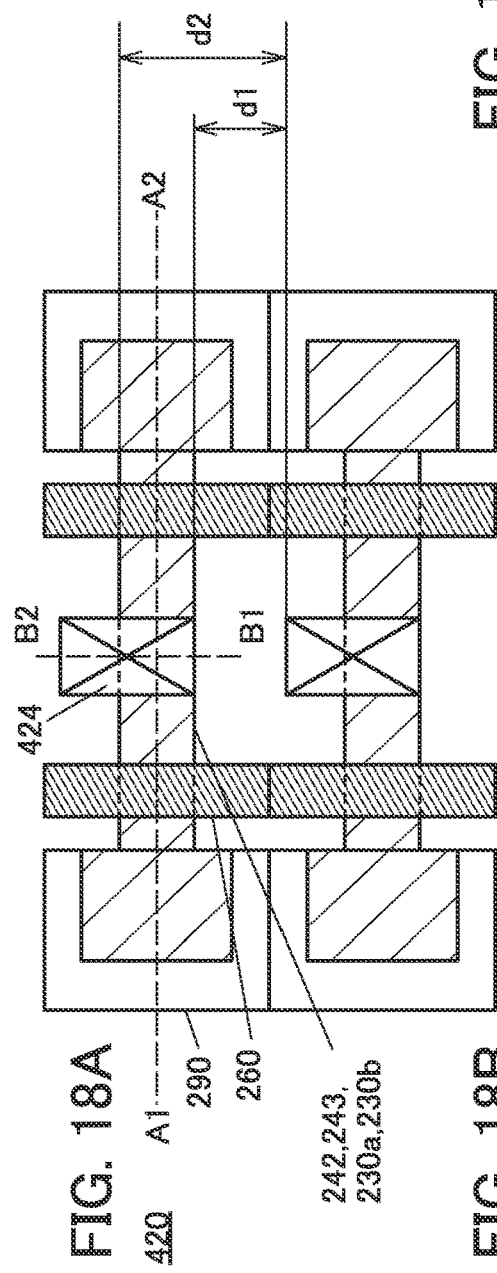
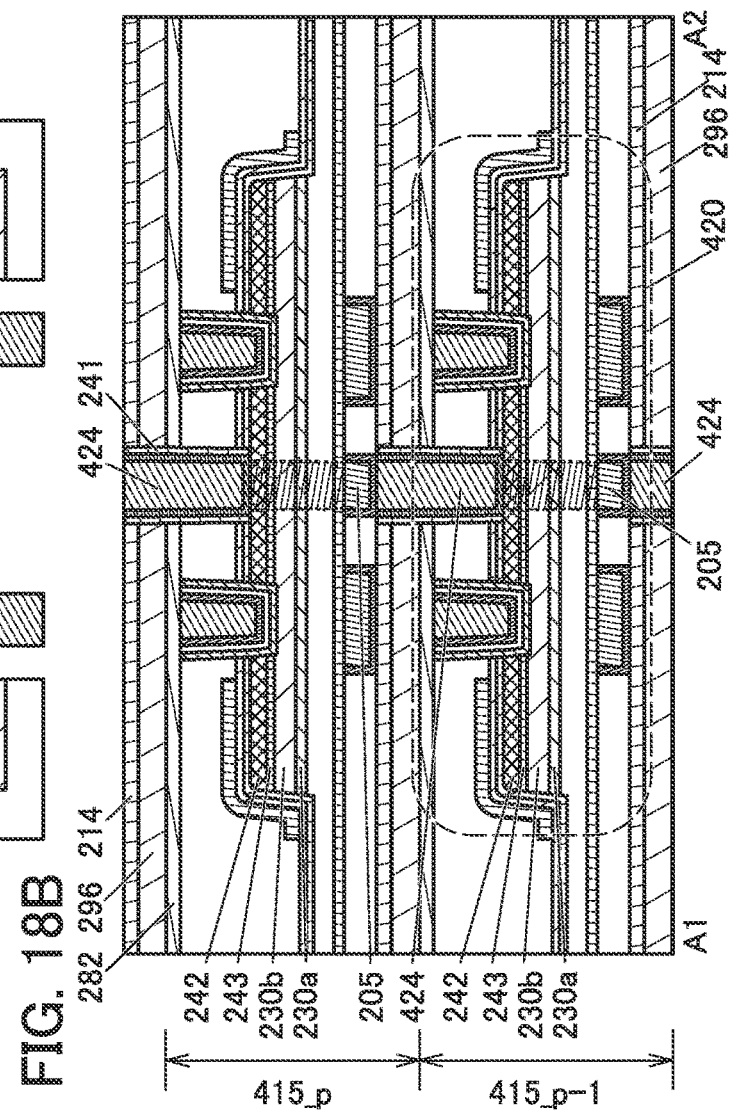

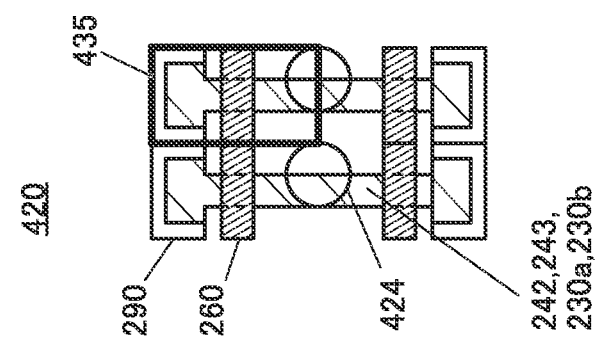
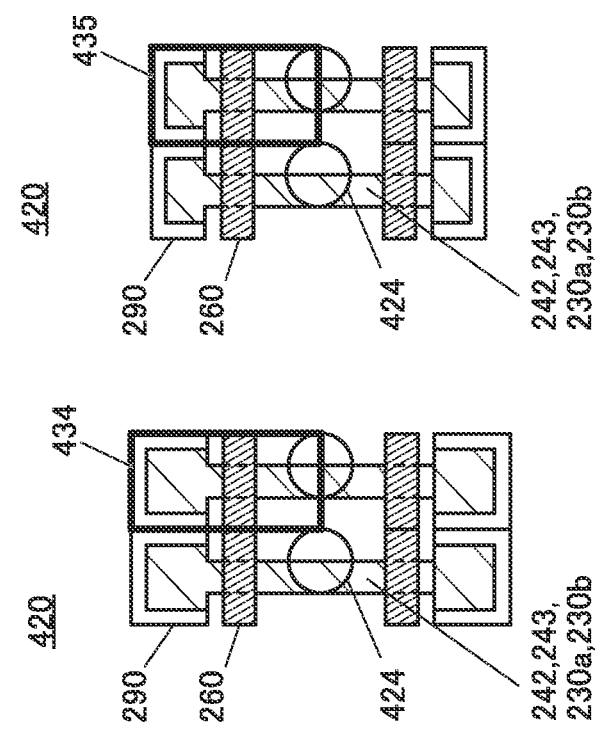
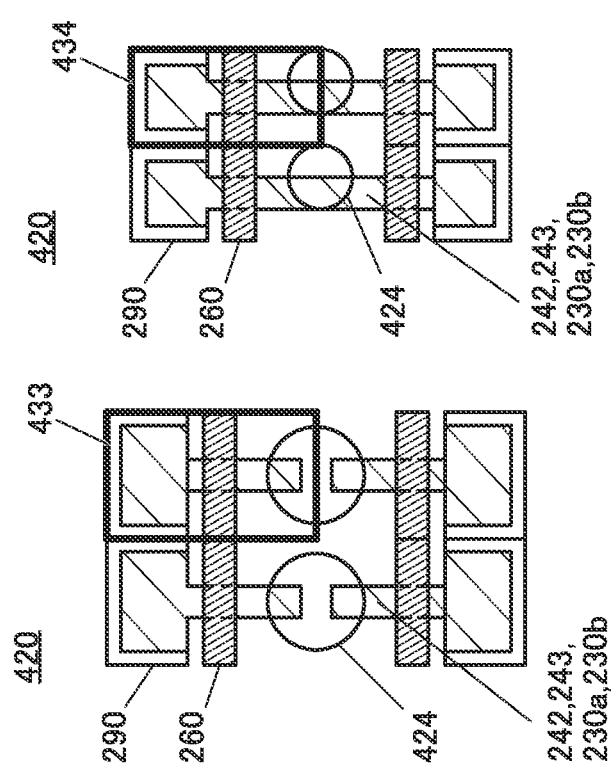
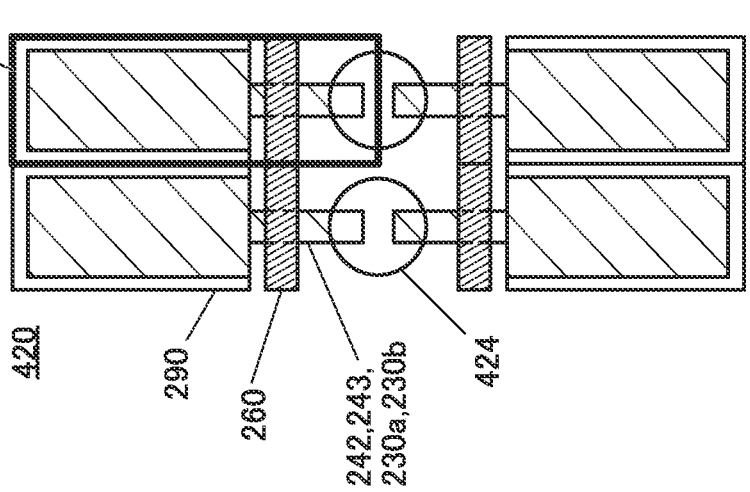

FIG. 20A
| Amorphous | Crystalline | Crystal |
|---|---|---|
| completely amorphous | •CAAC<br>•nc<br>•CAC | •single crystal<br>•poly crystal |
FIG. 20B
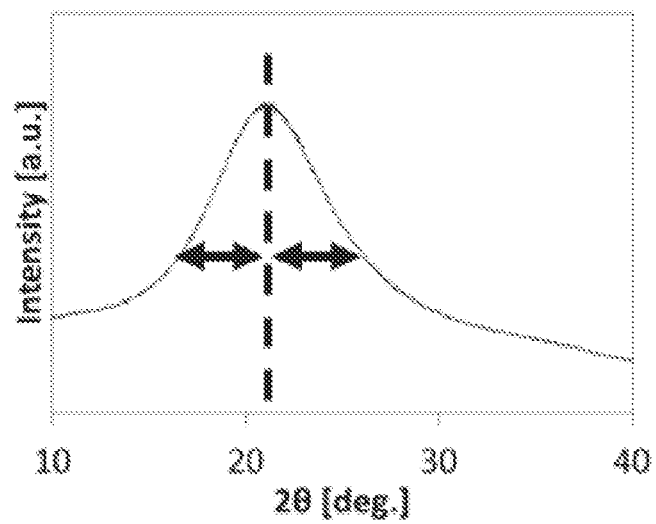
FIG. 20C
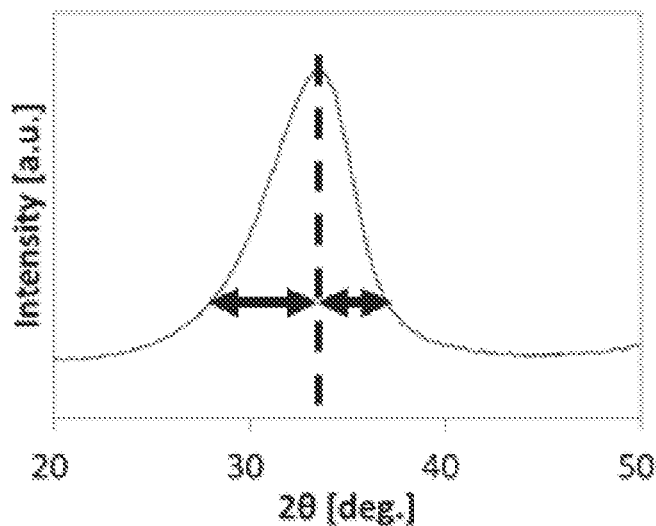

SEMICONDUCTOR DEVICE AND ELECTRONIC DEVICE INCLUDING THE SEMICONDUCTOR DEVICE

TECHNICAL FIELD

In this specification, a semiconductor device and the like are described.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

BACKGROUND ART

As a semiconductor that can be used in a transistor, a metal oxide has been attracting attention. An In—Ga—Zn oxide called "IGZO" and the like is a typical multi-component metal oxide. From the researches on IGZO, a CAAC (c-axis aligned crystalline) structure and an nc (nanocrystalline) structure, which are not single crystal nor amorphous, have been found (e.g., Non-Patent Document 1).

It has been reported that a transistor including a metal oxide semiconductor in a channel formation region (hereinafter, such a transistor may be referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4).

The manufacturing process of an OS transistor can be incorporated in a CMOS process with a conventional Si transistor, and an OS transistor can be stacked over a Si transistor. For example, Patent Document 1 discloses a structure in which a plurality of memory cell array layers including OS transistors are stacked over a substrate provided with a Si transistor.

REFERENCE

Patent Document

[Patent Document 1] United States Patent Application Publication No. 2012/0063208

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).
[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).
[Non-Patent Document 3] S. Amano et al., "Low Power LC Display Using In—Ga—Zn-Oxide TFTs Based on Variable Frame Frequency", SID Symp. Dig. Papers, vol. 41, pp. 626-629 (2010).
[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

An object of one embodiment of the present invention is to provide a semiconductor device or the like having a novel structure. Another object of one embodiment of the present invention is to provide a semiconductor device or the like functioning as a memory apparatus that utilizes an extremely low off-state current and having a novel structure that allows a reduction of manufacturing costs. Another object of one embodiment of the present invention is to provide a semiconductor device or the like functioning as a memory apparatus that utilizes an extremely low off-state current and having a novel structure that excels in low power consumption. Another object of one embodiment of the present invention is to provide a semiconductor device or the like functioning as a memory apparatus that utilizes an extremely low off-state current and having a novel structure that allows a reduction in the size of the device. Another object of one embodiment of the present invention is to provide a semiconductor device or the like functioning as a memory apparatus that utilizes an extremely low off-state current and having a novel structure that allows excellent reliability with a small variation in electrical characteristics of transistors.

The description of a plurality of objects does not disturb the existence of each object. One embodiment of the present invention does not necessarily achieve all the objects described as examples. Furthermore, objects other than those listed are apparent from description of this specification, and such objects can be objects of one embodiment of the present invention.

Means for Solving the Problems

One embodiment of the present invention is a semiconductor device including a driver circuit including a plurality of transistors using a silicon substrate for a channel, and a first transistor layer to a third transistor layer each including a plurality of transistors using a metal oxide for a channel. The first transistor layer includes a first memory cell including a first transistor and a first capacitor; the second transistor layer includes a second memory cell including a second transistor and a second capacitor; the third transistor layer includes a switching circuit and an amplifier circuit; the first transistor is electrically connected to a first local bit line; the second transistor is electrically connected to a second local bit line; the switching circuit has a function of selecting the first local bit line or the second local bit line and electrically connecting the selected local bit line to the amplifier circuit; the first transistor layer to the third transistor layer are provided over the silicon substrate; and the third transistor layer is provided between the first transistor layer and the second transistor layer.

In one embodiment of the present invention, the semiconductor device is preferable in which the first local bit line and the second local bit line are provided in a direction perpendicular to a surface of the silicon substrate or a direction substantially perpendicular to the surface of the silicon substrate.

In one embodiment of the present invention, the semiconductor device is preferable in which a global bit line is included and the global bit line has a function of electrically connecting the amplifier circuit and the driver circuit.

In one embodiment of the present invention, the semiconductor device is preferable in which the global bit line is provided in the direction perpendicular to the surface of the silicon substrate or the direction substantially perpendicular to the surface of the silicon substrate.

In one embodiment of the present invention, the semiconductor device is preferable in which the metal oxide contains In, Ga, and Zn.

One embodiment of the present invention is a semiconductor device including a driver circuit including a plurality of transistors using a silicon substrate for a channel, and an element layer in which a plurality of transistor layers are stacked. The element layer includes a first transistor layer to a third transistor layer each including a plurality of transistors using a metal oxide for a channel; the first transistor layer includes a first memory cell including a first transistor and a first capacitor; the second transistor layer includes a second memory cell including a second transistor and a second capacitor; the third transistor layer includes a switching circuit and an amplifier circuit; the first transistor is electrically connected to a first local bit line; the second transistor is electrically connected to a second local bit line; the switching circuit has a function of selecting the first local bit line or the second local bit line and electrically connecting the selected local bit line to the amplifier circuit; the element layer is stacked over the silicon substrate; and the third transistor layer is provided between the first transistor layer and the second transistor layer.

In one embodiment of the present invention, the semiconductor device is preferable in which the first local bit line and the second local bit line are provided in a direction perpendicular to a surface of the silicon substrate or a direction substantially perpendicular to the surface of the silicon substrate.

In one embodiment of the present invention, the semiconductor device is preferable in which a global bit line is included and the global bit line has a function of electrically connecting the amplifier circuit and the driver circuit.

In one embodiment of the present invention, the semiconductor device is preferable in which the global bit line is provided in the direction perpendicular to the surface of the silicon substrate or the direction substantially perpendicular to the surface of the silicon substrate.

In one embodiment of the present invention, the semiconductor device is preferable in which the metal oxide contains In, Ga, and Zn.

One embodiment of the present invention is an electronic device including the semiconductor device described above and at least one of an antenna, a battery, an operation switch, a microphone, and a speaker.

Note that other embodiments of the present invention will be shown in the description of the following embodiments and the drawings.

Effect of the Invention

With one embodiment of the present invention, a semiconductor device or the like having a novel structure can be provided. With another embodiment of the present invention, a semiconductor device or the like functioning as a memory apparatus that utilizes an extremely low off-state current and having a novel structure that allows a reduction of manufacturing costs can be provided. With another embodiment of the present invention, a semiconductor device or the like functioning as a memory apparatus that utilizes an extremely low off-state current and having a novel structure that excels in low power consumption can be provided. With another embodiment of the present invention, a semiconductor device or the like functioning as a memory apparatus that utilizes an extremely low off-state current and having a novel structure that allows a reduction in the size of the device can be provided. With another embodiment of the present invention, a semiconductor device or the like functioning as a memory apparatus that utilizes an extremely low off-state current and having a novel structure that allows excellent reliability with a small variation in electrical characteristics of transistors can be provided.

The description of a plurality of effects does not disturb the existence of other effects. One embodiment of the present invention does not necessarily achieve all the effects described as examples. In one embodiment of the present invention, other objects, effects, and novel features will be apparent from the description of the specification and the drawings.

BRIEF DESCRIPTION OF THE DRAWINGS

FIG. 18A is a top view showing a structure example of a semiconductor device and FIG. 18B and FIG. 18C are schematic cross-sectional views showing a structure example of the semiconductor device.

FIG. 19A, FIG. 19B, FIG. 19C, and FIG. 19D are top views showing structure examples of a semiconductor device.

FIG. 20A is a drawing describing classification of IGZO crystal structures, FIG. 20B is a drawing describing an XRD spectrum of quartz glass, and FIG. 20C is a drawing describing an XRD spectrum of crystalline IGZO.

MODE FOR CARRYING OUT THE INVENTION

Figure 1:
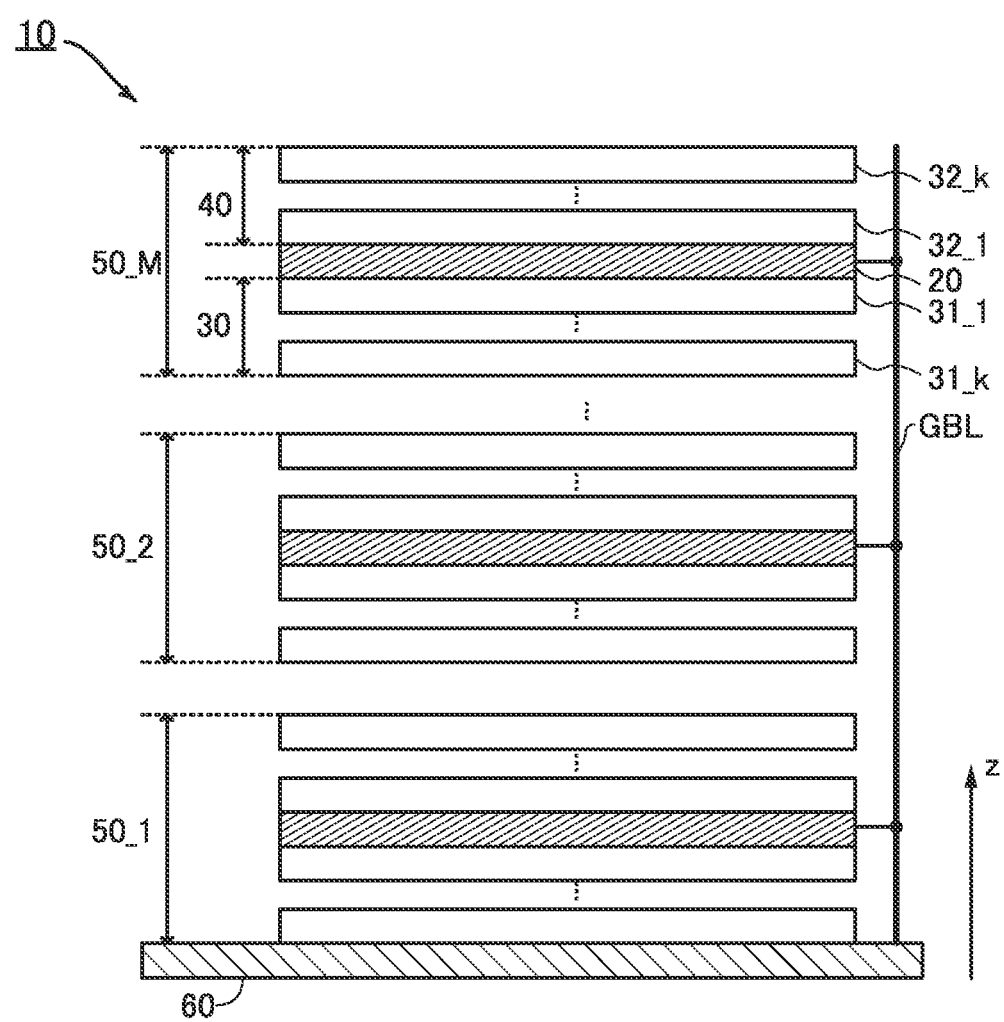
FIG. 1 is a block diagram showing a structure example of a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or the scope of claims. Alternatively, for example, in this specification and the like, a "first" component in one embodiment can be omitted in other embodiments or the scope of claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numerals, and, in particular, need to be distinguished from each other, an identification sign such as "_1", "_2", "[n]", or "[m,n]" is sometimes added to the reference numerals. For example, the second wiring GL is referred to as a wiring GL[2].

Embodiment 1

Structure examples of a semiconductor device of one embodiment of the present invention are described with reference to FIG. 1 to FIG. 12.

Note that a semiconductor device refers to a device that utilizes semiconductor characteristics, and means a circuit including a semiconductor element (a transistor, a diode, a photodiode, and the like) and a device including the circuit. The semiconductor device described in this embodiment can function as a memory apparatus that utilizes a transistor with an extremely low off-state current.

FIG. 1 shows a block diagram for describing a cross-sectional structure of a semiconductor device 10.

The semiconductor device 10 includes element layers 50_1 to 50_M (M is a natural number) over a silicon substrate 60. The element layers 50_1 to 50_M each include a transistor layer 20, a transistor layer 30, and a transistor layer 40. The transistor layer 30 includes transistor layers 31_1 to 31_k (k is a natural number greater than or equal to 2). The transistor layer 40 includes transistor layers 32_1 to 31_k.

To describe the arrangement of the components, the block diagram shown in FIG. 1 corresponds to a schematic view in which the z-axis direction is defined. The z-axis direction refers to a direction perpendicular to a plane of the silicon substrate 60 or a direction substantially perpendicular to the plane of the silicon substrate 60. Note that "substantially perpendicular" refers to a state where an arrangement angle is greater than or equal to 85° and less than or equal to 95°. Note that for easy understanding, the z-axis direction is sometimes referred to as the perpendicular direction. The plane of the silicon substrate 60 corresponds to a plane formed by an x-axis and a y-axis that are defined as directions perpendicular to the z-axis direction or directions substantially perpendicular to the z-axis direction. For easy understanding, the x-axis direction and the y-axis direction are sometimes referred to as the depth direction and the horizontal direction, respectively.

The transistor layer 30 including the transistor layers 31_1 to 31_k includes a plurality of memory cells (not illustrated) in each transistor layer. The memory cells each include a transistor and a capacitor. Note that the capacitor is sometimes referred to as a capacitive element. The element layer refers to a layer in which elements such as a capacitor and a transistor are provided and is a layer including members such as a conductor, a semiconductor, an insulator, and the like.

Similarly, the transistor layer 40 including the transistor layers 32_1 to 32_k includes a plurality of memory cells in each transistor layer. The memory cells each include a transistor and a capacitor.

The memory cells included in the transistor layers 31_1 to 31_k and 32_1 to 32_k can each be referred to as a DOSRAM (Dynamic Oxide Semiconductor Random Access Memory) using a transistor including an oxide semiconductor in a channel formation region (hereinafter, referred to as an OS transistor) for a memory. The memory cell can be formed using one transistor and one capacitor, so that a high-density memory can be achieved. The use of an OS transistor can prolong a data retention period.

In the structure of one embodiment of the present invention, with the use of a memory cell including an OS transistor, charge corresponding to a desired voltage can be retained in the capacitor located at the other of a source and a drain by utilizing characteristics of an extremely low leakage current flowing between the source and the drain in an off state (hereinafter, an off-state current). In other words, data written once can be retained for a long time in the memory cell. This can reduce the data refresh rate, leading to low power consumption.

In addition, the memory cell using an OS transistor can rewrite and read data by charging or discharging of charge; thus, a substantially unlimited number of times of data writing and data reading are possible. Unlike a magnetic memory, a resistive random access memory, or the like, the memory cell using an OS transistor has no change in the structure at the atomic level and thus exhibits high rewrite endurance. Furthermore, unlike a flash memory, the memory cell using an OS transistor does not show instability due to an increase of electron trap centers even when a rewriting operation is repeated.

The memory cell using an OS transistor can be freely placed, for example, over a silicon substrate including a transistor including silicon in a channel formation region (hereinafter, a Si transistor), so that integration can be easily performed. Furthermore, an OS transistor can be manufactured with a manufacturing apparatus similar to that for a Si transistor and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed with an electric circuit network that can independently control input and output of signals flowing between a source and a drain depending on a voltage supplied to the gate electrode or the back gate electrode. Thus, circuit design with the same ideas as those of an LSI is possible. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

The transistor layer 20 has a function of being capable of selecting one of the plurality of memory cells included in the transistor layer 30 and the transistor layer 40 and performing data writing and data reading.

The transistor layer 20 includes a plurality of switching circuits and a plurality of amplifier circuits. The switching circuit has a function of selecting a local bit line connected to one of the plurality of memory cells. With this structure, in reading, data can be read by amplifying a small potential difference of the local bit line, outputting the amplified potential difference to a global bit line GBL, and then further amplifying the potential difference by a sense amplifier provided over the silicon substrate. The amplifier circuit has a function of amplifying a signal of the local bit line and outputting the amplified signal to the global bit line GBL.

Note that the local bit line is a bit line directly connected to the memory cell. The global bit line GBL is a bit line electrically connected to the memory cell by selecting any one of a plurality of local bit lines. A data signal supplied to the global bit line or the local bit line corresponds to a signal written to the memory cell or a signal read from the memory cell. The data signal is described as a binary signal having a high-level or low-level potential corresponding to data 1 or data 0. The data signal may be a multilevel signal having three or more values. To increase visibility, the global bit line GBL is sometimes indicated by a bold line, a bold dotted line, or the like in the drawing.

As illustrated in FIG. 1, the transistor layer 20 is provided between the transistor layer 30 and the transistor layer 40 in the z-axis direction. The transistor layers 20 included in the element layers 50_1 to 50_M each have a function of outputting, to a driver circuit included in the silicon substrate 60, a data signal selected by the switching circuit and then amplified by the amplifier circuit through the global bit line GBL. The transistor layer 20 has a function of supplying, to a local bit line selected by the switching circuit, a data signal output from the driver circuit included in the silicon substrate 60.

The silicon substrate 60 includes the driver circuit for performing data writing or data reading on a memory cell selected by the transistor layer 20 through the global bit line GBL and the local bit line. The driver circuit includes a plurality of Si transistors using the silicon substrate 60 for a channel.

One embodiment of the present invention uses an OS transistor with an extremely low off-state current as a transistor provided in each element layer. Accordingly, the refresh rate of data retained in the memory cell can be reduced, so that a semiconductor device with reduced power consumption can be obtained. Note that OS transistors can be stacked, and can be fabricated in the perpendicular direction by employing the same manufacturing process repeatedly, which can reduce the manufacturing cost. Moreover, in one embodiment of the present invention, the memory density can be increased by arranging the transistors included in the memory cell in not the plane direction but the perpendicular direction, so that the device can be downsized. Furthermore, since an OS transistor has a smaller variation in electrical characteristics than a Si transistor even at a high-temperature environment, the semiconductor device can function as a highly reliable memory apparatus in which stacked and integrated transistors have a small variation in electrical characteristics.

Figure 2A:
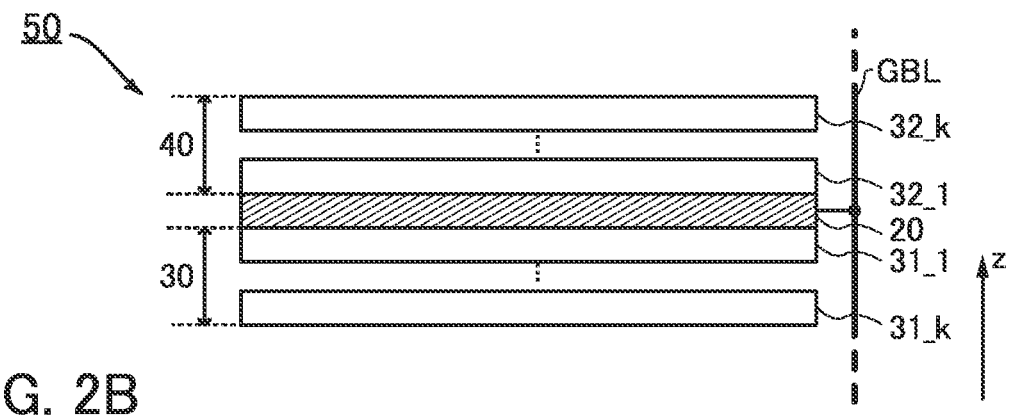
FIG. 2A is a block diagram showing a structure example of a semiconductor device and FIG. 2B is a circuit diagram showing a structure example of the semiconductor device.

Next, FIG. 2A shows a block diagram of the element layer 50 corresponding to any one of the element layers 50_1 to 50_M in FIG. 1.

As also illustrated in FIG. 1, the element layer 50 of one embodiment of the present invention has a structure in which the transistor layers 30 and 40 including the memory cells are provided over and under the transistor layer 20 in the z-axis direction. With such a structure, the distance between the transistor layer 20 and the transistor layer 30 or the transistor layer 40 can be made small. The local bit line is shortened and thus parasitic capacitance can be reduced. The transistor layers 30 and 40 are fabricated in the perpendicular direction by employing the same manufacturing process repeatedly, which can reduce the manufacturing cost.

Figure 2B:
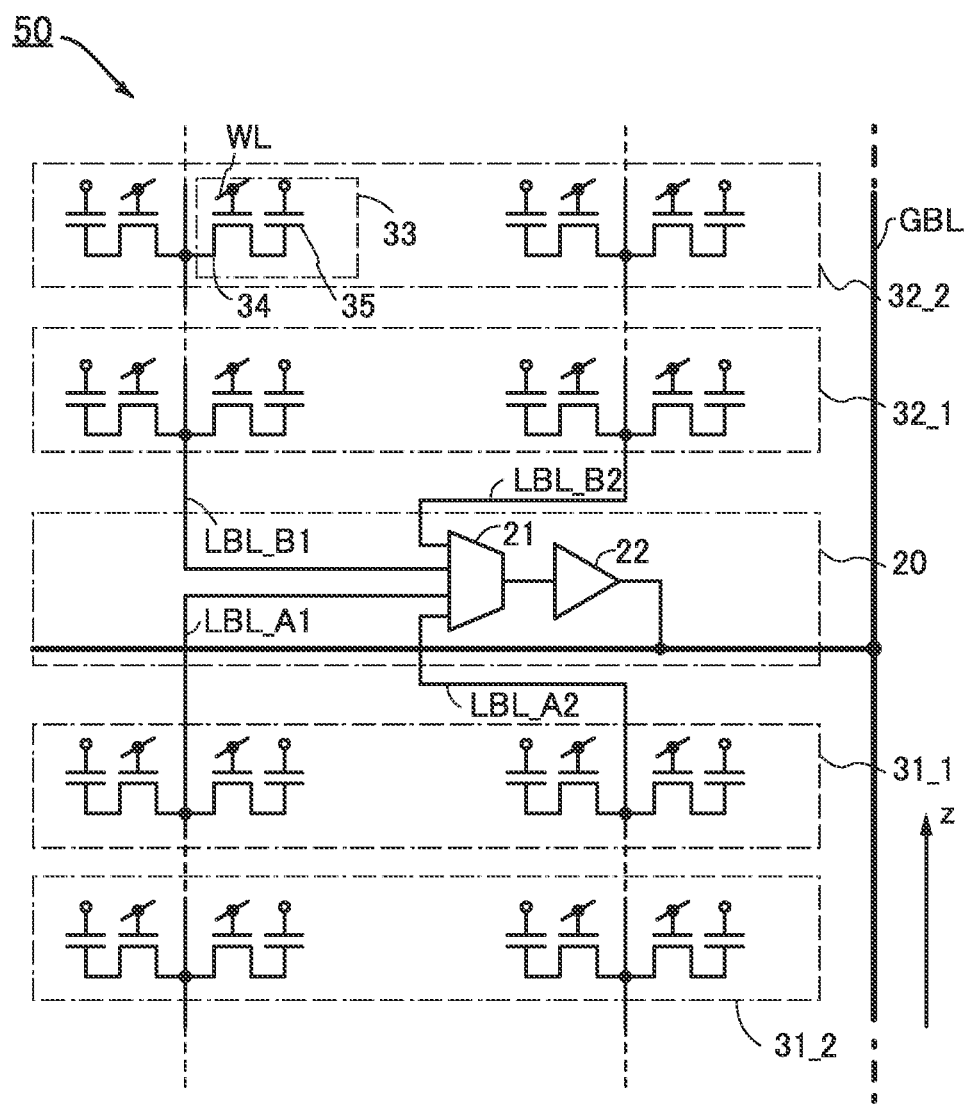

FIG. 2B is a drawing that illustrates the components of the element layer 50 illustrated in FIG. 2A using circuit symbols.

The transistor layer 20 includes a switching circuit 21 and an amplifier circuit 22. The transistor layers 31_1, 31_2, 32_1, and 32_2 each include a plurality of memory cells 33. The memory cell 33 includes a transistor 34 and a capacitor 35. The transistor 34 functions as a switch whose conduction state and non-conduction state are switched in accordance with control of a word line WL connected to a gate. A local bit line LBL_A1 and a local bit line LBL_A2 correspond to local bit lines connected to the memory cells 33 positioned on the lower layer side of the switching circuit 21. A local bit line LBL_B1 and a local bit line LBL_B2 correspond to local bit lines connected to the memory cells 33 positioned on the upper layer side of the switching circuit 21.

As illustrated in FIG. 2B, the local bit line LBL_A1, the local bit line LBL_A2, the local bit line LBL_B1, and the local bit line LBL_B2 are connected to one of a source and a drain of the transistor 34 included in respective memory cells. The capacitor 35 is connected to the other of the source and the drain of the transistor 34.

The transistor 34 is an OS transistor described above. The capacitor 35 has a structure in which an insulator is sandwiched between conductors serving as electrodes. As the conductor forming the electrode, a semiconductor layer to which conductivity is imparted or the like can be used besides metal. Although the details will be described later, in addition to the structure in which the capacitor 35 is placed in a position overlapping with the upper side or lower side of the transistor 34, part of the semiconductor layer, electrode, or the like included in the transistor 34 can be used as one electrode of the capacitor 35.

The switching circuit 21 has a function of supplying, in accordance with a signal for selecting any one of the plurality of local bit lines such as the local bit line LBL_A1, the local bit line LBL_A2, the local bit line LBL_B1, and the local bit line LBL_B2, the potential of the local bit line to the amplifier circuit 22. The switching circuit 21 includes a circuit functioning as a multiplexer.

The amplifier circuit 22 has a function of amplifying the potential of a local bit line selected by the switching circuit 21 and outputting the amplified potential to the global bit line GBL. Alternatively, the amplifier circuit 22 has a function of transmitting the potential of the global bit line GBL to a local bit line selected by the switching circuit 21. The amplifier circuit 22 has a function of a reading circuit capable of amplifying the potential of the local bit line and outputting the amplified potential to the global bit line GBL in accordance with a signal for controlling data signal reading. Moreover, the amplifier circuit 22 has a function of a writing circuit capable of transmitting the potential of the global bit line GBL to a local bit line selected by the switching circuit 21 in accordance with a signal for controlling data signal writing.

Like the transistor 34, the transistors included in the switching circuit 21 and the amplifier circuit 22 included in the transistor layer 20 are preferably OS transistors. The transistor layers 20, 30, and 40 included in the element layer 50 using OS transistors can be stacked over the silicon substrate including Si transistors, which facilitates integration.

Although FIG. 2B illustrates the structure of the switching circuit 21 in which the local bit line LBL_A1, the local bit line LBL_A2, the local bit line LBL_B1, and the local bit line LBL_B2 connected to the memory cells in the layers over and under the transistor layer 20 are selected, another structure may be employed.

Figure 3A:
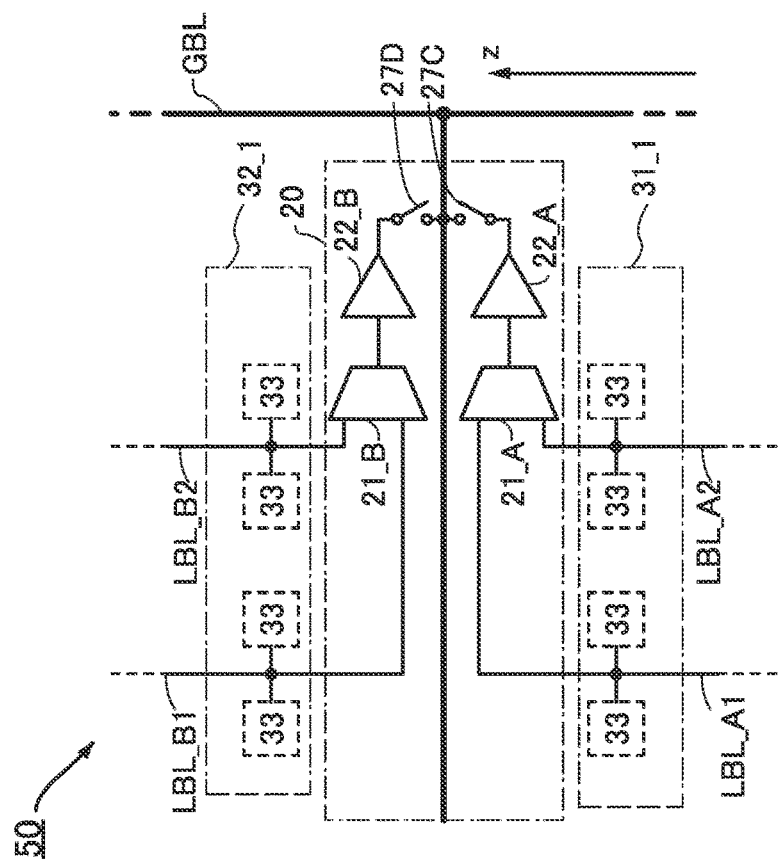
FIG. 3A and FIG. 3B are circuit diagrams showing structure examples of a semiconductor device.
Figure 3B:
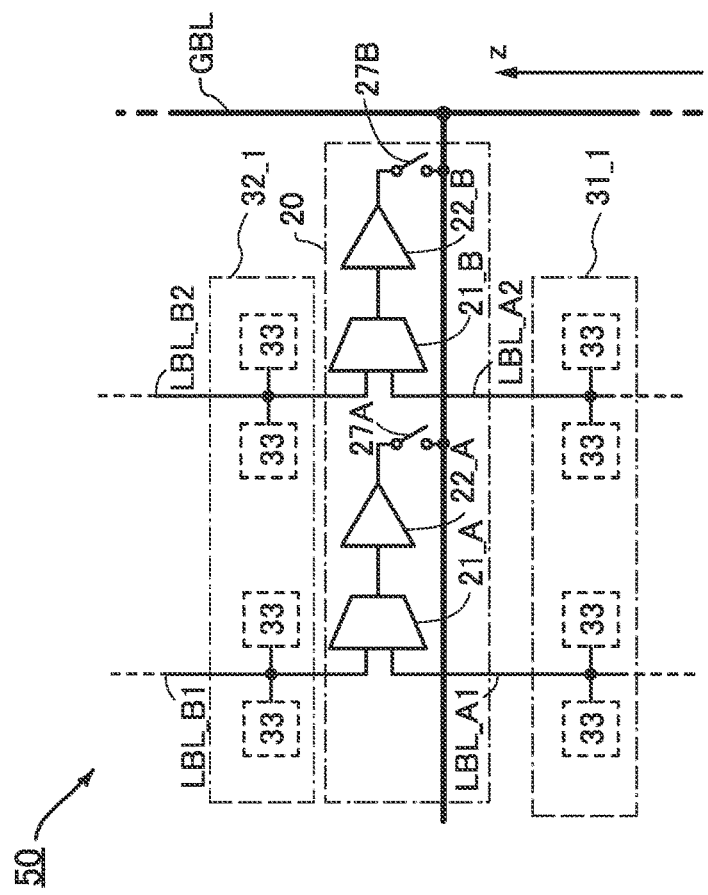

FIG. 3A and FIG. 3B illustrate structures different from the connection of the local bit line LBL_A1, the local bit line LBL_A2, the local bit line LBL_B1, and the local bit line LBL_B2 described with reference to FIG. 2B.

A switching circuit may be provided for each of the local bit line pairs provided for the layers over and under the transistor layer including the switching circuit. For example, as illustrated in FIG. 3A, a structure may be employed in which a switching circuit 21_A switches the local bit line LBL_A1 and the local bit line LBL_B1 and outputs to the global bit line GBL through an amplifier circuit 22_A and a switch 27A, and a switching circuit 21_B switches the local bit line LBL_A2 and the local bit line LBL_B2 and outputs to the global bit line GBL through an amplifier circuit 22_B and a switch 27B. Note that the switch 27A and the switch 27B can be formed using OS transistors described above.

Alternatively, a switching circuit may be provided for the local bit lines provided for each of the layers over and under the transistor layer including the switching circuit. For example, as illustrated in FIG. 3B, a structure may be employed in which the switching circuit 21_A switches the local bit line LBL_A1 and the local bit line LBL_A2 and outputs to the global bit line GBL through the amplifier circuit 22_A and a switch 27C, and the switching circuit 21_B switches the local bit line LBL_B1 and the local bit line LBL_B2 and outputs to the global bit line GBL through the amplifier circuit 22_B and a switch 27D. Note that the switch 27C and the switch 27D can be formed using OS transistors described above.

Figure 4B:
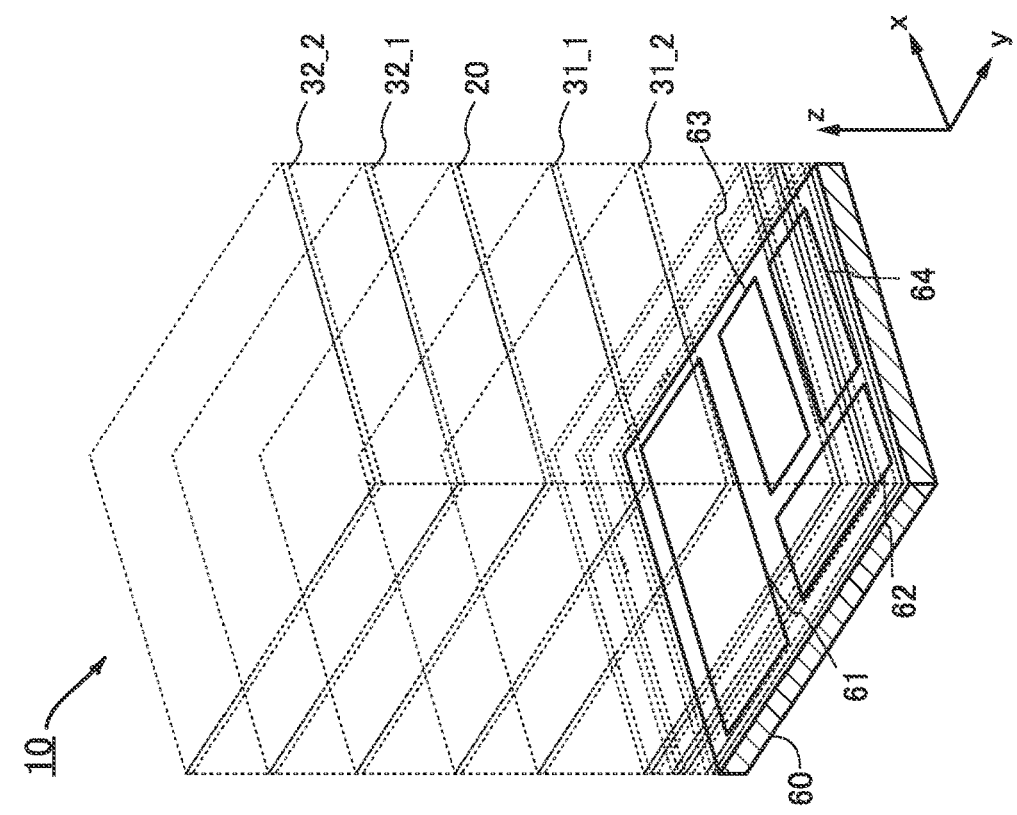
FIG. 4A and FIG. 4B are schematic views showing a structure example of a semiconductor device.
Figure 4A:
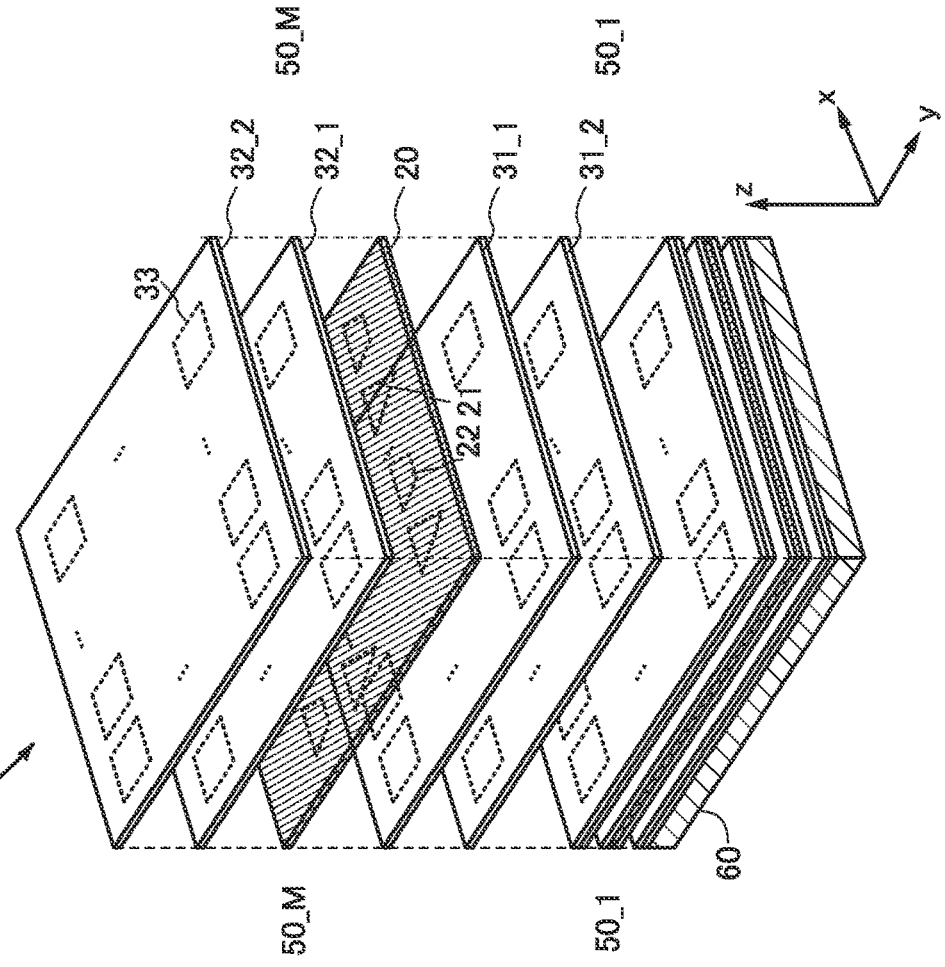

FIG. 4A shows a perspective view of the semiconductor device 10 illustrated in FIG. 1 in which the element layers 50_1 to 50_M are placed over the silicon substrate 60. FIG. 4A illustrates the depth direction (x-axis direction) and the horizontal direction (y-axis direction) in addition to the perpendicular direction (z-axis direction).

In FIG. 4A, the memory cells 33 included in the transistor layers 31_1, 31_2, 32_1, and 32_2 are indicated by dotted lines. The switching circuit 21 and the amplifier circuit 22 included in the transistor layer 20 are indicated by dotted lines.

As illustrated in FIG. 4A, in the semiconductor device 10 of one embodiment of the present invention, the transistor layers 20, 30, and 40 including OS transistors are stacked. Therefore, the transistor layers can be fabricated in the perpendicular direction by employing the same manufacturing process repeatedly, which can reduce the manufacturing cost. Moreover, in the semiconductor device 10 of one embodiment of the present invention, the memory density can be increased by arranging the transistor layers 30 and 40 including the memory cells 33 in not the plane direction but the perpendicular direction, so that the device can be downsized.

FIG. 4B is a drawing illustrating circuits provided over the silicon substrate 60 while the components included in the element layers 50_1 to 50_M illustrated in FIG. 4A are omitted. FIG. 4B illustrates a control logic circuit 61, a row driver circuit 62, a column driver circuit 63, and an output circuit 64 formed using Si transistors over the silicon substrate 60. The control logic circuit 61, the row driver circuit 62, the column driver circuit 63, and the output circuit 64 will be described in detail in Embodiment 4.

Figure 5:
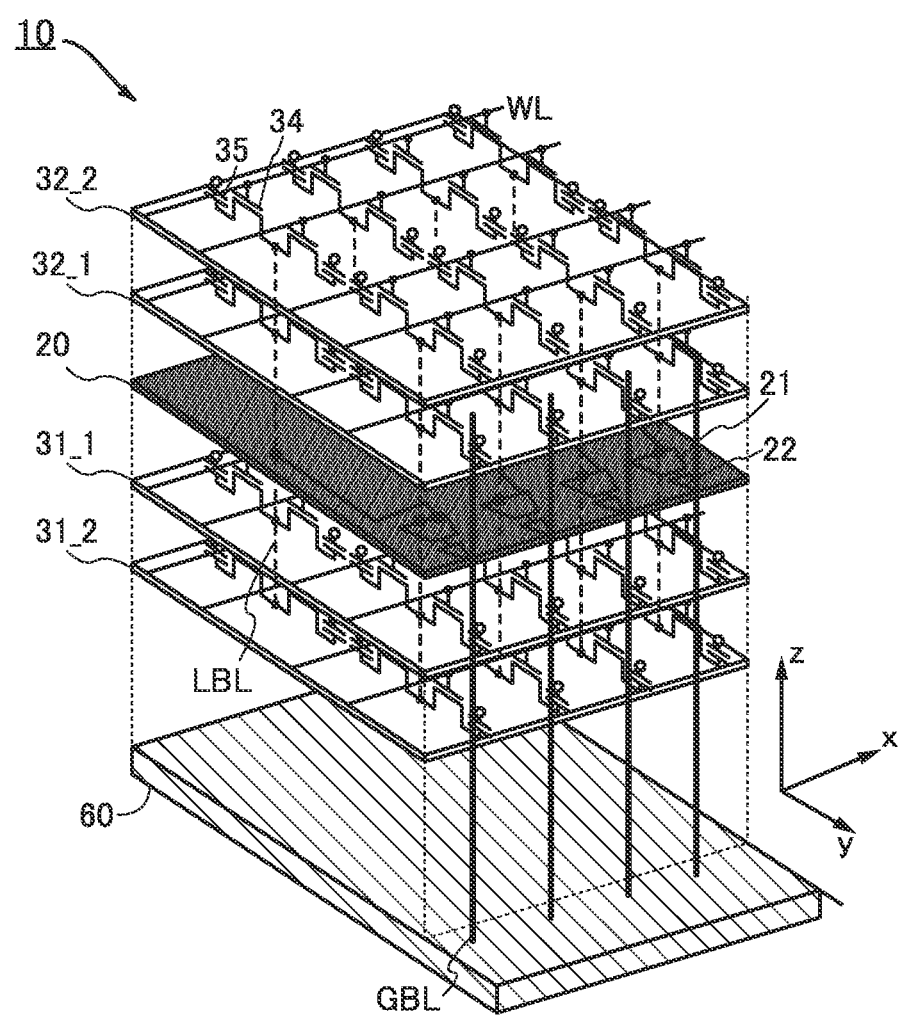
FIG. 5 is a schematic view showing a structure example of a semiconductor device.

FIG. 5 corresponds to a drawing illustrating the transistor layers 20, 31_1, 31_2, 32_1, and 32_2 extracted from the semiconductor device 10 illustrated in FIG. 4A. FIG. 5 illustrates the switching circuit 21 and the amplifier circuit 22 in the transistor layer 20. FIG. 5 illustrates the transistors 34, the capacitors 35, the local bit lines LBL, and the word lines WL included in the memory cells of the transistor layers 31_1, 31_2, 32_1, and 32_2. To increase visibility, the local bit line LBL is indicated by a dashed line in FIG. 5. FIG. 5 illustrates the global bit line GBL provided to penetrate the transistor layers in the z-axis direction. As described above, to increase visibility, the global bit line GBL is indicated by a line bolder than other lines.

As illustrated in FIG. 5, in the semiconductor device 10, the local bit line LBL connected to the transistor 34 included in the memory cell and the global bit line GBL connected to the amplifier circuit 22 of the transistor layer 20 and the silicon substrate 60 are provided in the z-axis direction, i.e., the direction perpendicular to the silicon substrate 60. With such a structure, the local bit line LBL between each memory cell and the switching circuit can be shortened. Thus, the parasitic capacitance of the local bit line LBL can be reduced significantly, so that a potential can be read even when the memory cell retains a multilevel data signal. Furthermore, one embodiment of the present invention can read data retained in the memory cell as current; thus, even multilevel data can be easily read.

Figure 6:
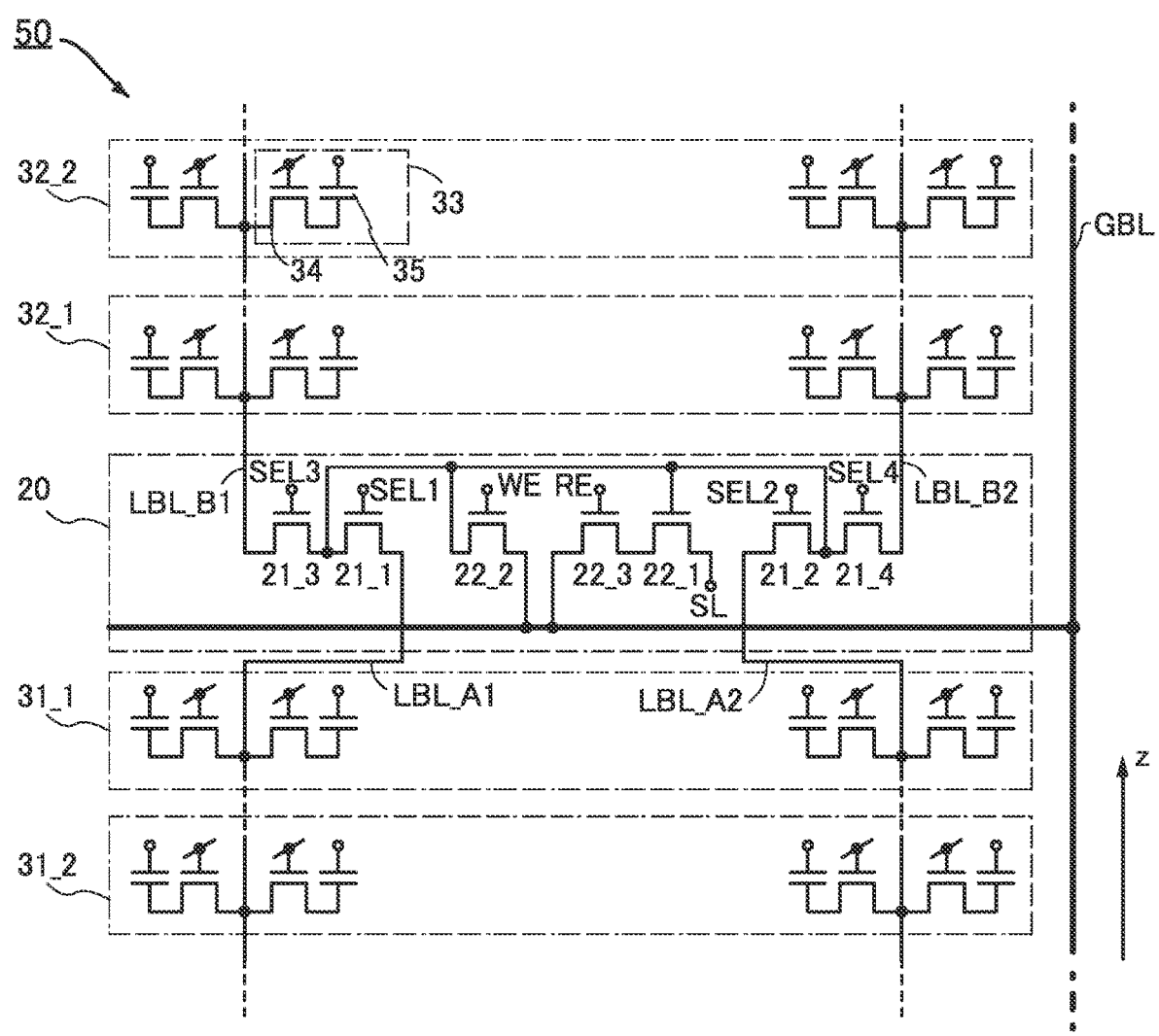
FIG. 6 is a circuit diagram showing a structure example of a semiconductor device.

FIG. 6 is a drawing showing circuit structure examples of the switching circuit 21 and the amplifier circuit 22 included in the transistor layer 20. FIG. 6 illustrates transistors 21_1 to 21_4 functioning as multiplexers or demultiplexers that select any one of the local bit lines LBL_A1, LBL_A2, LBL_B1, and LBL_B2 described with reference to FIG. 2B and transistors 22_1 to 22_3 included in the amplifier circuit 22.

The transistor 21_1 controls electrical continuity between the local bit line LBL_A1 and a gate of the transistor 22_1. A signal SEL1 for controlling the conduction state of the transistor 21_1 is supplied to a gate of the transistor 21_1. Similarly, the transistors 21_2 to 21_4 control electrical continuity between the gate of the transistor 22_1 and the local bit lines LBL_A2, LBL_B1, and LBL_B2, respectively. Signals SEL2 to SEL4 are supplied to gates of the transistors 21_2 to 21_4, respectively.

The transistors 22_1 and 22_3 are transistors included in a circuit that reads a data signal retained in the memory cell 33. The gate of the transistor 22_1 is connected to one of a source and a drain of each of the transistors 21_1 to 21_4. A source of the transistor 221 is connected to a wiring SL to which a constant potential is supplied. A drain of the transistor 22_1 is connected to a source of the transistor 223. A drain of the transistor 223 is connected to the global bit line GBL. The potential of the gate of the transistor 22_1 is amplified by the transistor 22_1, and the amplified potential is read to the global bit line GBL in accordance with control of a signal RE supplied to a gate of the transistor 22_3.

The transistor 22_2 is a transistor included in a circuit that writes a data signal to be retained in the memory cell 33. One of a source and a drain of the transistor 22_2 is connected to one of the source and the drain of each of the transistors 21_1 to 21_4. The other of the source and the drain of the transistor 22_2 is connected to the global bit line GBL. The transistor 22_2 can write the potential of the global bit line GBL to the memory cell 33 in accordance with control of a signal WE supplied to a gate and a signal supplied to the word line WL.

Figure 7A:
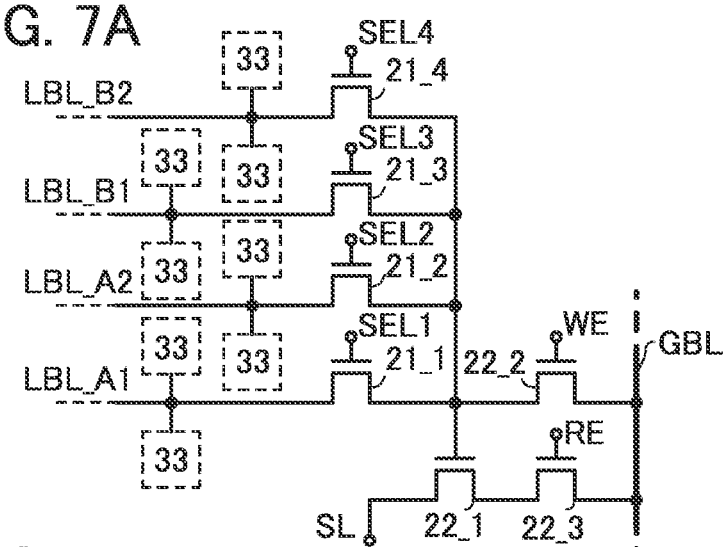
FIG. 7A, FIG. 7B, and FIG. 7C are circuit diagrams showing structure examples of a semiconductor device.
Figure 7B:
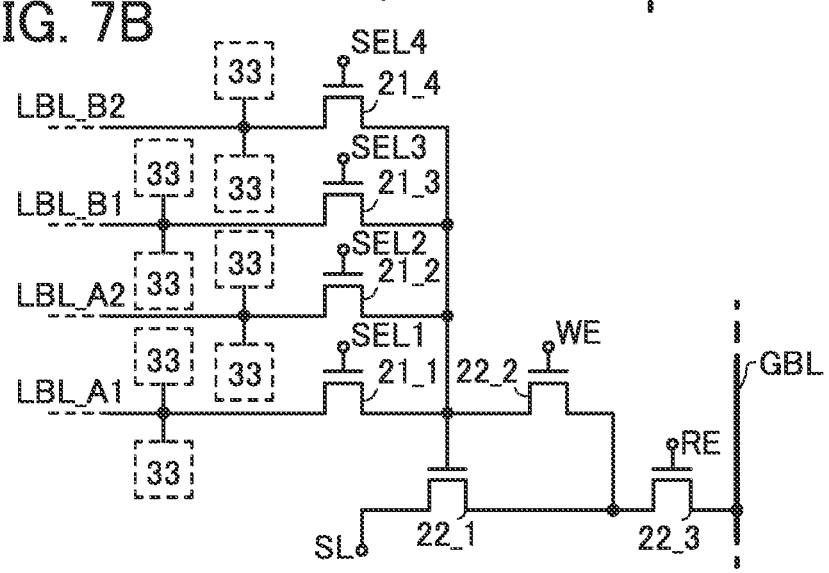
Figure 7C:
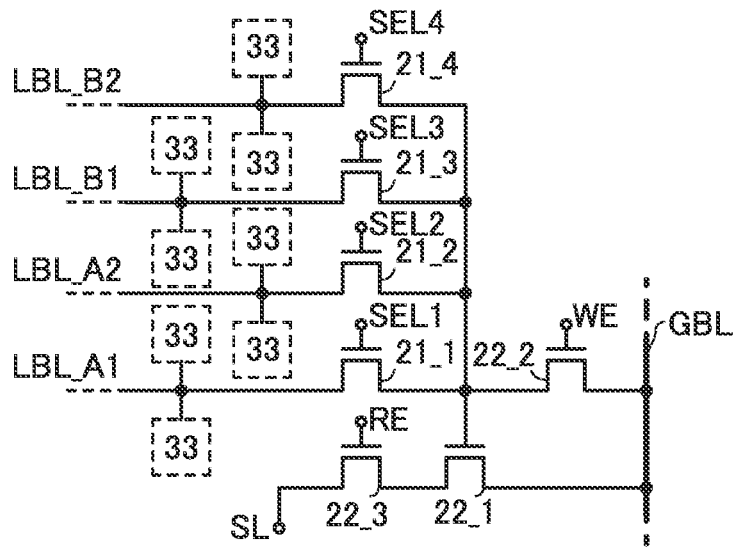

FIG. 7A to FIG. 7C show circuit diagrams for describing modification examples of the switching circuit 21 and the amplifier circuit 22 illustrated in FIG. 6.

FIG. 7A is a circuit diagram illustrating the components extracted from the switching circuit 21 and the amplifier circuit 22 described with reference to FIG. 6. As illustrated in FIG. 7A, the transistors 21_1 to 21_4 included in the switching circuit 21 select any one of the local bit lines LBL_A1, LBL_A2, LBL_B1, and LBL_B2 and control electrical continuity between the selected local bit line and the gate of the transistor 22_1. The transistors 21_1 to 21_4 included in the switching circuit 21 perform control so that the potential of the global bit line GBL is supplied to any one of the local bit lines LBL_A1, LBL_A2, LBL_B1, and LBL_B2 through the transistor 22_2. The amplifier circuit 22 performs control so that the potential of the gate of the transistor 22_1 is converted into current to be transmitted to the global bit line GBL.

FIG. 7B corresponds to a circuit diagram in which connection of a terminal serving as one of the source and the drain of the transistor 22_2 in FIG. 7A is changed. FIG. 7C corresponds to a circuit diagram in which the transistor 22_3 in FIG. 7A is connected to the wiring SL side. As described above, the switching circuit 21 and the amplifier circuit 22 of one embodiment of the present invention can have various circuit structures.

Figure 8A:
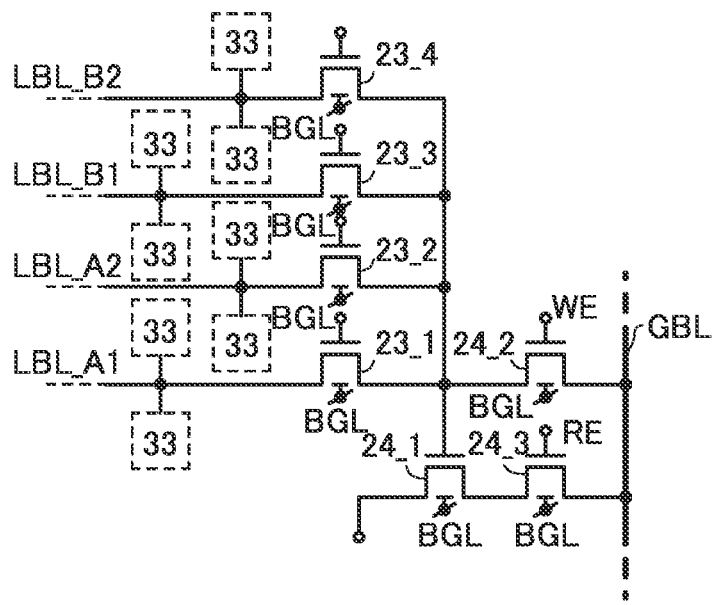
FIG. 8A and FIG. 8B are circuit diagrams showing structure examples of a semiconductor device.

The transistors in FIG. 7A to FIG. 7C are each illustrated as a transistor having a top-gate structure or a bottom-gate structure without a back gate electrode; however, the structures of the transistors are not limited thereto. For example, as illustrated in FIG. 8A, transistors 23_1 to 23_4 and 24_1 to 24_3 each having a back gate electrode connected to a back gate electrode line BGL may be used. With the structure in FIG. 8A, the electrical characteristics such as threshold voltages of the transistors 23_1 to 23_4 and 24_1 to 24_3 can be easily controlled from the outside.

Figure 8B:
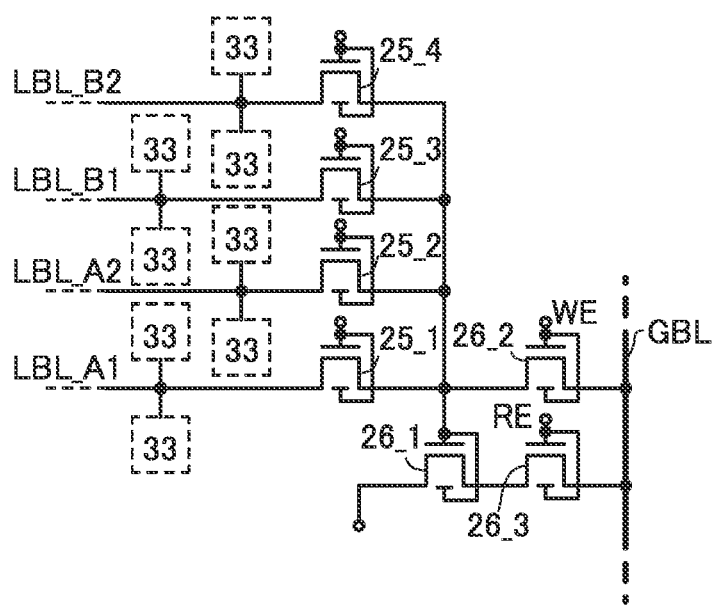

Alternatively, as illustrated in FIG. 8B, transistor 25_1 to 25_4 and 26_1 to 26_3 each having a back gate electrode connected to a gate electrode may be used. The structure in FIG. 8B can increase the amount of current flowing through the transistors 25_1 to 25_4 and 26_1 to 26_3.

Figure 9A:
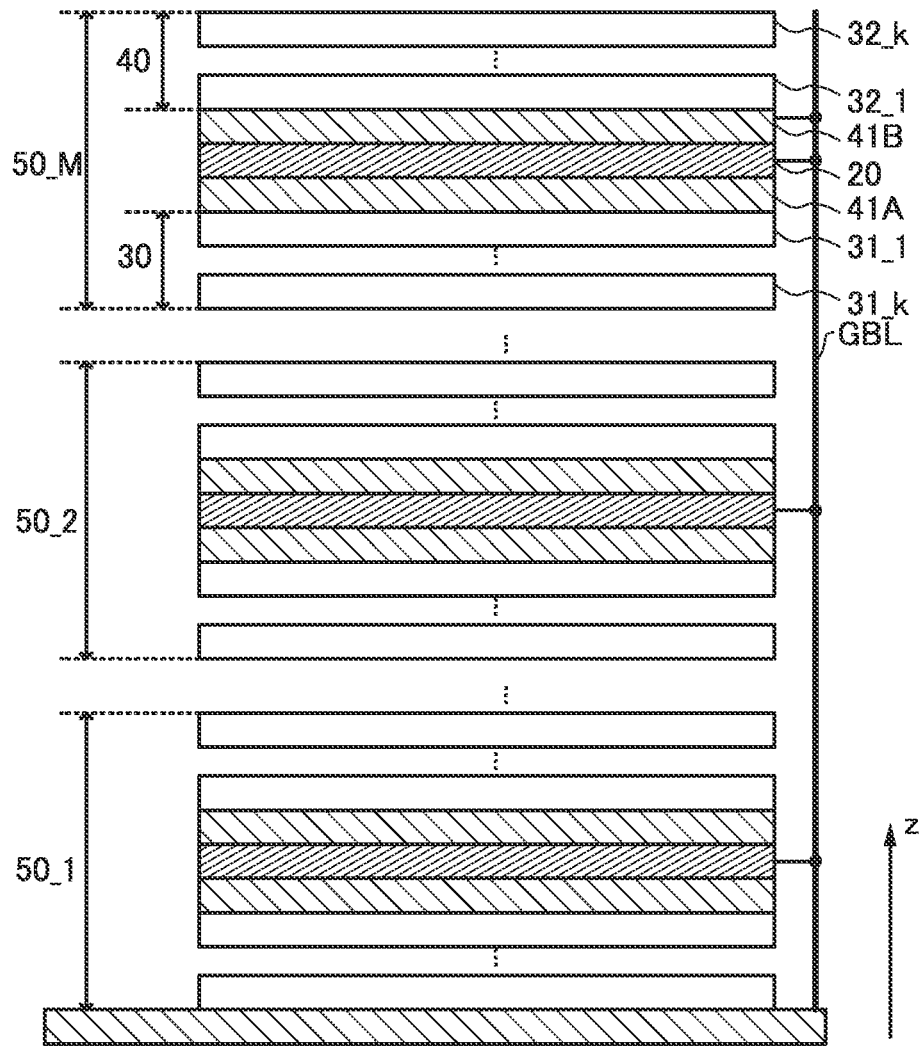
FIG. 9A is a block diagram showing a structure example of a semiconductor device and FIG. 9B is a circuit diagram showing a structure example of the semiconductor device.

Although the semiconductor device 10 in FIG. 1 is described as a semiconductor device including one kind of memory cell, two or more kinds of memory cells may be included. FIG. 9A shows a block diagram of a semiconductor device 10A corresponding to a modification example of the semiconductor device 10.

The semiconductor device 10A is different from the semiconductor device 10 in that transistor layers 41A and 41B, which include memory cells having different circuit structures, are provided between the transistor layer 20 and the transistor layer 30 and between the transistor layer 20 and the transistor layer 40.

Figure 9B:
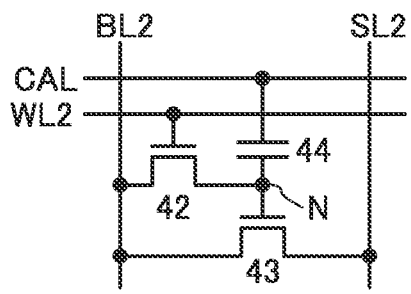

FIG. 9B is a circuit diagram showing a structure example of the memory cell included in each of the transistor layers 41A and 41B. A memory cell 41 includes a transistor 42, a transistor 43, and a capacitor 44.

One of a source and a drain of the transistor 42 is connected to a gate of the transistor 43. The gate of the transistor 43 is connected to one electrode of the capacitor 44. The other of the source and the drain of the transistor 42 and one of a source and a drain of the transistor 43 are connected to a wiring BL2. The other of the source and the drain of the transistor 43 is connected to a wiring SL2. The other electrode of the capacitor 44 is electrically connected to a wiring CAL. Here, a node which is connected to the one of the source and the drain of the transistor 42, the gate of the transistor 43, and the one electrode of the capacitor 44 is referred to as a node N.

The wiring CAL has a function of a wiring for applying a predetermined potential to the other electrode of the capacitor 44. The potential of the wiring CAL in reading data from the memory cell 41 is made different from the potential of the wiring CAL in writing data to the memory cell 41 and at the time of retaining the data in the memory cell 41. Accordingly, the apparent threshold voltage of the transistor 43 in reading data from the memory cell 41 can be made different from the apparent threshold voltage of the transistor 43 in writing data to the memory cell 41 and at the time of retaining the data in the memory cell 41.

In the case where the memory cell 41 has the structure illustrated in FIG. 9B, current does not flow between the wiring SL2 and the wiring BL2 in writing data to the memory cell 41 and at the time of retaining the data in the memory cell 41, regardless of data written to the memory cell 41. In contrast, in reading data from the memory cell 41, current corresponding to the data retained in the memory cell 41 flows between the wiring SL2 and the wiring BL2.

The transistors 42 and 43 are preferably OS transistors. As described above, an OS transistor has an extremely low off-state current. Accordingly, charge corresponding to data written to the memory cell 41 can be retained at the node N for a long time. In other words, data written once can be retained for a long time in the memory cell 41. This can reduce the data refresh rate, leading to low power consumption of the semiconductor device of one embodiment of the present invention.

The memory cell 41 having the structure illustrated in FIG. 9B can be referred to as a NOSRAM (Nonvolatile Oxide Semiconductor RAM) using an OS transistor for a memory. The NOSRAM is characterized by being capable of non-destructive read. Meanwhile, the above-described DOSRAM performs destructive read for reading retained data.

The semiconductor device 10A including the memory cell 41 can transfer frequently-read data from a DOSRAM to a NOSRAM. Since the NOSRAM is capable of non-destructive read as described above, the data refresh rate can be reduced. Therefore, the semiconductor device of one embodiment of the present invention can have reduced power consumption.

Figure 10A:
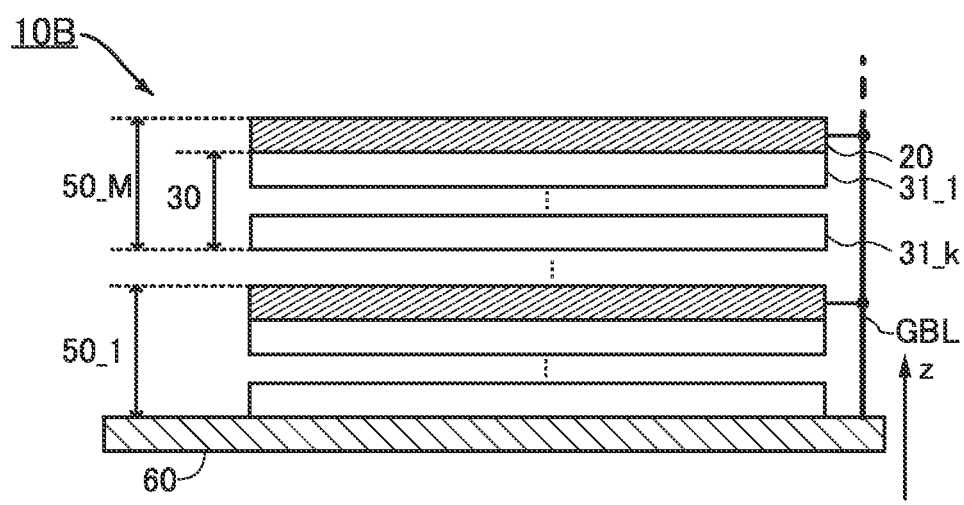
FIG. 10A and FIG. 10B are block diagrams showing structure examples of a semiconductor device.
Figure 10B:
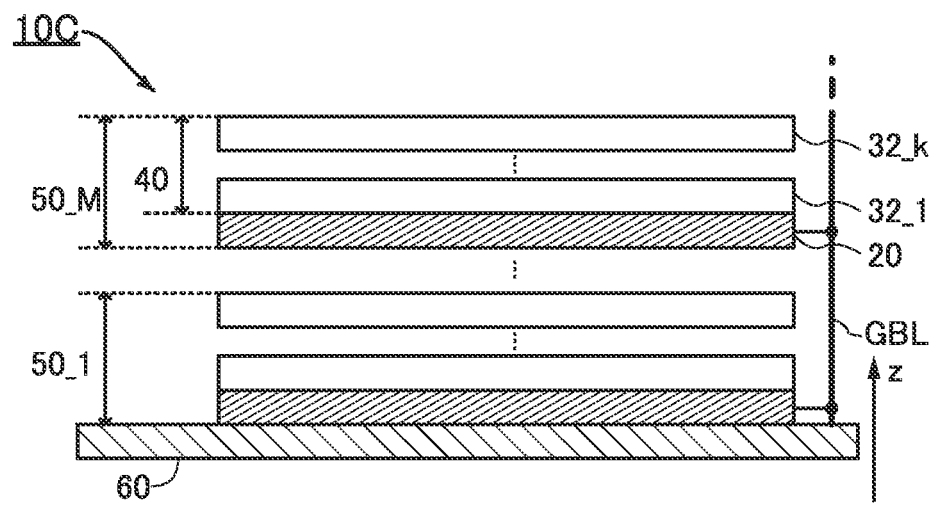

FIG. 10A and FIG. 10B show circuit diagrams for describing modification examples of the semiconductor device 10 illustrated in FIG. 1.

FIG. 10A illustrates a semiconductor device 10B in which the transistor layer 40 is omitted from each of the element layers 50_1 to 50_M in the semiconductor device 10 illustrated in FIG. 1. The semiconductor device 10B illustrated in FIG. 10A includes the transistor layer 30 including transistors 31_1 to 31_k under each of the transistor layers 20 including the switching circuits and the amplifier circuits. Also in this structure, the switching circuit and the amplifier circuit can perform an operation for controlling the memory cell.

FIG. 10B illustrates a semiconductor device 10C in which the transistor layer 30 is omitted from each of the element layers 50_1 to 50_M in the semiconductor device 10 illustrated in FIG. 1. The semiconductor device 10C illustrated in FIG. 10B includes the transistor layer 40 including transistors 32_1 to 32_k over each of the transistor layers 20 including the switching circuits and the amplifier circuits. Also in this structure, the switching circuit and the amplifier circuit can perform an operation for controlling the memory cell.

Figure 11:
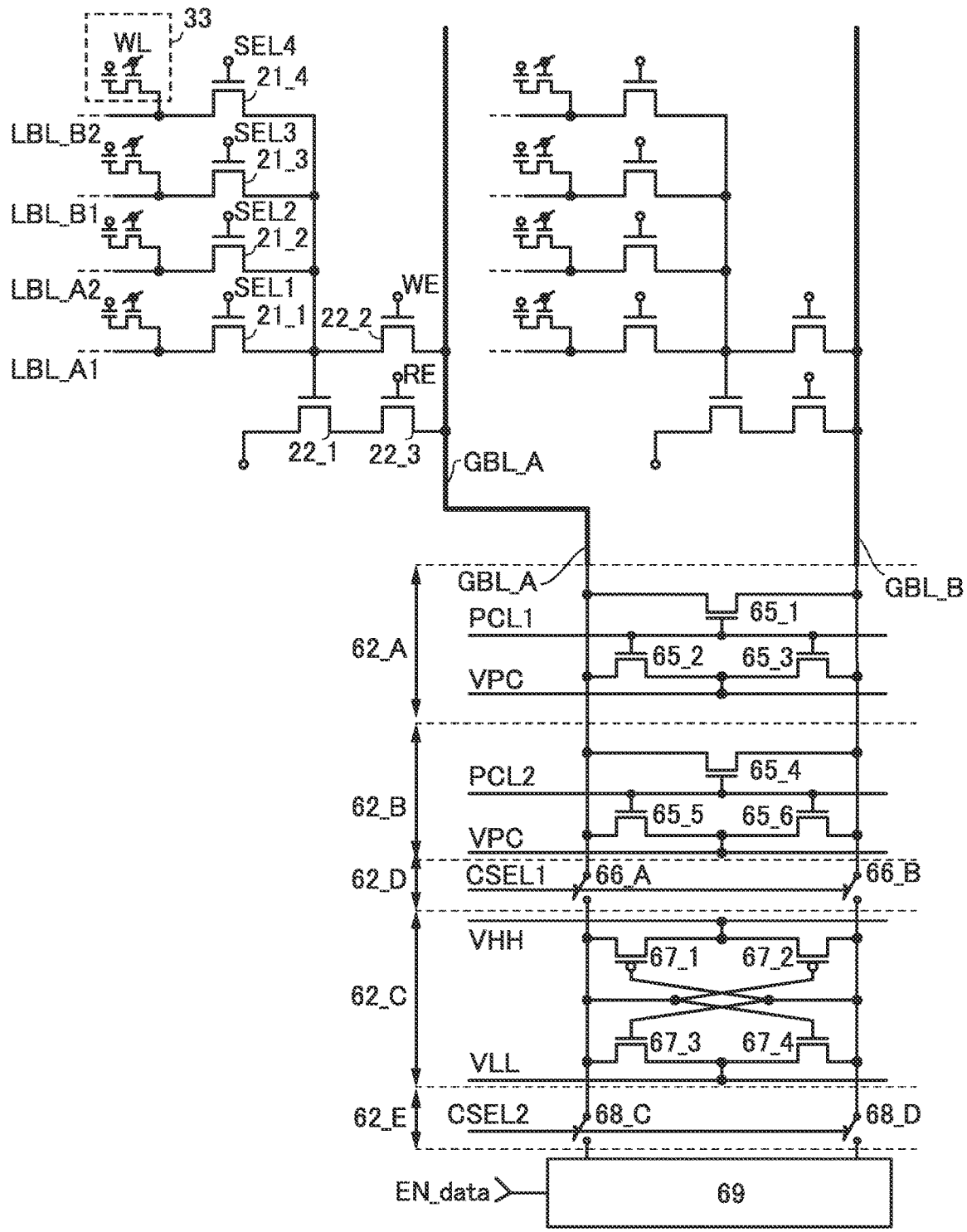
FIG. 11 is a circuit diagram showing a structure example of a semiconductor device.

FIG. 11 illustrates a precharge circuit 62_A, a precharge circuit 62_B, a sense amplifier 62_C, a switching circuit 62_D, a switching circuit 62_E, and a write/read circuit 69 over the silicon substrate 60, which are formed using Si transistors, in addition to the memory cell 33 and the transistors 21_1 to 214 and 22_1 to 223 described with reference to FIG. 6 and FIG. 7A; the transistors are OS transistors included in the switching circuit and the amplifier circuit.

The transistors 22_2 and 22_3 included in the transistor layer 20 are connected to global bit lines GBL_A and GBL_B as illustrated in FIG. 11. Like the local bit lines LBL_A1, LBL_A2, LBL_B1, and LBL_B2, the global bit lines GBL_A and GBL_B are provided in a direction perpendicular to the surface of the silicon substrate 60 and connected to Si transistors.

The precharge circuit 62_A includes n-channel transistors 65_1 to 65_3. The precharge circuit 62_A is a circuit for precharging the global bit line GBL_A, the global bit line GBL_B, and a selected local bit line to an intermediate potential VPC corresponding to a potential VDD/2 between VDD and VSS in accordance with a precharge signal and the signal WE supplied to a precharge line PCL1.

The precharge circuit 62_B includes n-channel transistors 65_4 to 65_6. The precharge circuit 62_B is a circuit for precharging the global bit line GBL_A, the global bit line GBL_B, and a selected local bit line to an intermediate potential VPC corresponding to a potential VDD/2 between VDD and VSS in accordance with a precharge signal and the signal WE supplied to a precharge line PCL2.

The sense amplifier 62_C includes p-channel transistors 67_1 and 67_2 and n-channel transistors 67_3 and 67_4 connected to a wiring VHH and a wiring VLL, respectively. The wiring VHH and the wiring VLL are wirings having a function of supplying VDD and VSS, respectively. The transistors 67_1 to 67_4 are transistors that form an inverter loop. When the word line WL is set to a high level, the potential of a selected local bit line LBL changes, and current flowing through the transistor 22_1 changes in accordance with the change. The global bit line GBL_A and the global bit line GBL_B each have the high power supply potential VDD or the low power supply potential VSS in accordance with the current flowing through the transistor 22_1. The potentials of the global bit line GBL_A and the global bit line GBL_B can be output to the outside through the switching circuit 62_D, the switching circuit 62_E, and the write/read circuit 69. Data signal writing of the write/read circuit 69 is controlled in accordance with a signal EN_data.

The switching circuit 62_D is a circuit for controlling electrical continuity between the sense amplifier 62_C and each of the global bit line GBL_A and the global bit line GBL_B. The on and off of the switching circuit 62_D are switched by controlling a switching signal CSEL1 In the case where switches 66_A and 66_B are n-channel transistors, the switches are turned on when the switching signal CSEL1 is at a high level and the switches are turned off when the switching signal CSEL1 is at a low level. The switching circuit 62_E is a circuit for controlling electrical continuity between the write/read circuit 69 and the bit line pair connected to the sense amplifier 62_C. The on and off of the switching circuit 62_E are switched by controlling a switching signal CSEL2. The structures of switches 68_C and 68_D are similar to those of the switches 66_A and 66_B.

Figure 12:
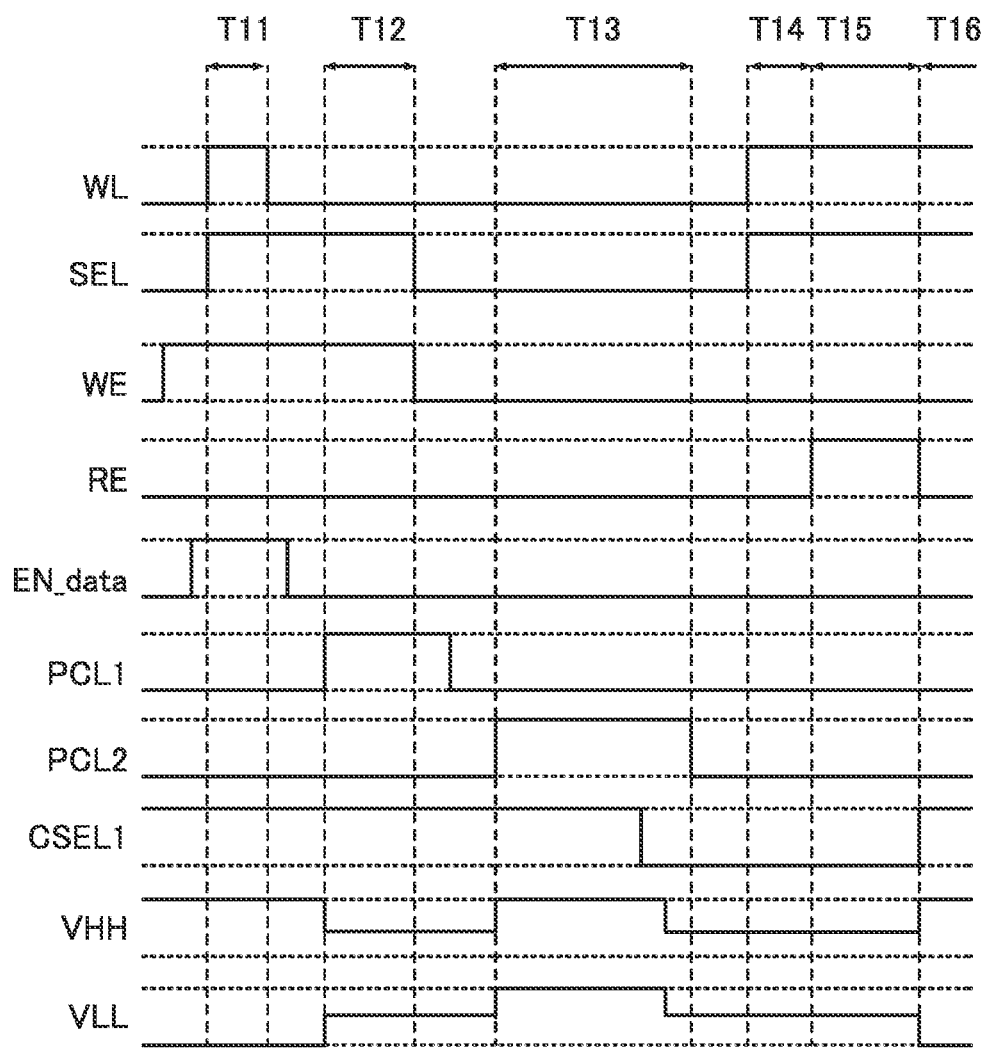
FIG. 12 is a timing chart showing a structure example of a semiconductor device.

FIG. 12 shows a timing chart for describing the operation of the circuit diagram shown in FIG. 11. In the timing chart shown in FIG. 12, Period T11 corresponds to a writing operation, Period T12 corresponds to an operation for precharging a bit line BL, Period T13 corresponds to an operation for precharging the global bit line GBL, Period T14 corresponds to a charge sharing operation, Period T15 corresponds to a reading standby operation, and Period T16 corresponds to a reading operation. Note that in the description of the operation, a local bit line connected to a memory cell to which a data signal is desired to be written is referred to as the local bit line LBL, and a signal supplied to a gate of a transistor connected to the local bit line LBL is referred to as a signal SEL. The signal SEL corresponds to any one of signals SEL_1 to SEL_4 for establishing electrical continuity between a local bit line to which a selected memory cell is connected and the gate of the transistor 22_1.

In Period T11, the word line WL connected to a gate of a transistor included in a memory cell to which a data signal is desired to be written is set to a high level. In Period T11, the signal SEL, the signal WE, and the signal EN_data are set to a high level, and the data signal is written to the memory cell through the global bit line GBL and the bit line BL.

In Period T12, in order to precharge the local bit line LBL, the precharge line PCL1 is set to a high level while the signal SEL and the signal WE are at a high level. The local bit line LBL is precharged to a precharge potential. In Period T12, both the wiring VHH and the wiring VLL, which supply power supply voltages to the sense amplifier 62_C, are preferably set to VDD/2 so that power consumption due to shoot-through current is reduced.

In Period T13, the precharge line PCL2 is set to a high level in order to precharge the global bit line GBL. The global bit line GBL is precharged to a precharge potential. In Period T13, both the wiring VHH and the wiring VLL are set to VDD, whereby the global bit line GBL with a large load can be precharged in a short time.

In Period T14, the word line WL and the signal SEL are set to a high level in order to perform charge sharing for equilibrating the charge retained in the memory cell 33 and the charge precharged to the local bit line LBL. The local bit line LBL and the gate of the transistor 22_1 have the same potential. In Period T14, both the wiring VHH and the wiring VLL, which supply power supply voltages to the sense amplifier 62_C, are preferably set to VDD/2 so that power consumption due to shoot-through current is reduced.

In Period T15, the word line WL and the signal RE are set to a high level. In this period, current flows through the transistor 22_1 in accordance with the potential of the gate of the transistor 22_1 and the potential of the global bit line GBL changes in accordance with the amount of current. The switching signal CSEL1 is set to a low level so that the change in the potential of the global bit line GBL is not affected by the sense amplifier 62_C. The wiring VHH or the wiring VLL is similar to that in Period T14.

In Period T16, the switching signal CSEL1 is set to a high level to amplify the change in the potential of the global bit line GBL with the bit line pair connected to the sense amplifier 62_C, whereby the data signal written to the memory cell is read.

One embodiment of the present invention uses an OS transistor with an extremely low off-state current as a transistor provided in each element layer. Accordingly, the refresh rate of data retained in the memory cell can be reduced, so that a semiconductor device with reduced power consumption can be obtained. Note that OS transistors can be stacked, and can be fabricated in the perpendicular direction by employing the same manufacturing process repeatedly, which can reduce the manufacturing cost. Moreover, in one embodiment of the present invention, the memory density can be increased by arranging the transistors included in the memory cell in not the plane direction but the perpendicular direction, so that the device can be downsized. Furthermore, since an OS transistor has a smaller variation in electrical characteristics than a Si transistor even at a high-temperature environment, the semiconductor device can function as a highly reliable memory apparatus in which stacked and integrated transistors have a small variation in electrical characteristics.

The element layer of one embodiment of the present invention includes, over and under the transistor layer including the switching circuit and the amplifier circuit in the z-axis direction, the transistor layers including the memory cells. With such a structure, the distance between the memory cell and each of the switching circuit and the amplifier circuit can be made small. The local bit line is shortened and thus parasitic capacitance can be reduced. The transistor layers 30 and 40 are fabricated in the perpendicular direction by employing the same manufacturing process repeatedly, which can reduce the manufacturing cost.

Embodiment 2

An example of a semiconductor device functioning as the memory apparatus of one embodiment of the present invention is described below.

Figure 13:
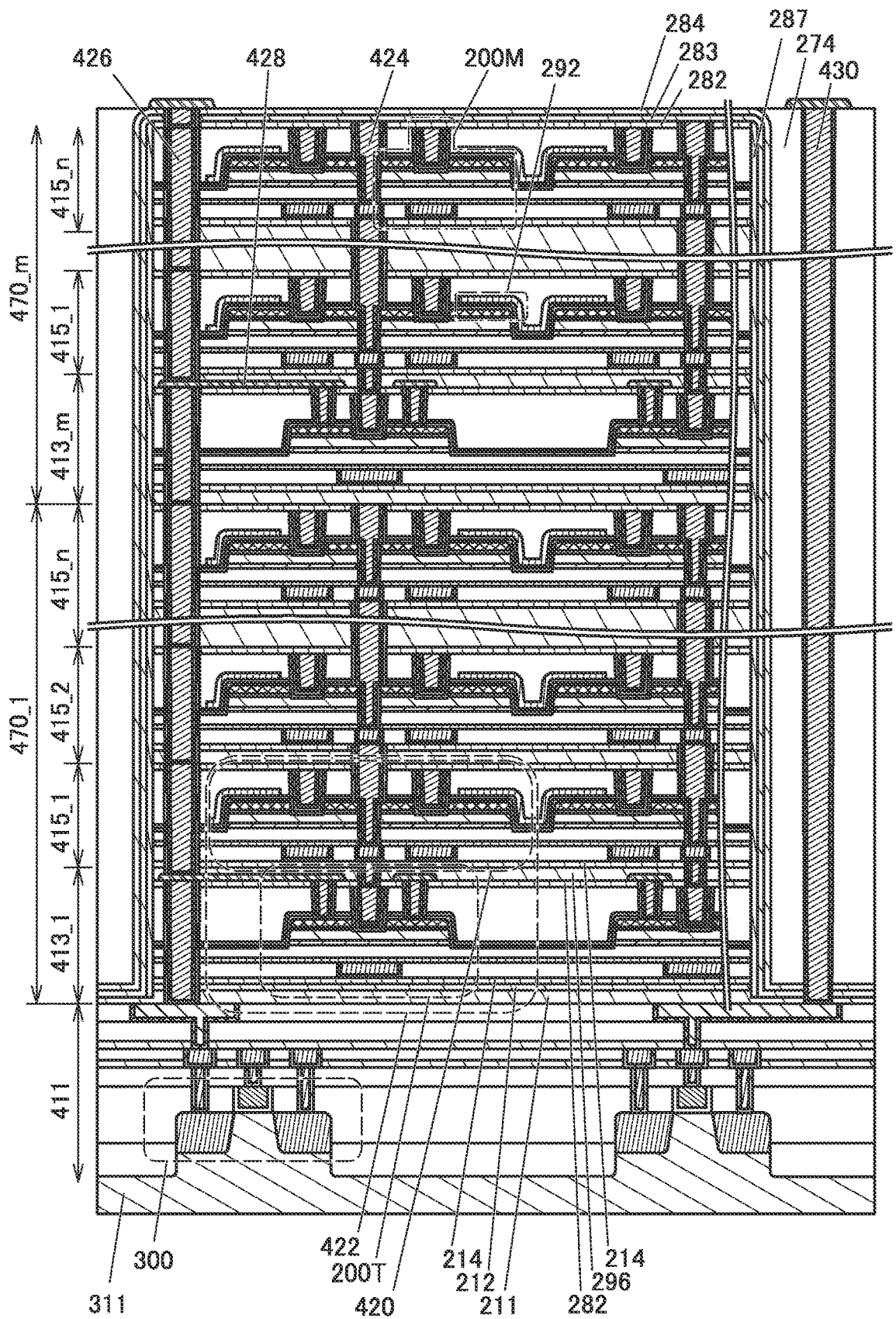
FIG. 13 is a schematic cross-sectional view showing a structure example of a semiconductor device.

FIG. 13 is a drawing showing an example of a semiconductor device in which memory units 470 (a memory unit 470_1 to a memory unit 470_m: m is a natural number greater than or equal to 2) are stacked over an element layer 411 including a circuit provided on a semiconductor substrate 311. FIG. 13 shows an example in which the element layer 411 and a plurality of memory units 470 over the element layer 411 are stacked; the plurality of memory units 470 are each provided with a corresponding transistor layer 413 (a transistor layer 413_1 to a transistor layer 413_m) and a plurality of memory device layers 415 (a memory device layer 415_1 to a memory device layer 415_n: n is a natural number greater than or equal to 2) over each transistor layer 413. Note that although the memory device layers 415 are provided over the transistor layer 413 in each memory unit 470 in the shown example, this embodiment is not limited thereto. The transistor layer 413 may be provided over the plurality of memory device layers 415, or the memory device layers 415 may be provided over and under the transistor layer 413.

The element layer 411 includes a transistor 300 provided on the semiconductor substrate 311 and can function as a circuit (referred to as a peripheral circuit in some cases) of the semiconductor device. Examples of the circuit are a column driver, a row driver, a column decoder, a row decoder, a sense amplifier, a precharge circuit, an amplifier circuit, a word line driver circuit, an output circuit, and a control logic circuit.

The transistor layer 413 includes a transistor 200T and can function as a circuit which controls each memory unit 470. The memory device layer 415 includes a memory device 420. The memory device 420 described in this embodiment includes a transistor 200M and a capacitive element 292.

Although not particularly limited, m described above is greater than or equal to 2 and less than or equal to 100, preferably greater than or equal to 2 and less than or equal to 50, further preferably greater than or equal to 2 and less than or equal to 10. Although not particularly limited, n described above is greater than or equal to 2 and less than or equal to 100, preferably greater than or equal to 2 and less than or equal to 50, further preferably greater than or equal to 2 and less than or equal to 10. The product of m and n described above is greater than or equal to 4 and less than or equal to 256, preferably greater than or equal to 4 and less than or equal to 128, further preferably greater than or equal to 4 and less than or equal to 64.

FIG. 13 shows a cross-sectional view in the channel length direction of the transistor 200T and the transistor 200M included in the memory unit.

As illustrated in FIG. 13, the transistor 300 is provided on the semiconductor substrate 311, and the transistor layers 413 and the memory device layers 415 included in the memory units 470 are provided over the transistor 300. In one memory unit 470, the transistor 200T included in the transistor layer 413 and the memory devices 420 included in the memory device layers 415 are electrically connected to each other by a plurality of conductors 424, and the transistor 300 and the transistor 200T included in the transistor layer 413 in each memory unit 470 are electrically connected to each other by a conductor 426. In addition, the conductor 426 is preferably electrically connected to the transistor 200T through a conductor 428 which is electrically connected to any one of a source, a drain, and a gate of the transistor 200T. The conductor 424 is preferably provided in each layer in the memory device layer 415. Furthermore, the conductor 426 is preferably provided in each layer in the transistor layer 413 and in each layer in the memory device layer 415.

Although the details are described later, an insulator that inhibits passage of impurities such as water or hydrogen or oxygen is preferably provided on a side surface of the conductor 424 and a side surface of the conductor 426. For the insulators, for example, silicon nitride, aluminum oxide, or silicon nitride oxide may be used.

The memory device 420 includes the transistor 200M and the capacitive element 292, and the transistor 200M can have a structure similar to that of the transistor 200T included in the transistor layer 413. The transistor 200T and the transistor 200M are collectively referred to as transistors 200 in some cases.

Here, in the transistor 200, a metal oxide functioning as an oxide semiconductor (hereinafter also referred to as an oxide semiconductor) is preferably used for a semiconductor which includes a region where a channel is formed (hereinafter also referred to as a channel formation region).

As the oxide semiconductor, for example, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, an indium oxide, an In—Ga oxide, or an In—Zn oxide may be used. Note that when an oxide semiconductor having a high proportion of indium is used, the on-state current, the field-effect mobility, or the like of the transistor can be increased.

The transistor 200 including an oxide semiconductor in its channel formation region has an extremely low leakage current in an off state; thus, a semiconductor device with low power consumption can be provided. An oxide semiconductor can be deposited by a sputtering method or the like and thus can be used in the transistor 200 included in a highly integrated semiconductor device.

In contrast, a transistor including an oxide semiconductor easily has normally-on characteristics (characteristics such that a channel exists without voltage application to a gate electrode and current flows in a transistor) owing to an impurity and an oxygen vacancy (Vo) in the oxide semiconductor that change the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Accordingly, the impurity concentration in the oxide semiconductor is preferably reduced as much as possible. Examples of impurities contained in the oxide semiconductor include hydrogen, nitrogen, alkali metal, alkaline earth metal, iron, nickel, and silicon.

Specifically, hydrogen as an impurity which is contained in the oxide semiconductor might form an oxygen vacancy in the oxide semiconductor. In some cases, a defect that is an oxygen vacancy into which hydrogen enters (hereinafter sometimes referred to as VoH) generates an electron serving as a carrier. In other cases, reaction between part of hydrogen and oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Therefore, it is preferable that the transistor 200 use a highly purified intrinsic oxide semiconductor in which oxygen vacancies and impurities such as hydrogen are reduced.

<Sealing Structure>

In view of the above, the transistor 200 is preferably sealed using a material that inhibits diffusion of impurities (hereinafter also referred to as an impurity barrier material) in order to inhibit entry of impurities from the outside.

Note that in this specification, a barrier property means a function of inhibiting diffusion of a targeted substance (or low permeability). Alternatively, a barrier property means a function of trapping and fixing (or gettering) a targeted substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

As barrier layers between the transistor 300 and the transistor 200, an insulator 211, an insulator 212, and an insulator 214 are preferably provided. When a material that inhibits diffusion or passage of impurities such as hydrogen is used for at least one of the insulator 211, the insulator 212, and the insulator 214, diffusion of impurities such as hydrogen or water contained in the semiconductor substrate 311, the transistor 300, or the like into the transistor 200 can be inhibited. When a material that inhibits passage of oxygen is used for at least one of the insulator 211, the insulator 212, and the insulator 214, diffusion of oxygen contained in the channel of the transistor 200 or the transistor layer 413 into the element layer 411 can be inhibited. For example, it is preferable to use a material that inhibits passage of impurities such as hydrogen or water as the insulator 211 and the insulator 212 and use a material that inhibits passage of oxygen as the insulator 214. Furthermore, a material having a property of absorbing or occluding hydrogen is further preferably used as the insulator 214. As the insulator 211 and the insulator 212, a nitride such as silicon nitride or silicon nitride oxide can be used, for example. For example, as the insulator 214, a metal oxide such as aluminum oxide, hafnium oxide, gallium oxide, or indium gallium zinc oxide can be used. In particular, aluminum oxide is preferably used as the insulator 214.

Furthermore, an insulator 287 is preferably provided on side surfaces of the transistor layers 413 and side surfaces of the memory device layers 415, that is, side surfaces of the memory units 470, and an insulator 282 is preferably provided on a top surface of the memory unit 470. In this case, the insulator 282 is preferably in contact with the insulator 287, and the insulator 287 is preferably in contact with at least one of the insulator 211, the insulator 212, and the insulator 214. As the insulator 287 and the insulator 282, a material that can be used as the insulator 214 is preferably used.

An insulator 283 and an insulator 284 are preferably provided to cover the insulator 282 and the insulator 287, and the insulator 283 is preferably in contact with at least one of the insulator 211, the insulator 212, and the insulator 214. Although an example in which the insulator 287 is in contact with a side surface of the insulator 214, a side surface of the insulator 212, and a top surface and a side surface of the insulator 211 and the insulator 283 is in contact with a top surface and a side surface of the insulator 287 and the top surface of the insulator 211 is shown in FIG.

13, this embodiment is not limited thereto. The insulator 287 may be in contact with the side surface of the insulator 214 and a top surface and the side surface of the insulator 212, and the insulator 283 may be in contact with a top surface and the side surface of the insulator 287 and the top surface of the insulator 212. As the insulator 282 and the insulator 287, a material that can be used as the insulator 211 and the insulator 212 is preferably used.

In the above-described structure, a material that inhibits passage of oxygen is preferably used as the insulator 287 and the insulator 282. A material having a property of capturing and fixing hydrogen is further preferably used as the insulator 287 and the insulator 282. When the material having a property of capturing and fixing hydrogen is used on the side close to the transistor 200, hydrogen in the transistor 200 or the memory units 470 is captured and fixed by the insulator 214, the insulator 287, and the insulator 282, so that the hydrogen concentration in the transistor 200 can be reduced. Furthermore, a material that inhibits passage of impurities such as hydrogen or water is preferably used as the insulator 283 and the insulator 284.

With the above-described structure, the memory units 470 are surrounded by the insulator 211, the insulator 212, the insulator 214, the insulator 287, the insulator 282, the insulator 283, and the insulator 284. Specifically, the memory units 470 are surrounded by the insulator 214, the insulator 287, and the insulator 282 (referred to as a first structure body in some cases); and the memory units 470 and the first structure body are surrounded by the insulator 211, the insulator 212, the insulator 283, and the insulator 284 (referred to as a second structure body in some cases). The structure such that the memory units 470 are surrounded by two or more layers of structure bodies in that manner is referred to as a nesting structure in some cases. Here, the memory units 470 being surrounded by the plurality of structure bodies is also described as the memory units 470 being sealed by the plurality of insulators.

The second structure body seals the transistor 200 with the first structure body therebetween. Thus, the second structure body inhibits hydrogen that exists outside the second structure body from being diffused into a portion located inward from the second structure body (to the transistor 200 side). That is, the first structure body can efficiently trap and fix hydrogen present in an internal structure of the second structure body.

In the above structure, specifically, a metal oxide such as aluminum oxide can be used for the first structure body and a nitride such as silicon nitride can be used for the second structure body. More specifically, an aluminum oxide film is preferably placed between the transistor 200 and a silicon nitride film.

Furthermore, by appropriately setting deposition conditions for the material used for the structure bodies, their hydrogen concentrations can be reduced.

In general, a film deposited by a CVD method has more favorable coverage than a film deposited by a sputtering method. On the other hand, many compound gases used for a CVD method contain hydrogen and a film deposited by a CVD method has higher hydrogen content than a film deposited by a sputtering method.

Accordingly, it is preferable to use a film with a reduced hydrogen concentration (specifically, a film deposited by a sputtering method) as a film which is close to the transistor 200, for example. Meanwhile, in the case where a film that has favorable coverage as well as a relatively high hydrogen concentration (specifically, a film deposited by a CVD method) is used as a film for inhibiting impurity diffusion, it is preferable that a film having a function of trapping and fixing hydrogen and a reduced hydrogen concentration be placed between the transistor 200 and the film that has favorable coverage as well as a relatively high hydrogen concentration.

In other words, a film with a relatively low hydrogen concentration is preferably used as the film which is close to the transistor 200. In contrast, a film with a relatively high hydrogen concentration is preferably placed apart from the transistor 200.

When the above structure is employed and specifically, the transistor 200 is sealed with silicon nitride deposited by a CVD method, an aluminum oxide film deposited by a sputtering method is preferably placed between the transistor 200 and the silicon nitride film deposited by a CVD method. It is further preferable that a silicon nitride film deposited by a sputtering method be placed between the silicon nitride film deposited by a CVD method and the aluminum oxide film deposited by a sputtering method.

Note that in the case where a CVD method is employed for deposition, a compound gas containing no hydrogen atom or having a low hydrogen atom content may be used for the deposition to reduce the hydrogen concentration of the deposited film.

It is also preferable to provide the insulator 282 and the insulator 214 between the transistor layer 413 and the memory device layers 415 or between the memory device layers 415. Furthermore, it is preferable to provide an insulator 296 between the insulator 282 and the insulator 214. For the insulator 296, a material similar to those of the insulator 283 and the insulator 284 can be used. Alternatively, silicon oxide or silicon oxynitride can be used. Alternatively, a known insulating material may be used. Here, the insulator 282, the insulator 296, and the insulator 214 may be elements that form the transistor 200. It is preferable that the insulator 282, the insulator 296, and the insulator 214 also serve as components of the transistor 200 in order to reduce the number of steps for manufacturing the semiconductor device.

Each side surface of the insulator 282, the insulator 296, and the insulator 214 provided between the transistor layer 413 and the memory device layers 415 or between the memory device layers 415 is preferably in contact with the insulator 287. With this structure, the transistor layer 413 and the memory device layers 415 are each surrounded by and sealed with the insulator 282, the insulator 296, the insulator 214, the insulator 287, the insulator 283, and the insulator 284.

An insulator 274 may be provided around the insulator 284. A conductor 430 may be provided so as to be embedded in the insulator 274, the insulator 284, the insulator 283, and the insulator 211. The conductor 430 is electrically connected to the transistor 300, that is, the circuit included in the element layer 411.

Furthermore, since the capacitive element 292 is formed in the same layer as the transistor 200M in the memory device layers 415, the height of the memory device 420 can be approximately equal to that of the transistor 200M; thus, the height of each memory device layer 415 can be prevented from being excessively increased. Accordingly, the number of memory device layers 415 can be increased relatively easily. For example, approximately 100 units each including the transistor layer 413 and the memory device layers 415 may be stacked.

<Transistor 200>

The transistor 200 that can be used as the transistor 200T included in the transistor layer 413 and the transistor 200M included in the memory device 420 will be described with reference to FIG. 14A.

Figure 14A:
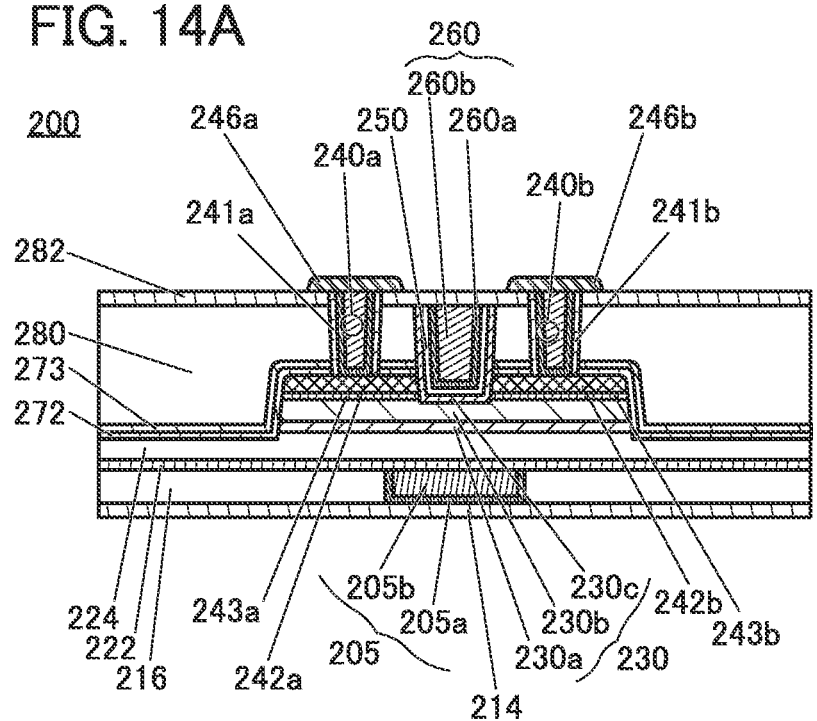
FIG. 14A and FIG. 14B are schematic cross-sectional views showing structure examples of semiconductor devices.

As illustrated in FIG. 14A, the transistor 200 includes an insulator 216, a conductor 205 (a conductor 205a and a conductor 205b), an insulator 222, an insulator 224, an oxide 230 (an oxide 230a, an oxide 230b, and an oxide 230c), a conductor 242 (a conductor 242a and a conductor 242b), an oxide 243 (an oxide 243a and an oxide 243b), an insulator 272, an insulator 273, an insulator 250, and a conductor 260 (a conductor 260a and a conductor 260b).

The insulator 216 and the conductor 205 are provided over the insulator 214, and an insulator 280 and an insulator 282 are provided over the insulator 273. The insulator 214, the insulator 280, and the insulator 282 can be regarded to constitute part of the transistor 200.

The semiconductor device of one embodiment of the present invention also includes a conductor 240 (a conductor 240a and a conductor 240b) electrically connected to the transistor 200 and functioning as a plug. Note that an insulator 241 (an insulator 241a and an insulator 241b) may be provided in contact with a side surface of the conductor 240 functioning as a plug. A conductor 246 (a conductor 246a and a conductor 246b) electrically connected to the conductor 240 and functioning as a wiring is provided over the insulator 282 and over the conductor 240.

For the conductor 240a and the conductor 240b, it is preferable to use a conductive material containing tungsten, copper, or aluminum as its main component. The conductor 240a and the conductor 240b may have a stacked-layer structure.

In the case where the conductor 240 has a stacked-layer structure, a conductive material having a function of inhibiting passage of oxygen and impurities such as water or hydrogen is preferably used. For example, tantalum, tantalum nitride, titanium, titanium nitride, ruthenium, or ruthenium oxide is preferably used. The conductive material having a function of inhibiting passage of oxygen and impurities such as water or hydrogen may have a single-layer structure or a stacked-layer structure. With the use of the conductive material, entry of impurities such as water or hydrogen diffused from the insulator 280 or the like into the oxide 230 through the conductor 240a and the conductor 240b can be further reduced. Furthermore, oxygen added to the insulator 280 can be prevented from being absorbed by the conductor 240a and the conductor 240b.

For the insulator 241 provided in contact with the side surface of the conductor 240, for example, silicon nitride, aluminum oxide, or silicon nitride oxide is used. The insulator 241 is provided in contact with the insulator 272, the insulator 273, the insulator 280, and the insulator 282 and thus can inhibit entry of impurities such as water or hydrogen from the insulator 280 or the like into the oxide 230 through the conductor 240a and the conductor 240b. In particular, silicon nitride is suitable because of its high hydrogen blocking property. Furthermore, oxygen contained in the insulator 280 can be prevented from being absorbed by the conductor 240a and the conductor 240b.

For the conductor 246, a conductive material containing tungsten, copper, or aluminum as its main component is preferably used. The conductor may have a stacked-layer structure, such as a stacked layer of any of the above conductive materials and titanium or titanium nitride. Note that the conductor may be formed to be embedded in an opening provided in an insulator.

In the transistor 200, the conductor 260 functions as a first gate of the transistor and the conductor 205 functions as a second gate of the transistor. The conductor 242a and the conductor 242b serve as a source electrode and a drain electrode.

The oxide 230 functions as a semiconductor including a channel formation region.

The insulator 250 functions as a first gate insulator, and the insulator 222 and the insulator 224 function as a second gate insulator.

In the transistor 200 illustrated in FIG. 14A, the conductor 260 is formed in a self-aligned manner in an opening portion provided in the insulator 280, the insulator 273, the insulator 272, the conductor 242, and the like, with the oxide 230c and the insulator 250 therebetween.

That is, since the conductor 260 is formed to fill the opening provided in the insulator 280 and the like with the oxide 230c and the insulator 250 therebetween, the position alignment of the conductor 260 in a region between the conductor 242a and the conductor 242b is not needed.

Here, the oxide 230c is preferably provided in the opening that is provided in the insulator 280 and the like. Thus, the insulator 250 and the conductor 260 include a region that overlaps with a stacked-layer structure of the oxide 230b and the oxide 230a with the oxide 230c therebetween. When this structure is employed, the oxide 230c and the insulator 250 can be sequentially formed and thus, the interface between the oxide 230 and the insulator 250 can be kept clean. Accordingly, the influence of interface scattering on carrier conduction is small, and the transistor 200 can have a high on-state current and high frequency characteristics.

In the transistor 200 illustrated in FIG. 14A, a bottom surface and a side surface of the conductor 260 are in contact with the insulator 250. Furthermore, a bottom surface and a side surface of the insulator 250 are in contact with the oxide 230c.

In addition, the insulator 282 and the oxide 230c are in direct contact with each other in the transistor 200 as illustrated in FIG. 14A. Owing to this structure, diffusion of oxygen contained in the insulator 280 into the conductor 260 can be inhibited.

Therefore, oxygen contained in the insulator 280 can be efficiently supplied to the oxide 230a and the oxide 230b through the oxide 230c, which can reduce oxygen vacancies in the oxide 230a and the oxide 230b and improve the electrical characteristics and reliability of the transistor 200.

The structure of the semiconductor device including the transistor 200 of one embodiment of the present invention is described in detail below.

In the transistor 200, a metal oxide functioning as an oxide semiconductor (hereinafter also referred to as an oxide semiconductor) is preferably used for the oxide 230 (the oxide 230a, the oxide 230b, and the oxide 230c), which includes a channel formation region.

For example, the metal oxide functioning as an oxide semiconductor preferably has an energy gap of 2 eV or more, further preferably 2.5 eV or more. With the use of a metal oxide having a wide energy gap, leakage current in a non-conduction state (off-state current) of the transistor 200 can be extremely small. With the use of such a transistor, a semiconductor device with low power consumption can be provided.

Specifically, as the oxide 230, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In-M oxide, an In—Zn oxide, or an M-Zn oxide may be used as the oxide 230.

As illustrated in FIG. 14A, the oxide 230 preferably includes the oxide 230a over the insulator 224, the oxide 230b over the oxide 230a, and the oxide 230c that is placed over the oxide 230b and at least part of which is in contact with a top surface of the oxide 230b. Note that the side surface of the oxide 230c is preferably in contact with the oxide 243a, the oxide 243b, the conductor 242a, the conductor 242b, the insulator 272, the insulator 273, and the insulator 280.

That is, the oxide 230 includes the oxide 230a, the oxide 230b over the oxide 230a, and the oxide 230c over the oxide 230b. When the oxide 230a is provided below the oxide 230b, impurities can be inhibited from being diffused into the oxide 230b from the components formed below the oxide 230a. When the oxide 230c is provided over the oxide 230b, impurities can be inhibited from being diffused into the oxide 230b from the components formed above the oxide 230c.

The transistor 200 has a structure in which the three layers of the oxide 230a, the oxide 230b, and the oxide 230c are stacked in a channel formation region and its vicinity; however, the present invention is not limited to this structure. For example, the transistor 200 may include a single layer of the oxide 230b, a two-layer structure of the oxide 230b and the oxide 230a, a two-layer structure of the oxide 230b and the oxide 230c, or a four or more-layer structure. For example, the transistor 200 may include a four-layer structure including the oxide 230c with a two-layer structure.

The oxide 230 preferably has a stacked-layer structure of oxide layers which differ in the atomic ratio of metal atoms. Specifically, the atomic ratio of the element M to constituent elements in the metal oxide used as the oxide 230a is preferably greater than the atomic ratio of the element M to constituent elements in the metal oxide used as the oxide 230b. Moreover, the atomic ratio of the element M to In in the metal oxide used as the oxide 230a is preferably greater than the atomic ratio of the element M to In in the metal oxide used as the oxide 230b. Moreover, the atomic ratio of In to the element M in the metal oxide used as the oxide 230b is preferably greater than the atomic ratio of In to the element M in the metal oxide used as the oxide 230a. As the oxide 230c, a metal oxide which can be used as the oxide 230a or the oxide 230b can be used.

Specifically, as the oxide 230a, a metal oxide having In:Ga:Zn=1:3:4 [atomic ratio] or a composition in the vicinity thereof, or 1:1:0.5 [atomic ratio] or a composition in the vicinity thereof is used.

As the oxide 230b, a metal oxide having In:Ga:Zn=4:2:3 [atomic ratio] or a composition in the vicinity thereof, or 1:1:1 [atomic ratio] or a composition in the vicinity thereof is used. As the oxide 230b, a metal oxide having In:Ga:Zn=5:1:3 [atomic ratio] or a composition in the vicinity thereof, or In:Ga:Zn=10:1:3 or a composition in the vicinity thereof may be used. As the oxide 230b, an In—Zn oxide (having In:Zn=2:1 [atomic ratio] or a composition in the vicinity thereof, In:Zn=5:1 [atomic ratio] or a composition in the vicinity thereof, or In:Zn=10:1 [atomic ratio] or a composition in the vicinity thereof, for example) may be used. As the oxide 230b, an In oxide may be used.

As the oxide 230c, a metal oxide having In:Ga:Zn=1:3:4 [atomic ratio or a composition in the vicinity thereof], Ga:Zn=2:1 [atomic ratio] or a composition in the vicinity thereof, or Ga:Zn=2:5 [atomic ratio] or a composition in the vicinity thereof is used. A single layer or stacked layers of the material that can be used for the oxide 230b may be used for the oxide 230c. Specific examples of the oxide 230c having a stacked-layer structure include a stacked-layer structure of In:Ga:Zn=4:2:3 [atomic ratio] or a composition in the vicinity thereof and In:Ga:Zn=1:3:4 [atomic ratio] or a composition in the vicinity thereof, a stacked-layer structure of Ga:Zn=2:1 [atomic ratio] or a composition in the vicinity thereof and In:Ga:Zn=4:2:3 [atomic ratio] or a composition in the vicinity thereof, a stacked-layer structure of Ga:Zn=2:5 [atomic ratio] or a composition in the vicinity thereof and In:Ga:Zn=4:2:3 [atomic ratio] or a composition in the vicinity thereof, and a stacked-layer structure of gallium oxide and In:Ga:Zn=4:2:3 [atomic ratio] or a composition in the vicinity thereof.

Note that an OS transistor included in the memory cell 33 and an OS transistor included in the element layer 50 which are described in Embodiment 1 may be different in structure from each other. For example, as the oxide 230c included in the OS transistor provided in the memory cell 33, a metal oxide having In:Ga:Zn=4:2:3 [atomic ratio] or a composition in the vicinity thereof may be used, and as the oxide 230c included in the OS transistor provided in the element layer 50, a metal oxide having In:Ga:Zn=5:1:3 [atomic ratio] or a composition in vicinity thereof, In:Ga:Zn=10:1:3 [atomic ratio] or a composition in the vicinity thereof, In:Zn=10:1 [atomic ratio] or a composition in the vicinity thereof, In:Zn=5:1 [atomic ratio] or a composition in the vicinity thereof, or In:Zn=2:1 [atomic ratio] or a composition in the vicinity thereof may be used.

In the oxide 230b and the oxide 230c, increasing the ratio of indium in the films is favorable to increase the on-state current, the field-effect mobility, or the like of the transistor. Moreover, the above-described composition in the vicinity includes ±30% of the intended atomic ratio.

The oxide 230b may have crystallinity. For example, it is preferable to use a CAAC-OS (c-axis aligned crystalline oxide semiconductor) described later. An oxide having crystallinity, such as a CAAC-OS, has a dense structure with small amounts of impurities and defects (e.g., oxygen vacancies) and high crystallinity. Accordingly, extraction of oxygen from the oxide 230b by the source electrode or the drain electrode can be suppressed. This inhibits extraction of oxygen from the oxide 230b even when heat treatment is performed; hence, the transistor 200 is stable with respect to high temperatures in the manufacturing process (i.e., thermal budget).

The conductor 205 is placed to overlap with the oxide 230 and the conductor 260. The conductor 205 is preferably provided to be embedded in the insulator 216.

In the case where the conductor 205 functions as a gate electrode, by changing a potential applied to the conductor 205 independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be smaller in the case where a negative potential is applied to the conductor 205 than in the case where the negative potential is not applied to the conductor 205.

As illustrated in FIG. 14A, the conductor 205 is preferably larger than the region of the oxide 230 not overlapping with the conductor 242a or the conductor 242b. Although not illustrated, the conductor 205 preferably extends to a region outside the oxide 230a and the oxide 230b in the channel width direction of the oxide 230. That is, the conductor 205 and the conductor 260 preferably overlap with each other with the insulator therebetween, in a region beyond the side surface of the oxide 230 in the channel width direction. The large-sized conductor 205 can sometimes relieve local charging (also referred to as charge up) in treatment using plasma after the formation of the conductor 205 in the manufacturing process. However, one embodiment of the present invention is not limited thereto. The conductor 205 overlaps with at least the oxide 230 positioned between the conductor 242a and the conductor 242b.

When the bottom surface of the insulator 224 is used as a reference, the bottom surface of the conductor 260 in a region where the oxide 230a and the oxide 230b do not overlap with the conductor 260 is preferably placed below a bottom surface of the oxide 230b.

Although not illustrated, in the channel width direction, when the conductor 260 functioning as a gate covers a side surface and the top surface of the oxide 230b in the channel formation region with the oxide 230c and the insulator 250 therebetween, the electric field generated from the conductor 260 is likely to affect the entire channel formation region formed in the oxide 230b. Accordingly, the transistor 200 can have a higher on-state current and higher frequency characteristics. In this specification, such a transistor structure in which the channel formation region is electrically surrounded by the electric fields of the conductor 260 and the conductor 205 is referred to as a surrounded channel (S-channel) structure.

The conductor 205a is preferably a conductor that inhibits passage of oxygen and impurities such as water or hydrogen. For example, titanium, titanium nitride, tantalum, or tantalum nitride can be used. For the conductor 205b, a conductive material containing tungsten, copper, or aluminum as its main component is preferably used. The conductor 205 has a two-layer structure in the drawing but may have a multilayer structure of three or more layers.

Here, the oxide semiconductor, the insulator or conductor positioned below the oxide semiconductor, and the insulator or conductor positioned over the oxide semiconductor are preferably successively deposited without exposure to the air, in which case a substantially highly purified intrinsic oxide semiconductor film with a reduced concentration of impurities (in particular, hydrogen and water) can be deposited.

At least one of the insulator 222, the insulator 272, and the insulator 273 preferably functions as a barrier insulating film that inhibits entry of impurities such as water or hydrogen into the transistor 200 from the substrate side or from above the transistor 200. Therefore, for at least one of the insulator 222, the insulator 272, and the insulator 273, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, it is preferable to use an insulating material having a function of inhibiting diffusion of oxygen (e.g., at least one of oxygen atoms, oxygen molecules, and the like), that is, an insulating material through which the above oxygen is less likely to pass.

For example, it is preferable that silicon nitride, silicon nitride oxide, or the like be used for the insulator 273 and aluminum oxide, hafnium oxide, or the like be used for the insulator 222 and the insulator 272.

Accordingly, it is possible to inhibit diffusion of impurities such as water or hydrogen to the transistor 200 side through the insulator 222. It is also possible to inhibit diffusion of oxygen contained in the insulator 224 and the like to the substrate side through the insulator 222.

Impurities such as water or hydrogen can be inhibited from being diffused to the transistor 200 side from the insulator 280 and the like, which are provided with the insulator 272 and the insulator 273 therebetween. In this manner, the transistor 200 is preferably surrounded by the insulator 272 and the insulator 273 that have a function of inhibiting diffusion of oxygen and impurities such as water or hydrogen.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like may be used for the insulator 224 as appropriate. When such an insulator containing oxygen is provided in contact with the oxide 230, oxygen vacancies in the oxide 230 can be reduced, leading to an improvement in reliability of the transistor 200.

Specifically, for the insulator 224, an oxide material that releases part of oxygen by heating is preferably used. An oxide that releases oxygen by heating is an oxide film in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

The insulator 222 preferably functions as a barrier insulating film that inhibits entry of impurities such as water or hydrogen into the transistor 200 from the substrate side. For example, the insulator 222 preferably has a lower hydrogen permeability than the insulator 224. When the insulator 224, the oxide 230, and the like are surrounded by the insulator 222 and the insulator 283, entry of impurities such as water or hydrogen into the transistor 200 from the outside can be inhibited.

Furthermore, the insulator 222 preferably has a function of inhibiting diffusion of oxygen (e.g., at least one of oxygen atoms, oxygen molecules, and the like); that is, it is preferable that oxygen is less likely to pass through the insulator 222. For example, the insulator 222 preferably has a lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Furthermore, the conductor 205 can be inhibited from reacting with oxygen contained in the insulator 224 or the oxide 230.

As the insulator 222, an insulator containing an oxide of one or both of aluminum and hafnium that is an insulating material is preferably used. For the insulator containing an oxide of one or both of aluminum and hafnium, aluminum oxide, hafnium oxide, an oxide containing aluminum and hafnium (hafnium aluminate), or the like is preferably used. In the case where the insulator 222 is formed of such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

As the insulator 222, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used. In the case where the insulator 222 has a stacked-layer structure, a three-layer structure with zirconium oxide, aluminum oxide, and zirconium oxide in this order, or a four-layer structure with zirconium oxide, aluminum oxide, zirconium oxide, and aluminum oxide in this order is employed, for example. For the insulator 222, a compound containing hafnium and zirconium may be used. When the semiconductor device is miniaturized and highly integrated, a dielectric used for a gate insulator and a capacitive element becomes thin, which might cause a problem of leakage current of a transistor and a capacitive element. When a high-k material is used as an insulator functioning as the dielectric used for the gate insulator and the capacitive element, a gate potential during operation of the transistor can be lowered and the capacitance of the capacitive element can be ensured while the physical thickness is kept.

Note that the insulator 222 and the insulator 224 may each have a stacked-layer structure of two or more layers. In that case, the stacked layers are not necessarily formed of the same material and may be formed of different materials.

The oxide 243 (the oxide 243a and the oxide 243b) may be provided between the oxide 230b and the conductor 242 (the conductor 242a and the conductor 242b) functioning as the source electrode and the drain electrode. The conductor 242 and the oxide 230b are not in contact with each other, so that the conductor 242 can be inhibited from absorbing oxygen from the oxide 230b. That is, preventing the oxidation of the conductor 242 can inhibit a decrease in the conductivity of the conductor 242. Accordingly, the oxide 243 preferably has a function of inhibiting the oxidation of the conductor 242.

The oxide 243 having a function of inhibiting passage of oxygen is preferably provided between the oxide 230b and the conductor 242 functioning as the source electrode and the drain electrode, in which case the electric resistance between the conductor 242 and the oxide 230b can be reduced. Such a structure improves the electrical characteristics of the transistor 200 and reliability of the transistor 200.

As the oxide 243, for example, a metal oxide containing an element M which is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like may be used. Specifically, the element M is preferably aluminum, gallium, yttrium, or tin. The concentration of the element M in the oxide 243 is preferably higher than that in the oxide 230b. Alternatively, gallium oxide may be used as the oxide 243. Further alternatively, a metal oxide such as an In-M-Zn oxide may be used as the oxide 243. Specifically, the atomic ratio of the element M to In in the metal oxide used as the oxide 243 is preferably higher than the atomic ratio of the element M to In in the metal oxide used as the oxide 230b. The thickness of the oxide 243 is preferably greater than or equal to 0.5 nm and less than or equal to 5 nm, further preferably greater than or equal to 1 nm and less than or equal to 3 nm. The oxide 243 preferably has crystallinity. With the oxide 243 having crystallinity, release of oxygen in the oxide 230 can be favorably inhibited. When the oxide 243 has a hexagonal crystal structure, for example, release of oxygen in the oxide 230 can sometimes be inhibited.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly probable that oxidation of the conductor 242 lowers the conductivity of the conductor 242. Note that the expression "oxygen in the oxide 230 is diffused into the conductor 242" can be replaced with the expression "the conductor 242 absorbs oxygen in the oxide 230".

When oxygen in the oxide 230 is diffused into the conductor 242 (the conductor 242a and the conductor 242b), another layer is sometimes formed between the conductor 242a and the oxide 230b, and between the conductor 242b and the oxide 230b. The layer contains a larger amount of oxygen than the conductor 242 and thus presumably has an insulating property. In that case, a three-layer structure of the conductor 242, the layer, and the oxide 230b can be regarded as a three-layer structure of a metal, an insulator, and a semiconductor and is sometimes referred to as an MIS (Metal-Insulator-Semiconductor) structure or a diode-connected structure mainly with an MIS structure.

The above layer is not necessarily formed between the conductor 242 and the oxide 230b; for example, the layer may be formed between the conductor 242 and the oxide 230c or formed between the conductor 242 and the oxide 230b and between the conductor 242 and the oxide 230c.

The conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that the insulator 272 be provided in contact with the top surface of the conductor 242 and function as a barrier layer. Such a structure can inhibit the conductor 242 from absorbing excess oxygen contained in the insulator 280. Furthermore, inhibiting the oxidation of the conductor 242 can suppress an increase in the contact resistance between the transistor 200 and the wiring. Accordingly, the transistor 200 can have excellent electrical characteristics and reliability.

Thus, the insulator 272 preferably has a function of inhibiting oxygen diffusion. For example, it is preferable that the insulator 272 have a function of further inhibiting diffusion of oxygen compared to the insulator 280. For example, an insulator containing an oxide of one or both of aluminum and hafnium is preferably deposited as the insulator 272. For another example, an insulator containing aluminum nitride may be used as the insulator 272.

As illustrated in FIG. 14A, the insulator 272 is in contact with part of a top surface of the conductor 242b and a side surface of the conductor 242b. In addition, although not illustrated, the insulator 272 is in contact with part of a top surface of the conductor 242a and a side surface the conductor 242a. The insulator 273 is placed over the insulator 272. Such a structure can inhibit the conductor 242 from absorbing oxygen added to the insulator 280, for example.

The insulator 250 functions as a gate insulator. The insulator 250 is preferably in contact with a top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. Silicon oxide and silicon oxynitride, which have thermal stability, are particularly preferable.

Like the insulator 224, the insulator 250 is preferably formed using an insulator from which oxygen is released by heating. When the insulator from which oxygen is released by heating is provided as the insulator 250 to be in contact with the top surface of the oxide 230c, oxygen can be effectively supplied to the channel formation region of the oxide 230b. Furthermore, as in the insulator 224, the concentration of impurities such as water or hydrogen in the insulator 250 is preferably lowered. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Providing the metal oxide that inhibits oxygen diffusion inhibits diffusion of oxygen from the insulator 250 into the conductor 260. That is, the reduction in the amount of oxygen supplied to the oxide 230 can be inhibited. Moreover, oxidation of the conductor 260 due to oxygen in the insulator 250 can be inhibited.

The metal oxide has a function of part of the gate insulator in some cases. For that reason, when silicon oxide, silicon oxynitride, or the like is used for the insulator 250, the metal oxide is preferably a high-k material with a high dielectric constant. The gate insulator having a stacked-layer structure of the insulator 250 and the metal oxide can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

The metal oxide has a function of part of the gate in some cases. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide in which a channel is formed. A conductive material containing any of the above metal elements and nitrogen may also be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide in which a channel is formed can be captured in some cases. Alternatively, hydrogen entering from an external insulator or the like can be captured in some cases.

Although FIG. 14A shows that the conductor 260 has a two-layer structure, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom is preferably used. Alternatively, a conductive material having a function of inhibiting diffusion of oxygen (e.g., at least one of oxygen atoms, oxygen molecules, and the like) is preferably used.

When the conductor 260a has a function of inhibiting diffusion of oxygen, the conductivity can be prevented from being lowered because of oxidization of the conductor 260b due to oxygen contained in the insulator 250. As a conductive material having a function of inhibiting oxygen diffusion, tantalum, tantalum nitride, ruthenium, or ruthenium oxide is preferably used, for example.

Furthermore, for the conductor 260b, a conductive material containing tungsten, copper, or aluminum as its main component is preferably used. The conductor 260 also functions as a wiring and thus a conductor having high conductivity is preferably used. For example, a conductive material containing tungsten, copper, or aluminum as its main component can be used. The conductor 260b may have a stacked-layer structure; for example, the conductor 260b may be a stack of titanium or titanium nitride and the above conductive material.

<<Metal Oxide>>

As the oxide 230, a metal oxide functioning as an oxide semiconductor is preferably used. A metal oxide that can be used as the oxide 230 according to the present invention is described below.

The metal oxide contains preferably at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case is considered where a metal oxide is an In-M-Zn oxide containing indium, an element M, and zinc (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). In particular, aluminum, gallium, yttrium, or tin is preferably used as the element M.

Note that in this specification and the like, a metal oxide containing nitrogen is also referred to as a metal oxide in some cases. Moreover, a metal oxide containing nitrogen may be referred to as a metal oxynitride.

<Transistor 300>

A transistor 300 will be described with reference to FIG. 14B. The transistor 300 is provided over the semiconductor substrate 311 and includes a conductor 316 functioning as a gate, an insulator 315 functioning as a gate insulator, a semiconductor region 313 that is a part of the semiconductor substrate 311, and a low-resistance region 314a and a low-resistance region 314b functioning as a source region and a drain region. The transistor 300 may be a p-channel transistor or an n-channel transistor.

Figure 14B:
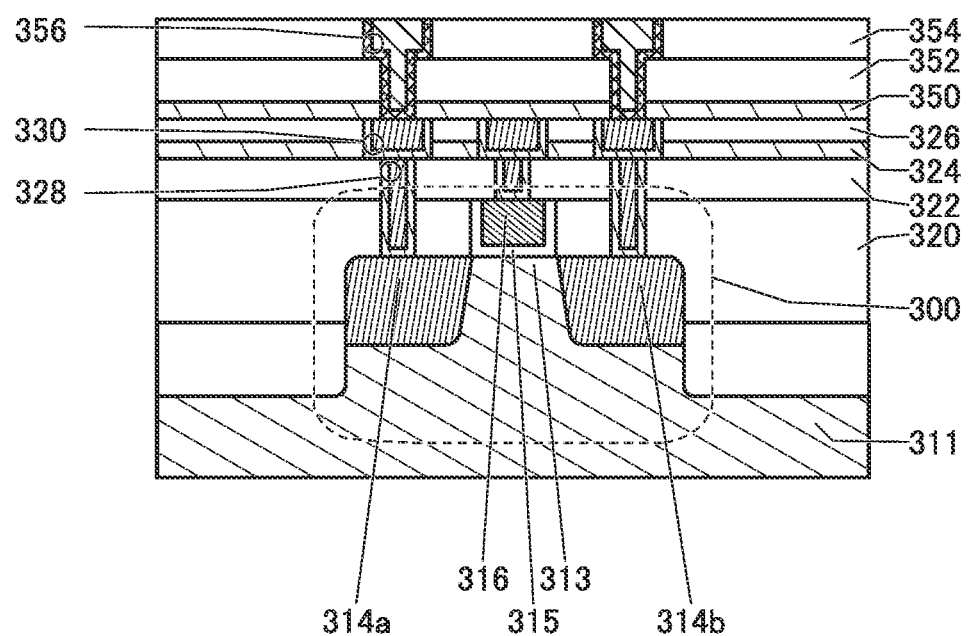

Here, in the transistor 300 illustrated in FIG. 14B, the semiconductor region 313 (part of the semiconductor substrate 311) where a channel is formed has a projecting shape. The conductor 316 can be provided to cover side and top surfaces of the semiconductor region 313 with the insulator 315 therebetween. Note that for the conductor 316, a material for adjusting the work function may be used. Such a transistor 300 is also referred to as a FIN transistor because the projecting portion of the semiconductor substrate 311 is utilized. An insulator functioning as a mask for forming the projecting portion may be provided in contact with a top surface of the projecting portion. Although the case where the projecting portion is formed by processing part of the semiconductor substrate 311 is described here, a semiconductor film having a projecting shape may be formed by processing an SOI substrate.

Note that the transistor 300 illustrated in FIG. 14B is an example and the structure is not limited thereto; an appropriate transistor may be used in accordance with a circuit structure or a driving method.

<Memory Device 420>

Next, the memory device 420 illustrated in FIG. 13 is described. As for the transistor 200M included in the memory device 420, the description overlapping with that of the transistor 200 is omitted.

In the memory device 420, the conductor 242a of the transistor 200M functions as one electrode of the capacitive element 292, and the insulator 272 and the insulator 273 function as a dielectric. A conductor 290 is provided to overlap with the conductor 242a with the insulator 272 and the insulator 273 sandwiched therebetween and functions as the other electrode of the capacitive element 292. The conductor 290 may be used as the other electrode of the capacitive element 292 included in an adjacent memory device 420. Alternatively, the conductor 290 may be electrically connected to the conductor 290 included in an adjacent memory device 420.

The conductor 290 is also provided on the top surface of the conductor 242a and the side surface of the conductor 242a with the insulator 272 and the insulator 273 sandwiched therebetween. This is preferable because the capacitive element 292 can have a larger capacitance than the capacitance obtained by the area where the conductor 242a and the conductor 290 overlap with each other.

The conductor 424 is electrically connected to the conductor 242b and is electrically connected to the conductor 424 positioned in a lower layer through the conductor 205.

As a dielectric of the capacitive element 292, silicon nitride, silicon nitride oxide, aluminum oxide, hafnium oxide, or the like can be used. Furthermore, these materials can be stacked. In the case where the dielectric of the capacitive element 292 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the dielectric of the capacitive element 292, zirconium oxide having a higher permittivity than the above-described materials may be used. As the dielectric of the capacitive element 292, a single layer of zirconium oxide may be used, or zirconium oxide may be used in part of stacked layers. For example, stacked layers of zirconium oxide and aluminum oxide can be used. Furthermore, the dielectric of the capacitive element 292 may be three stacked layers; zirconium oxide may be used as the first layer and the third layer and aluminum oxide may be used as the second layer between the first layer and the third layer.

When zirconium oxide having a high permittivity is used as the dielectric of the capacitive element 292, the area occupied by the capacitive element 292 in the memory device 420 can be reduced. Thus, the area necessary for the memory device 420 can be reduced, and the bit cost can be improved, which is preferable.

As the conductor 290, any of the materials that can be used as the conductor 205, the conductor 242, the conductor 260, the conductors 424, and the like can be used.

This embodiment shows an example in which the transistors 200M and the capacitive elements 292 are symmetrically provided with the conductors 424 sandwiched therebetween. When a pair of transistors 200M and a pair of capacitive elements 292 are provided in this manner, the number of conductors 424 electrically connected to the transistor 200M can be reduced. Thus, the area necessary for the memory device 420 can be reduced, and the bit cost can be improved, which is preferable.

In the case where the insulator 241 is provided on the side surface of the conductor 424, the conductor 424 is connected to at least part of the top surface of the conductor 242b.

Using the conductors 424 and the conductor 205, the transistor 200T and the memory device 420 in the memory unit 470 can be electrically connected to each other.

<Modification Example 1 of Memory Device 420>

Figure 15A:
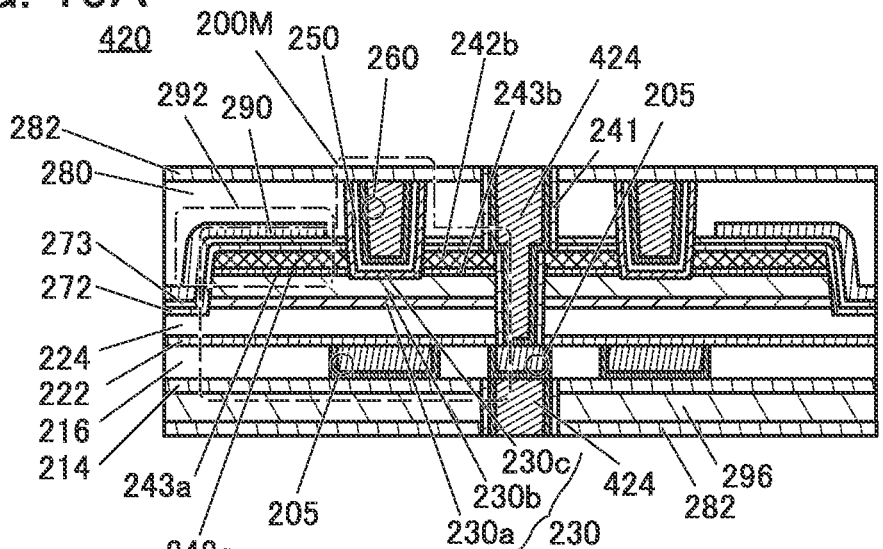
FIG. 15A, FIG. 15B, and FIG. 15C are schematic cross-sectional views showing structure examples of semiconductor devices.
Figure 15B:
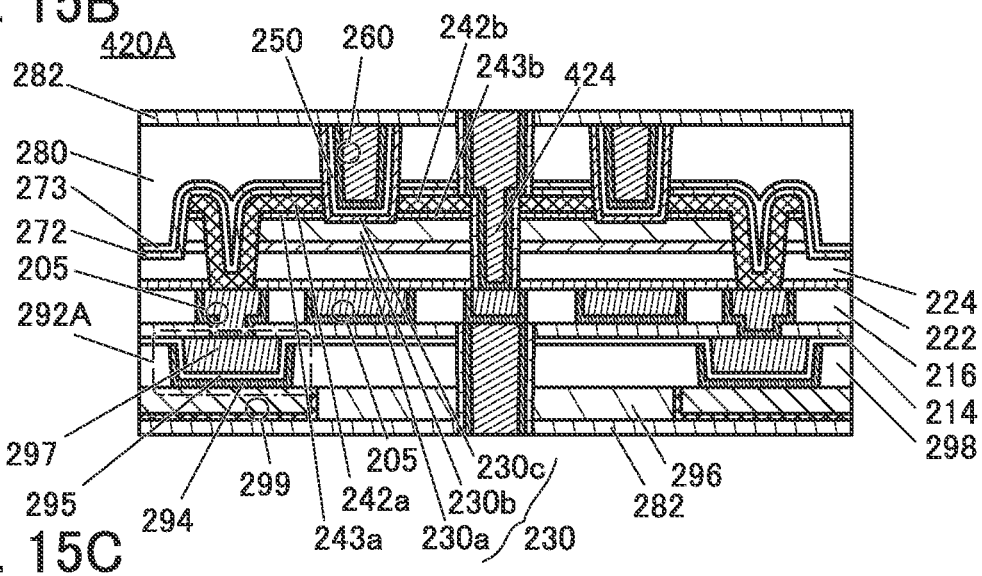

Next, with reference to FIG. 15B, a memory device 420A is described as a modification example of the memory device 420. The memory device 420A includes the transistor 200M and a capacitive element 292A electrically connected to the transistor 200M. The capacitive element 292A is provided below the transistor 200M.

In the memory device 420A, the conductor 242a is placed in an opening that is provided in the oxide 243a, the oxide 230b, the oxide 230a, the insulator 224, and the insulator 222 and is electrically connected to the conductor 205 at a bottom portion of the opening. The conductor 205 is electrically connected to the capacitive element 292A.

The capacitive element 292A includes a conductor 294 functioning as one electrode, an insulator 295 functioning as a dielectric, and a conductor 297 functioning as the other electrode. The conductor 297 overlaps with the conductor 294 with the insulator 295 sandwiched therebetween. Furthermore, the conductor 297 is electrically connected to the conductor 205.

The conductor 294 is provided in a bottom portion and on a side surface of an opening formed in an insulator 298 provided over the insulator 296, and the insulator 295 is provided so as to cover the insulator 298 and the conductor 294. Furthermore, the conductor 297 is provided so as to be embedded in a concave portion that the insulator 295 has.

Furthermore, a conductor 299 is provided so as to be embedded in the insulator 296, and the conductor 299 is electrically connected to the conductor 294. The conductor 299 may be electrically connected to the conductor 294 of an adjacent memory device 420A.

The conductor 297 is also provided on a top surface of the conductor 294 and a side surface of the conductor 294 with the insulator 295 sandwiched therebetween. This is preferable because the capacitive element 292A can have a larger capacitance than the capacitance obtained by the area where the conductor 294 and the conductor 297 overlap with each other.

As the insulator 295 functioning as a dielectric of the capacitive element 292A, silicon nitride, silicon nitride oxide, aluminum oxide, hafnium oxide, or the like can be used. Furthermore, these materials can be stacked. In the case where the insulator 295 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the insulator 295, zirconium oxide having a higher permittivity than the above-described materials may be used. As the insulator 295, a single layer of zirconium oxide may be used, or zirconium oxide may be used in part of stacked layers. For example, stacked layers of zirconium oxide and aluminum oxide can be used. Furthermore, the insulator 295 may be three stacked layers; zirconium oxide may be used as the first layer and the third layer and aluminum oxide may be used as the second layer between the first layer and the third layer.

When zirconium oxide having a high permittivity is used as the insulator 295, the area occupied by the capacitive element 292A in the memory device 420A can be reduced. Thus, the area necessary for the memory device 420A can be reduced, and the bit cost can be improved, which is preferable.

As the conductor 297, the conductor 294, and the conductor 299, any of the materials that can be used as the conductor 205, the conductor 242, the conductor 260, the conductors 424, and the like can be used.

Furthermore, for the insulator 298, any of the materials that can be used for the insulator 214, the insulator 216, the insulator 224, the insulator 280, and the like can be used.

<Modification Example 2 of Memory Device 420>

Figure 15C:
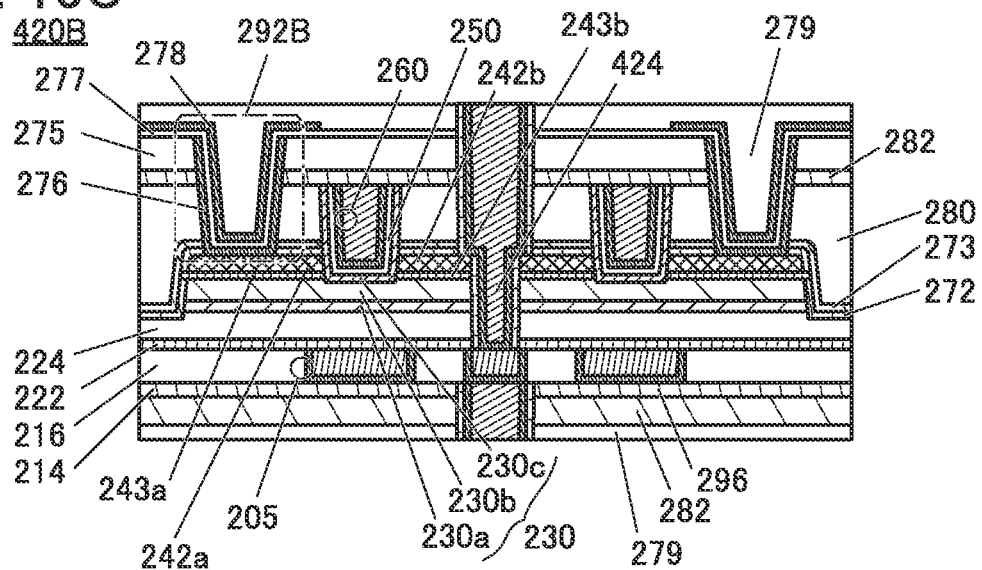

Next, with reference to FIG. 15C, a memory device 420B is described as a modification example of the memory device 420. The memory device 420B includes the transistor 200M and a capacitive element 292B electrically connected to the transistor 200M. The capacitive element 292B is provided above the transistor 200M.

The capacitive element 292B includes a conductor 276 functioning as one electrode, an insulator 277 functioning as a dielectric, and a conductor 278 functioning as the other electrode. The conductor 278 overlaps with the conductor 276 with the insulator 277 sandwiched therebetween.

An insulator 275 is provided over the insulator 282, and the conductor 276 is provided in a bottom portion and on a side surface of an opening formed in the insulator 275, the insulator 282, the insulator 280, the insulator 273, and the insulator 272. The insulator 277 is provided so as to cover the insulator 282 and the conductor 276. Furthermore, the conductor 278 is provided so as to overlap with the conductor 276 in a concave portion that the insulator 277 has, and at least part of the conductor 278 is provided over the insulator 275 with the insulator 277 therebetween. The conductor 278 may be used as the other of electrode of the capacitive element 292B included in an adjacent memory device 420B. Alternatively, the conductor 278 may be electrically connected to the conductor 278 included in an adjacent memory device 420B.

The conductor 278 is also provided on a top surface of the conductor 276 and a side surface of the conductor 276 with the insulator 277 sandwiched therebetween. This is preferable because the capacitive element 292B can have a larger capacitance than the capacitance obtained by the area where the conductor 276 and the conductor 278 overlap with each other.

An insulator 279 may be provided so as to fill the concave portion that the conductor 278 has.

As the insulator 277 functioning as a dielectric of the capacitive element 292B, silicon nitride, silicon nitride oxide, aluminum oxide, hafnium oxide, or the like can be used. Furthermore, these materials can be stacked. In the case where the insulator 277 has a stacked-layer structure, stacked layers of aluminum oxide and silicon nitride or stacked layers of hafnium oxide and silicon oxide can be used. Here, the top and bottom of the stacked layers are not limited. For example, silicon nitride may be stacked over aluminum oxide; or aluminum oxide may be stacked over silicon nitride.

As the insulator 277, zirconium oxide having a higher permittivity than the above-described materials may be used. As the insulator 277, a single layer of zirconium oxide may be used, or zirconium oxide may be used in part of stacked layers. For example, stacked layers of zirconium oxide and aluminum oxide can be used. Furthermore, the insulator 277 may be three stacked layers; zirconium oxide may be used as the first layer and the third layer and aluminum oxide may be used as the second layer between the first layer and the third layer.

When zirconium oxide having a high permittivity is used as the insulator 277, the area occupied by the capacitive element 292B in the memory device 420B can be reduced. Thus, the area necessary for the memory device 420B can be reduced, and the bit cost can be improved, which is preferable.

As the conductor 276 and the conductor 278, any of the materials that can be used as the conductor 205, the conductor 242, the conductor 260, the conductors 424, and the like can be used.

Furthermore, for the insulator 275 and the insulator 279, any of the materials that can be used for the insulator 214, the insulator 216, the insulator 224, the insulator 280, and the like can be used.

<Connection Between Memory Device 420 and Transistor 200T>

In a region 422 surrounded by a dashed-dotted line in FIG. 13, the memory device 420 is electrically connected to the gate of the transistor 200T through the conductor 424 and the like; however, this embodiment is not limited thereto.

Figure 16:
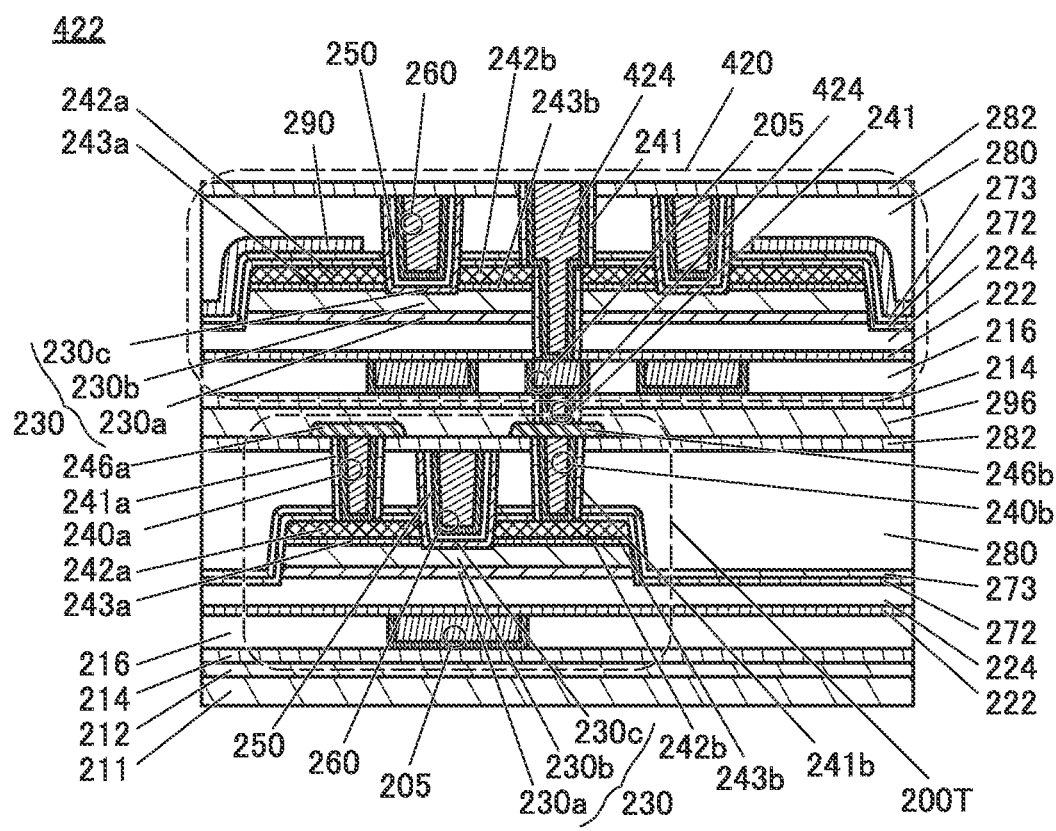
FIG. 16 is a schematic cross-sectional view showing a structure example of a semiconductor device.

FIG. 16 shows an example in which the memory device 420 is electrically connected to the conductor 242b functioning as one of the source and the drain of the transistor 200T through the conductor 424, the conductor 205, the conductor 246b, and the conductor 240b.

Thus, the method for connection between the memory device 420 and the transistor 200T can be determined in accordance with the function of the circuit included in the transistor layer 413.

Figure 17:
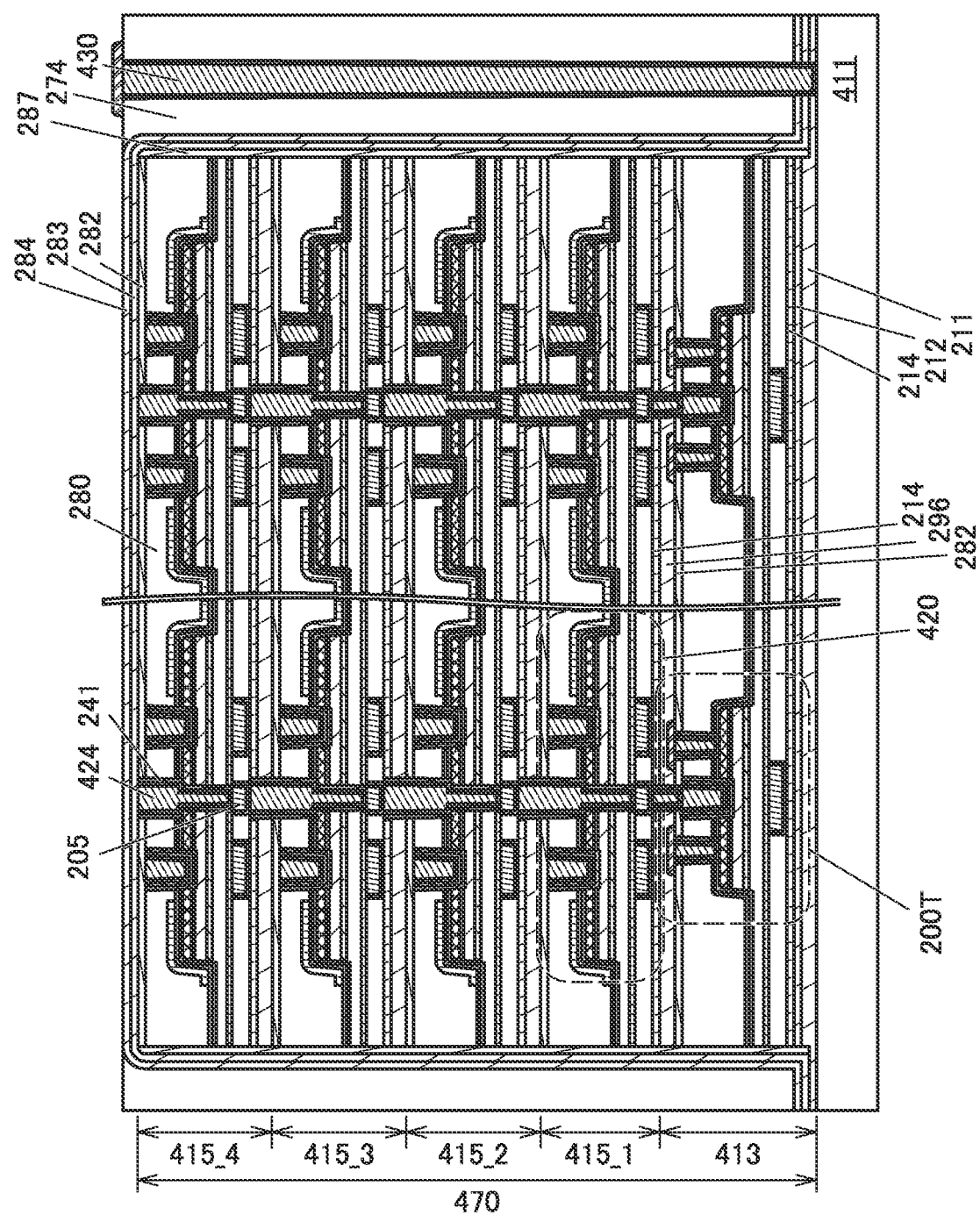
FIG. 17 is a schematic cross-sectional view showing a structure example of a semiconductor device.

FIG. 17 shows an example in which the memory unit 470 includes the transistor layer 413 including the transistor 200T and four memory device layers 415 (the memory device layer 415_1 to the memory device layer 415_4).

The memory device layer 415_1 to the memory device layer 415_4 each include a plurality of memory devices 420.

The memory device 420 is electrically connected to the memory devices 420 included in different memory device layers 415 and the transistor 200T included in the transistor layer 413 through the conductors 424 and the conductors 205.

The memory unit 470 is sealed by the insulator 211, the insulator 212, the insulator 214, the insulator 287, the insulator 282, the insulator 283, and the insulator 284. The insulator 274 is provided in the periphery of the insulator 284. Furthermore, the conductor 430 is provided in the insulator 274, the insulator 284, the insulator 283, and the insulator 211 and is electrically connected to the element layer 411.

The insulator 280 is provided inside the sealing structure. The insulator 280 has a function of releasing oxygen by heating. Alternatively, the insulator 280 includes an excess oxygen region.

The insulator 211, the insulator 283, and the insulator 284 are suitably a material having a high blocking property against hydrogen. The insulator 214, the insulator 282, and the insulator 287 are suitably a material having a function of capturing or fixing hydrogen.

Examples of the material having a high blocking property against hydrogen include silicon nitride and silicon nitride oxide. Examples of the material having a function of capturing or fixing hydrogen include aluminum oxide, hafnium oxide, and an oxide containing aluminum and hafnium (hafnium aluminate).

Note that in this specification, a barrier property means a function of inhibiting diffusion of a targeted substance (or low permeability). Alternatively, a barrier property means a function of trapping and fixing (or gettering) a targeted substance.

Note that materials used for the insulator 211, the insulator 212, the insulator 214, the insulator 287, the insulator 282, the insulator 283, and the insulator 284 may have an amorphous or crystalline structure, although the crystal structure of the materials is not particularly limited. For example, an amorphous aluminum oxide film is suitably used as the material having a function of capturing or fixing hydrogen. Amorphous aluminum oxide may capture or fix hydrogen more than aluminum oxide having high crystallinity.

Here, the following model can be considered for excess oxygen in the insulator 280 and diffusion of hydrogen from an oxide semiconductor in contact with the insulator 280.

Hydrogen existing in the oxide semiconductor is diffused, through the insulator 280 in contact with the oxide semiconductor, into another structure body. The diffusion of hydrogen occurs in such a manner that excess oxygen in the insulator 280 reacts with oxygen in the oxide semiconductor to form an OH bond, and the hydrogen is diffused into the insulator 280. The hydrogen atom having the OH bond reacts with the oxygen atom bonded to an atom (e.g., a metal atom or the like) in the insulator 282 when reaching a material having a function of capturing or fixing hydrogen (typically the insulator 282), and is captured or fixed in the insulator 282. The oxygen atom which had the OH bond of the excess oxygen is assumed to remain as excess oxygen in the insulator 280. In short, the excess oxygen in the insulator 280 probably serves a bridge linking role in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher under an atmosphere containing oxygen, an atmosphere containing nitrogen, or a mixed atmosphere of oxygen and nitrogen. The heat treatment time is one hour or more, preferably four hours or more, further preferably eight hours or more.

The heat treatment enables diffusion of hydrogen from the oxide semiconductor to the outside through the insulator 280, the insulator 282, and the insulator 287. This can reduce the absolute amount of hydrogen existing in and in the vicinity of the oxide semiconductor.

The insulator 283 and the insulator 284 are formed after the heat treatment. The insulator 283 and the insulator 284 are materials having a high blocking property against hydrogen; thus, entry of hydrogen diffused to the outside or external hydrogen to the inside, specifically, the oxide semiconductor or the insulator 280 side can be inhibited.

Although the structure in which the heat treatment is performed after the insulator 282 is formed is described as an example, there is no limitation to the structure. For example, the above-described heat treatment may be performed after formation of the transistor layer 413 or after formation of the memory device layer 415_1 to the memory device layer 415_3. When hydrogen is diffused to the outside by the above-described heat treatment, hydrogen is diffused to above the transistor layer 413 or in the lateral direction. Similarly, in the case where the heat treatment is performed after the formation of the memory device layer 415_1 to the memory device layer 415_3, hydrogen is diffused to above or in the lateral direction.

The above-described manufacturing process yields the above-described sealing structure by bonding the insulator 211 and the insulator 283.

The above-described structure and manufacturing process enable a semiconductor device using an oxide semiconductor with reduced hydrogen concentration. Accordingly, a highly reliable semiconductor device can be provided. With one embodiment of the present invention, a semiconductor device having favorable electrical characteristics can be provided.

FIG. 18A to FIG. 18C are drawings showing an example that is different from FIG. 17 in the arrangement of the conductors 424. FIG. 18A shows a layout view of the memory device 420 when seen from above, FIG. 18B is a cross-sectional view of a portion indicated by a dashed-dotted line A1-A2 in FIG. 18A, and FIG. 18C is a cross-sectional view of a portion indicated by a dashed-dotted line B1-B2 in FIG. 18A. In FIG. 18A, the conductor 205 is not illustrated to facilitate understanding of the drawing. In the case where the conductor 205 is provided, the conductor 205 includes a region overlapping with the conductor 260 and the conductor 424.

As illustrated in FIG. 18A, an opening where the conductor 424 is provided, that is, the conductor 424 is provided in not only a region overlapping with the oxide 230a and the oxide 230b but also the outside of the oxide 230a and the oxide 230b. FIG. 18A shows an example in which the conductor 424 is provided to extend beyond the oxide 230a and the oxide 230b to the B2 side; however, this embodiment is not limited thereto. The conductor 424 may be provided to extend beyond the oxide 230a and the oxide 230b to the B1 side, or to both the B1 side and the B2 side.

FIG. 18B and FIG. 18C show an example in which the memory device layer 415_p is stacked over the memory device layer 415_p−1 (p is a natural number greater than or equal to 2 and less than or equal to n). The memory device 420 included in the memory device layer 415_p−1 is electrically connected to the memory device 420 included in the memory device layer 415_p through the conductor 424 and the conductor 205.

FIG. 18B shows an example in which in the memory device layer 415_p−1, the conductor 424 is connected to the conductor 242 of the memory device layer 415_p−1 and the conductor 205 of the memory device layer 415_p. Here, the conductor 424 is also connected to the conductor 205 of the memory device layer 415_p−1 at the outside on the B2 side of the conductor 242, the oxide 243, the oxide 230b, and the oxide 230a.

As illustrated in FIG. 18C, the conductor 424 is formed along the side surfaces on the B2 side of the conductor 242, the oxide 243, the oxide 230b, and the oxide 230a, and is electrically connected to the conductor 205 through an opening formed in the insulator 280, the insulator 273, the insulator 272, the insulator 224, and the insulator 222. Here, an example in which the conductor 424 is provided along the side surfaces on the B2 side of the conductor 242, the oxide 243, the oxide 230b, and the oxide 230a is indicated by a dotted line in FIG. 18B. Furthermore, the insulator 241 is formed between the conductor 424 and the side surfaces on the B2 side of the conductor 242, the oxide 243, the oxide 230b, the oxide 230a, the insulator 224, and the insulator 222, in some cases.

Provision of the conductor 424 in a region not overlapping with the conductor 242 or the like allows the memory device 420 to be electrically connected to the memory device 420 provided in another memory device layer 415. In addition, the memory device 420 can also be electrically connected to the transistor 200T provided in the transistor layer 413.

Furthermore, when the conductor 424 serves as a bit line, provision of the conductor 424 in a region not overlapping with the conductor 242 or the like can increase the distance between bit lines of the memory devices 420 that are adjacent to each other in the B1-B2 direction. As illustrated in FIG. 18A, the distance between the conductors 424 over the conductors 242 is d1; the distance between the conductors 424 positioned below the oxide 230a, that is, in an opening formed in the insulator 224 and the insulator 222 is d2; and d2 is larger than d1. The parasitic capacitance of the conductors 424 can be reduced when the distance is partly d2 compared with the case where the distance between the conductors 424 that are adjacent to each other in the B1-B2 direction is d1. The reduction of the parasitic capacitance of the conductors 424 is preferable to reduce the capacitance necessary for the capacitive element 292.

In the memory device 420, the conductor 424 functioning as a common bit line for two memory cells is provided. The cell size of each memory cell can be reduced by appropriately adjusting the permittivity of the dielectric used in the capacitor or the parasitic capacitance between bit lines. Here, the estimation of the cell size, the bit density, and the bit cost of the memory cell when the channel length is 30 nm (also referred to as 30 nm node) is described. In FIG. 19A to FIG. 19D described below, the conductor 205 is not illustrated to facilitate understanding of the drawings. In the case where the conductor 205 is provided, the conductor 205 includes a region overlapping with the conductor 260 and the conductor 424.

FIG. 19A shows an example in which hafnium oxide with a thickness of 10 nm and 1 nm silicon oxide thereover are stacked in this order as the dielectric of the capacitor; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 432 obtained in this manner is referred to as a cell A.

The cell size of the cell A is 45.25 $F^2$.

FIG. 19B shows an example in which a first zirconium oxide, an aluminum oxide thereover, and a second zirconium oxide thereover are stacked in this order as the dielectric of the capacitor; a slit is provided in the conductor 242, the oxide 243, the oxide 230a, and the oxide 230b between the memory cells included in the memory device 420; and the conductor 424 functioning as the bit line is provided so as to overlap with the conductor 242 and the slit. A memory cell 433 obtained in this manner is referred to as a cell B.

The dielectric used for the capacitor of the cell B has a higher permittivity than that for the cell A; thus, the area of the capacitor can be reduced in the cell B. Therefore, the cell size of the cell B can be reduced compared with that of the cell A. The cell size of the cell B is 25.53 $F^2$.

The cell A and the cell B correspond to the memory cells included in the memory device 420, the memory device 420A, or the memory device 420B illustrated in FIG. 13, FIG. 15A to FIG. 15C, and FIG. 16.

FIG. 19C shows an example in which a first zirconium oxide, an aluminum oxide thereover, and a second zirconium oxide thereover are stacked as the dielectric of the capacitor; the conductor 242, the oxide 243, the oxide 230a, and the oxide 230b included in the memory device 420 are shared by the memory cells; and the conductor 424 functioning as the bit line is provided so as to overlap with a portion overlapping with the conductor 242 and a portion outside the conductor 242. A memory cell 434 obtained in this manner is referred to as a cell C.

The distance between the conductors 424 in the cell C is longer below the oxide 230a than above the conductor 242. Therefore, the parasitic capacitance of the conductors 424 can be reduced and the area of the capacitors can be reduced. Furthermore, the conductor 242, the oxide 243, the oxide 230a, and the oxide 230b are not provided with a slit. Thus, the cell size can be reduced in the cell C compared with the cell A and the cell B. The cell size of the cell C is 17.20 $F^2$.

FIG. 19D shows an example in which the conductor 205 and the insulator 216 are not provided in the cell C. Such a memory cell 435 is referred to as a cell D.

Since the conductor 205 and the insulator 216 are not provided in the cell D, the memory device 420 can be thinned. Therefore, the memory device layer 415 including the memory device 420 can be thinned, so that the height of the memory unit 470 in which the memory device layers 415 are stacked can be reduced. When the conductors 424 and the conductors 205 are regarded as a bit line, the bit line can be shortened in the memory unit 470. The shortened bit line can reduce the parasitic load in the bit line and further reduce the parasitic capacitance of the conductors 424; accordingly, the area of the capacitor can be reduced. In addition, the conductor 242, the oxide 243, the oxide 230a, and the oxide 230b are not provided with a slit. As described above, the cell size of the cell D can be reduced compared with the cell A, the cell B, and the cell C. The cell size of the cell D is 15.12 F².

The cell C and the cell D correspond to the memory cell included in the memory device 420 illustrated in FIG. 18A to FIG. 18C.

Here, the bit density and the bit cost $C_b$ of the cell A to the cell D and a cell E, which is the cell D capable of multi-level storage, were estimated. Moreover, the estimated bit density and bit cost were compared with expected values of bit density and bit cost of currently commercially available DRAMs.

The bit cost $C_b$ in the semiconductor device of one embodiment of the present invention was estimated using Formula 1.

[Formula 1]

$$C_b = \frac{(P_C + n \times P_S)}{n} \times \frac{D_d}{D_{3d}} \times \frac{1}{P_d} \quad (1)$$

Here, n is the number of stacked memory device layers, $P_c$ is the number of patterning times mainly for the element layer 411 as a common portion, $P_s$ is the number of patterning times per memory device layer 415 and transistor layer 413, $D_d$ is the bit density of a DRAM, $D_{3d}$ is the bit density of one memory device layer 415, and $P_d$ is the number of patterning times for a DRAM. Note that $P_d$ includes the number of times increased by scaling.

Table 1 shows expected values of bit density of commercially available DRAMs and estimated bit density of semiconductor devices of embodiments of the present invention. Note that two types of commercially available DRAMs with process nodes of 18 nm and 1X nm were used. As for the semiconductor devices of embodiments of the present invention, the process node was 30 nm and the number of stacked memory device layers in the cell A to the cell E was five layers, ten layers, and twenty layers; thus, the bit density was estimated.

TABLE 1

|  | DRAM | | Memory apparatus of one embodiment of the present invention | | |
|---|---|---|---|---|---|
| Manufacturer | Company A | Company B | — | | |
| Process node | 18 nm | 1X nm | 30 nm | | |
| Number of layers stacked | — | — | 5 | 10 | 20 |
| Bit density [Gb/mm²] | 0.19 (*) | 0.14 (*) | Cell A  0.05 | 0.10 | 0.20 |
|  | | | Cell B  0.09 | 0.17 | 0.35 |
| (*) represents an expected value | | | Cell C  0.13 | 0.26 | 0.52 |
|  | | | Cell D  0.15 | 0.29 | 0.59 |
|  | | | Cell E  0.30 | 0.59 | 1.18 |

Table 2 shows the results of estimation of the relative bit cost of the semiconductor devices of embodiments of the present invention from the bit cost of the commercially available DRAM. For comparison of the bit costs, the DRAM with a process node of 1X nm was used. As for the semiconductor devices of embodiments of the present invention, the process node was 30 nm and the number of stacked memory device layers in the cell A to the cell D was five layers, ten layers, and twenty layers; thus, estimation of the relative bit cost was performed.

TABLE 2

|  | DRAM | | Memory apparatus of one embodiment of the present invention | | |
|---|---|---|---|---|---|
| Manufacturer | Company A | Company B | — | | |
| Process node | 18 nm | 1X nm | 30 nm | | |
| Number of layers stacked | — | — | 5 | 10 | 20 |
| Relative bit cost when the bit cost of Company B is assumed to be 1 | — | 1 | Cell A  1.7 | 1.3 | 1.2 |
|  | | | Cell B  0.9 | 0.7 | 0.7 |
|  | | | Cell C  0.6 | 0.5 | 0.4 |
|  | | | Cell D  0.5 | 0.4 | 0.3 |

The structures described in this embodiment can be used in an appropriate combination with the structures described in the other embodiments and the like.

Embodiment 3

In this embodiment, the compositions of a CAC-OS (Cloud-Aligned Composite Oxide Semiconductor) and a CAAC-OS (c-axis Aligned Crystal Oxide Semiconductor), which are metal oxides that can be used in the OS transistor described in the above embodiments, will be described.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. The classification of the crystal structures of an oxide semiconductor will be explained with FIG. 20A. FIG. 20A is a drawing showing the classification of crystal structures of an oxide semiconductor, typically IGZO (a metal oxide containing In, Ga, and Zn).

As shown in FIG. 20A, IGZO is roughly classified into Amorphous, Crystalline, and Crystal. Amorphous includes completely amorphous. Crystalline includes CAAC (c-axis aligned crystalline), nc (nanocrystalline), and CAC (Cloud-Aligned Composite). Crystal includes single crystal and poly crystal.

Note that the structure shown in the thick frame in FIG. 20A is a structure that belongs to New crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into Crystalline (also referred to as Crystalline IGZO), are shown in FIG. 20B and FIG. 20C. FIG. 20B shows an XRD spectrum of quartz glass and FIG. 20C shows an XRD spectrum of crystalline IGZO. Note that the crystalline IGZO shown in FIG. 20C has a composition of In:Ga:Zn=4:2:3 [atomic ratio]. Furthermore, the crystalline IGZO shown in FIG. 20C has a thickness of 500 nm.

As indicated by arrows in FIG. 20B, the XRD spectrum of the quartz glass shows a substantially symmetrical peak. In contrast, as indicated by arrows in FIG. 20C, the XRD spectrum of the crystalline IGZO shows an asymmetrical peak. The asymmetrical peak of the XRD spectrum clearly shows the existence of crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to the low density of arrangement of oxygen atoms in the a-b plane direction, a change in interatomic bond distance by substitution of a metal element, and the like. A crystal structure in which a clear crystal grain boundary (grain boundary) is observed is what is called a polycrystal. It is highly probable that the crystal grain boundary becomes a recombination center and traps carriers and thus decreases the on-state current or field-effect mobility of a transistor. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and thus has a low density of trap states in some cases.

Charges trapped by the trap states in the oxide semiconductor take a long time to disappear and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the impurity concentration in the oxide semiconductor. In addition, in order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region of a transistor, stable electrical characteristics can be given.

Note that this embodiment can be combined with other embodiments in this specification as appropriate.

Embodiment 4

In this embodiment, the control logic circuit 61, the row driver circuit 62, the column driver circuit 63, and the output circuit 64 that are provided over the silicon substrate 60 of the semiconductor device 10 described in Embodiment 1 will be described.

Figure 21:
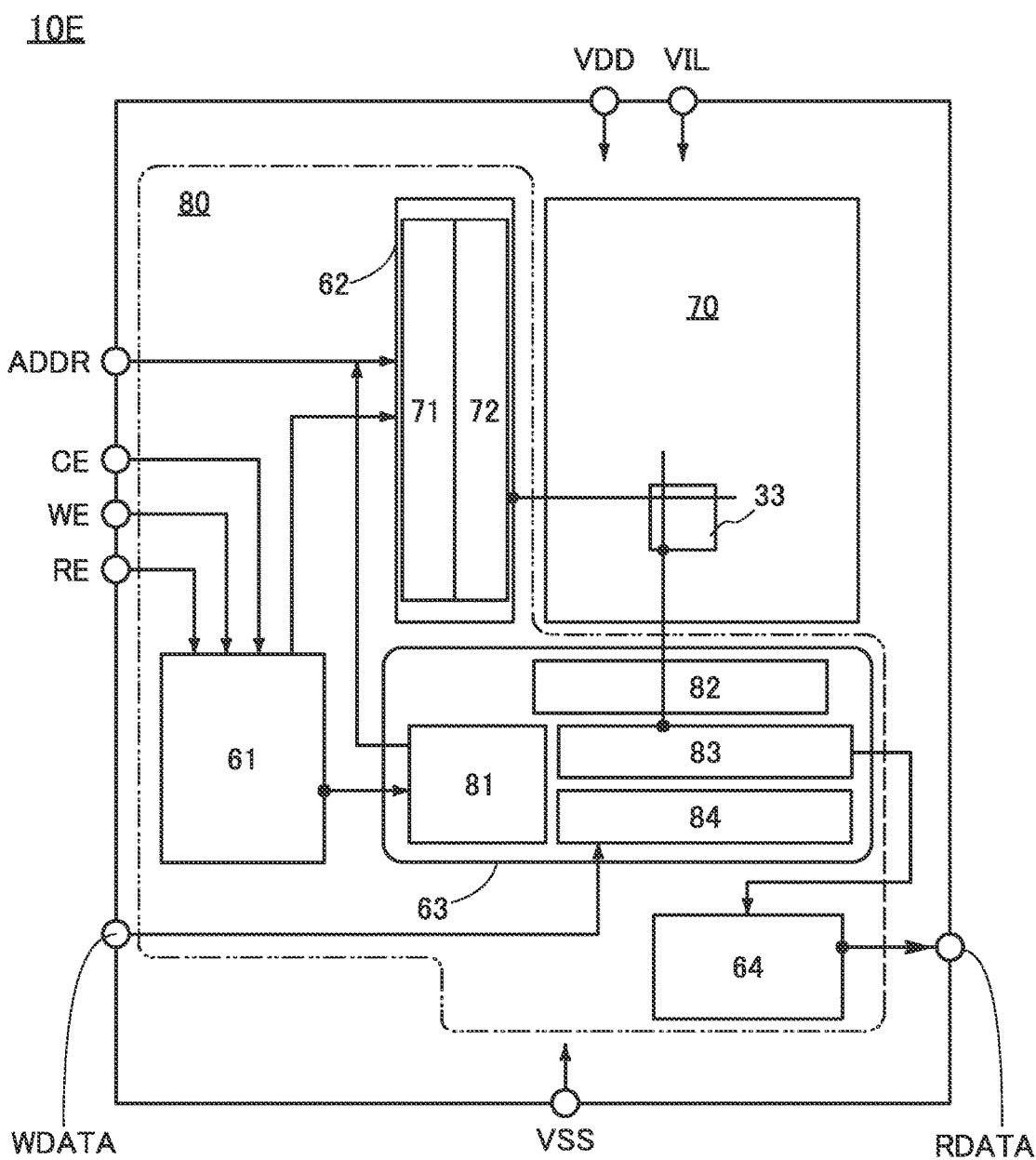
FIG. 21 is a block diagram showing a structure example of a semiconductor device.

FIG. 21 is a block diagram showing a structure example of a semiconductor device functioning as a memory apparatus. A memory device 10E includes a peripheral circuit 80 and a memory cell array 70. The peripheral circuit 80 includes the control logic circuit 61, the row driver circuit 62, the column driver circuit 63, and the output circuit 64.

The memory cell array 70 includes a plurality of memory cells 33. The row driver circuit 62 includes a row decoder 71 and a word line driver circuit 72. The column driver circuit 63 includes a column decoder 81, a precharge circuit 82, an amplifier circuit 83, and a write circuit 84. The precharge circuit 82 has a function of precharging the global bit line GBL, the local bit line LBL, or the like. The amplifier circuit 83 has a function of amplifying a data signal read from the global bit line GBL or the local bit line LBL. The amplified data signal is output to the outside of the semiconductor device 10E as a digital data signal RDATA through the output circuit 64.

As power supply voltages from the outside, a low power supply voltage (VSS), a high power supply voltage (VDD) for the peripheral circuit 80, and a high power supply voltage (VIL) for the memory cell array 70 are supplied to the semiconductor device 10E.

Control signals (CE, WE, and RE), an address signal ADDR, and a data signal WDATA are also input to the semiconductor device 10E from the outside. The address signal ADDR is input to the row decoder 71 and the column decoder 81, and WDATA is input to the write circuit 84.

The control logic circuit 61 processes the signals (CE, WE, and RE) input from the outside, and generates control signals for the row decoder 71 and the column decoder 81. CE is a chip enable signal, WE is a write enable signal, and RE is a read enable signal. The signals processed by the control logic circuit 61 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be appropriately determined as needed.

Figure 22:
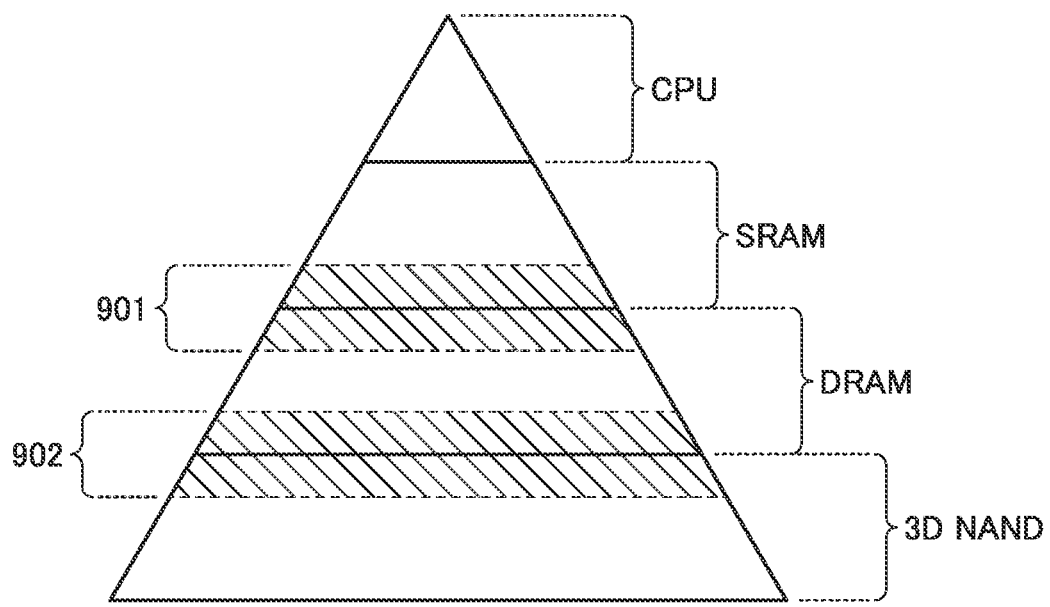
FIG. 22 is a conceptual diagram showing a structure example of a semiconductor device.

In general, a variety of memory apparatuses (memory) are used as semiconductor devices such as a computer in accordance with the intended use. FIG. 22 shows a hierarchy diagram showing various memory apparatuses with different levels. The memory apparatuses at the upper levels of the diagram require high access speeds, and the memory apparatuses at the lower levels require large memory capacity and high record density. FIG. 22 illustrates, sequentially from the top level, a memory combined as a register in an arithmetic processing device such as a CPU, an SRAM (Static Random Access Memory), a DRAM (Dynamic Random Access Memory), and a 3D NAND memory.

A memory combined as a register in an arithmetic processing device such as a CPU is used for temporary storage of arithmetic operation results, for example, and thus is very frequently accessed by the arithmetic processing device. Accordingly, rapid operation is more important than the memory capacity. The register also has a function of retaining settings of the arithmetic processing device, for example.

An SRAM is used for a cache, for example. The cache has a function of retaining a copy of part of data retained in a main memory. Copying data which is frequently used and retaining the copy of the data in the cache facilitates rapid data access.

A DRAM is used for the main memory, for example. The main memory has a function of retaining a program or data which are read from a storage. The record density of a DRAM is approximately 0.1 to 0.3 Gbit/mm$^2$.

A 3D NAND memory is used for a storage, for example. A storage has a function of retaining data that needs to be retained for a long time and programs used in an arithmetic processing device, for example. Therefore, a storage needs to have a high memory capacity and a high record density rather than operating speed. The record density of a memory apparatus used for a storage is approximately 0.6 to 6.0 Gbit/mm$^2$.

The semiconductor device functioning as the memory apparatus of one embodiment of the present invention operates fast and can retain data for a long time. The semiconductor device of one embodiment of the present invention can be favorably used as a semiconductor device positioned in a boundary region 901 including both the level in which a cache is positioned and the level in which a main memory is positioned. The semiconductor device of one embodiment of the present invention can be favorably used as a semiconductor device positioned in a boundary region 902 including both the level in which a main memory is positioned and the level in which a storage is positioned.

Embodiment 5

In this embodiment, examples of electronic components and electronic devices in which the semiconductor device or the like described in the above embodiment is incorporated will be described.

<Electronic Component>

First, examples of electronic components in which the semiconductor device 10 or the like is incorporated will be described with reference to FIG. 23A and FIG. 23B.

Figure 23A:
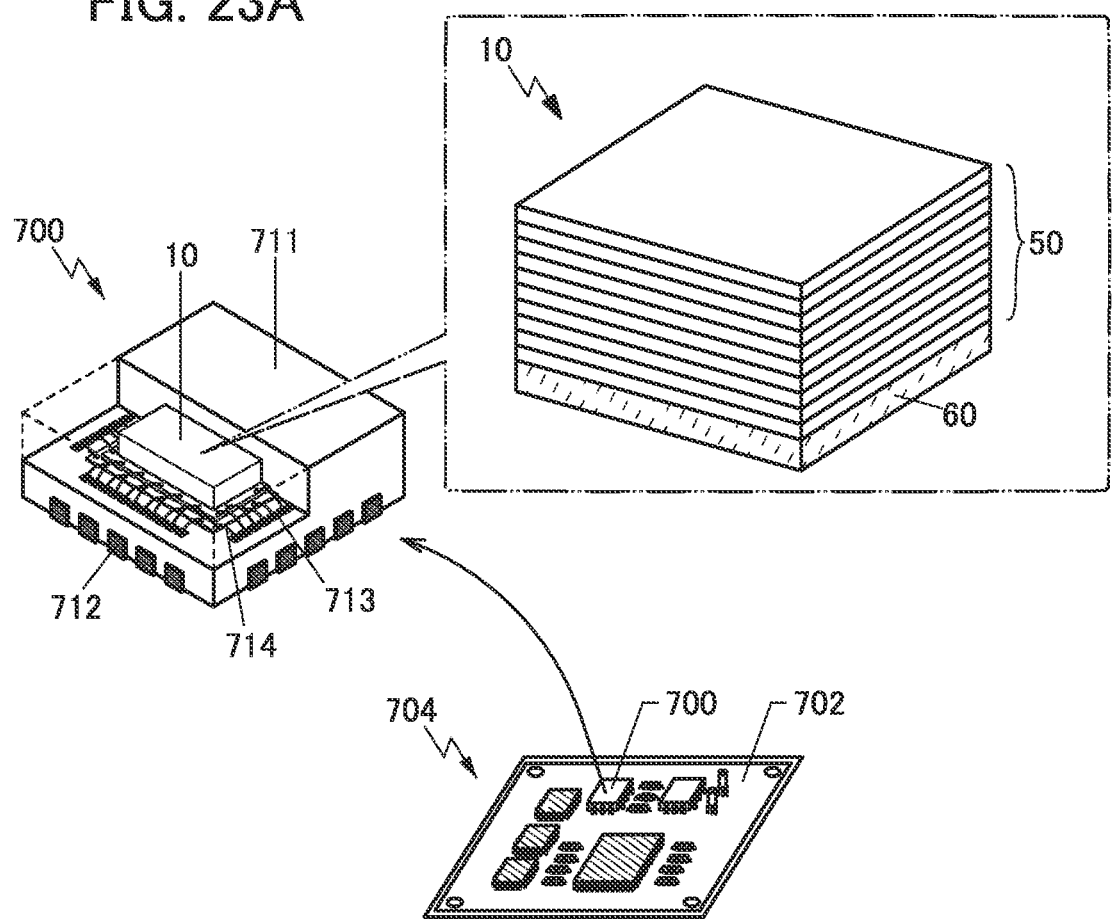
FIG. 23A and FIG. 23B are schematic views showing examples of electronic components.

FIG. 23A shows a perspective view of an electronic component 700 and a substrate (a mounting board 704) on which the electronic component 700 is mounted. The electronic component 700 illustrated in FIG. 23A includes the semiconductor device 10 in which the element layer 50 is stacked over the silicon substrate 60 in a mold 711. FIG. 23A omits part of the electronic component to show the inside of the electronic component 700. The electronic component 700 includes a land 712 outside the mold 711. The land 712 is electrically connected to an electrode pad 713, and the electrode pad 713 is electrically connected to the semiconductor device 10 via a wire 714. The electronic component 700 is mounted on a printed circuit board 702, for example.

A plurality of such electronic components are combined and electrically connected to each other on the printed circuit board 702, whereby the mounting board 704 is completed.

Figure 23B:
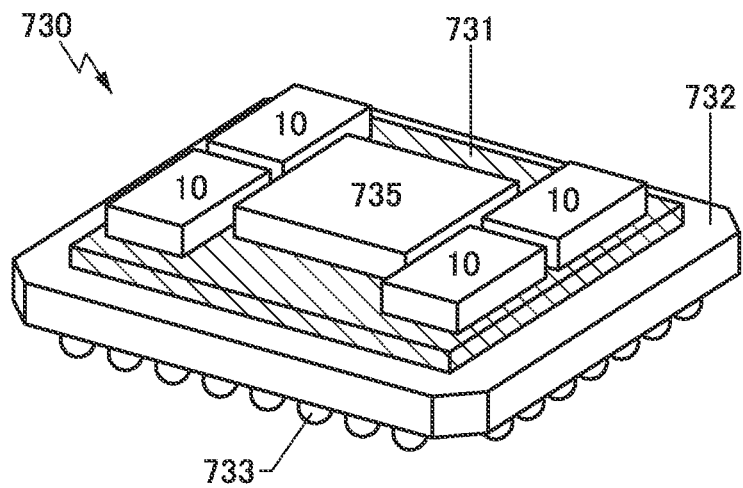

FIG. 23B shows a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of semiconductor devices 10 are provided on the interposer 731.

The electronic component 730 using the semiconductor devices 10 as high bandwidth memory (HBM) is illustrated as an example. An integrated circuit (semiconductor device) such as a CPU, a GPU, or an FPGA can be used for the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the semiconductor devices 10 and the semiconductor device 735 are preferably equal to each other.

To mount the electronic component 730 on another substrate, an electrode 733 may be provided on the bottom portion of the package substrate 732. FIG. 23B shows an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Figure 24:
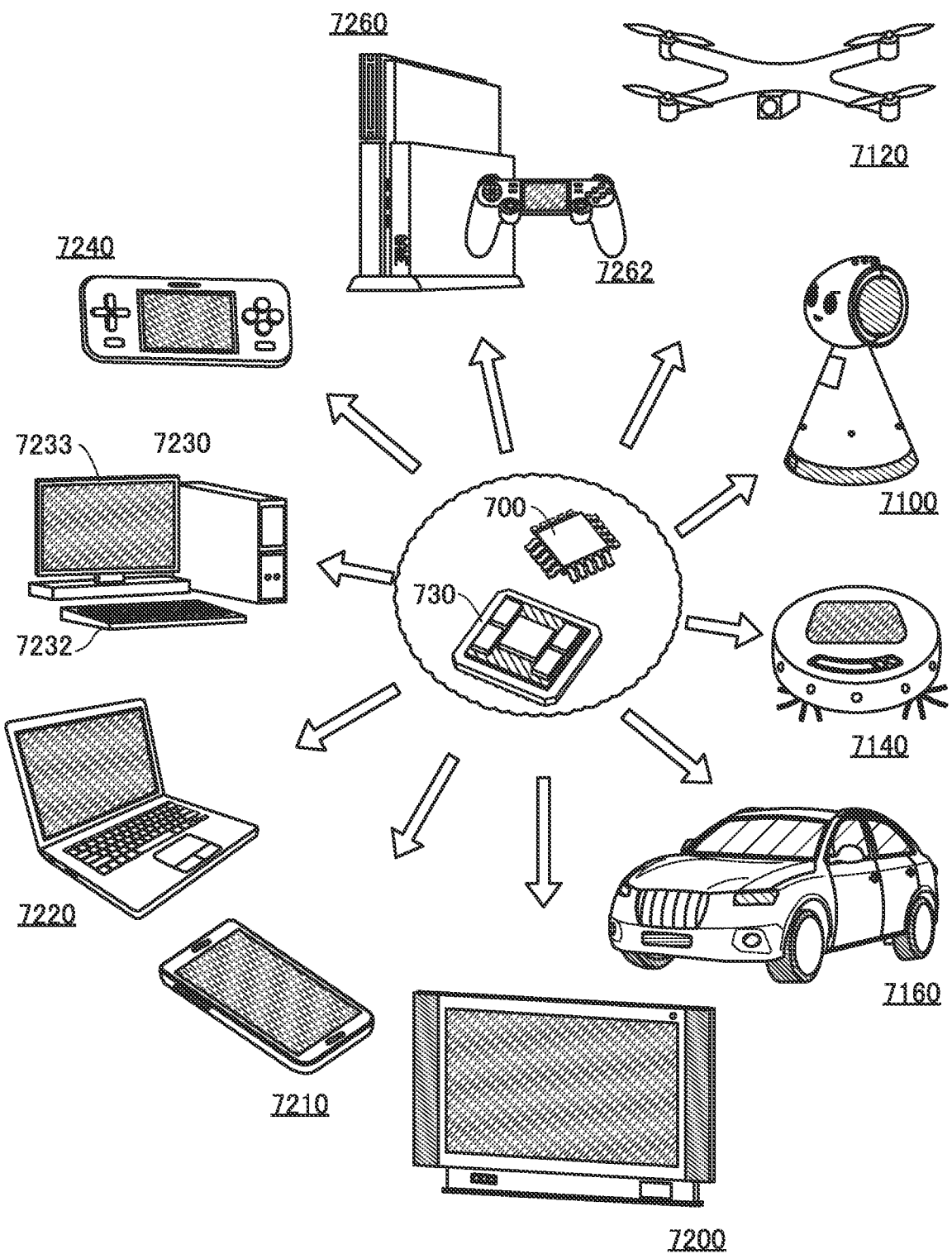
FIG. 24 is a drawing showing examples of electronic devices.

Next, examples of electronic devices including the above electronic component will be described with reference to FIG. 24.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on a top surface, a plurality of cameras provided on a side surface, a brush, an operation button, various kinds of sensors, and the like. Although not illustrated, a cleaning robot 7300 is provided with a tire, an inlet, and the like. The cleaning robot 7300 can run autonomously, detect dust, and vacuum the dust through the inlet provided on a bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

The automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can be incorporated in the controller 7262.

This embodiment can be implemented in combination with any of the structures described in the other embodiments and the like, as appropriate.

(Notes on Description of this Specification and the Like)

The description of the above embodiments and each structure in the embodiments are noted below.

One embodiment of the present invention can be constituted by combining, as appropriate, the structure described in each embodiment with any of the structures described in the other embodiments and Example. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of drawings or content described with text disclosed in the specification.

Note that by combining a drawing (or may be part thereof) described in one embodiment with another part of the diagram, a different diagram (or may be part thereof) described in the embodiment, and/or a drawing (or may be part thereof) described in another embodiment or other embodiments, much more drawings can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

10: semiconductor device, 10A: semiconductor device, 10B: semiconductor device, 10C: semiconductor device, 10E: semiconductor device, 20: transistor layer, 21: switching circuit, 21_A: switching circuit, 21_B: switching circuit, 21_1: transistor, 21_2: transistor, 21_4: transistor, 22: amplifier circuit, 22_A: amplifier circuit, 22_B: amplifier circuit, 22_1: transistor, 22_2: transistor, 223: transistor, 224: transistor, 23_1: transistor, 234: transistor, 24_1: transistor, 243: transistor, 25_1: transistor, 254: transistor, 26_1: transistor, 26_3: transistor, 27A: switch, 27B: switch, 27C: switch, 27D: switch, 30: transistor layer, 31_k: transistor layer, 31_1: transistor layer, 31_2: transistor layer, 32: transistor layer, 32_k: transistor layer, 32_1: transistor layer, 32_2: transistor layer, 33: memory cell, 34: transistor, 35: capacitor, 40: transistor layer, 41: memory cell, 41A: transistor layer, 41B: transistor layer, 42: transistor, 43: transistor, 44: capacitor, 50: element layer, 50_M: element layer, 50_1: element layer, 60: silicon substrate, 61: control logic circuit, 62: row driver circuit, 62_A: precharge circuit, 62_B: precharge circuit, 62_C: sense amplifier, 62_D: switching circuit, 62_E: switching circuit, 63: column driver circuit, 64: output circuit, 65_1: transistor, 653: transistor, 654: transistor, 656: transistor, 66_A: switch, 67_1: transistor, 67_2: transistor, 67_3: transistor, 67_4: transistor, 68_C: switch, 69: circuit, 70: memory cell array, 71: row decoder, 72: word line driver circuit, 80: peripheral circuit, 81: column decoder, 82: precharge circuit, 83: amplifier circuit, 84: circuit, 200: transistor, 200M: transistor, 200T: transistor, 205: conductor, 205a: conductor, 205b: conductor, 211: insulator, 212: insulator, 214: insulator, 216: insulator, 222: insulator, 224: insulator, 230: oxide, 230a: oxide, 230b: oxide, 230c: oxide, 240: conductor, 240a: conductor, 240b: conductor, 241: insulator, 241a: insulator, 241b: insulator, 242: conductor, 242a: conductor, 242b: conductor, 243: oxide, 243a: oxide, 243b: oxide, 246: conductor, 246a: conductor, 246b: conductor, 250: insulator, 260: conductor, 260a: conductor, 260b: conductor, 272: insulator, 273: insulator, 274: insulator, 275: insulator, 276: conductor, 277: insulator, 278: conductor, 279: insulator, 280: insulator, 282: insulator, 283: insulator, 284: insulator, 287: insulator, 290: conductor, 292: capacitive element, 292A: capacitive element, 292B: capacitive element, 294: conductor, 295: insulator, 296: insulator, 297: conductor, 298: insulator, 299: conductor, 300: transistor, 311: semiconductor substrate, 313: semiconductor region, 314a: low-resistance region, 314b: low-resistance region, 315: insulator, 316: conductor, 411: element layer, 413: transistor layer, 413_m: transistor layer, 413_1: transistor layer, 415: memory device layer, 415_n: memory device layer, 415_p: memory device layer, 415_p-1: memory device layer, 415_1: memory device layer, 415_3: memory device layer, 415_4: memory device layer, 420: memory device, 420A: memory device, 420B: memory device, 422: region, 424: conductor, 426: conductor, 428: conductor, 430: conductor, 432: memory cell, 433: memory cell, 434: memory cell, 435: memory cell, 470: memory unit, 470_m: memory unit, 470_1: memory unit, 700: electronic component, 702: printed circuit board, 704: mounting board, 711: mold, 712: land, 713: electrode pad, 714: wire, 730: electronic component, 731: interposer, 732: package substrate, 733: electrode, 735: semiconductor device, 901: boundary region, 902: boundary region, 7100: robot, 7120: flying object, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller, 7300: cleaning robot

The invention claimed is:

1. A semiconductor device comprising:
a driver circuit comprising a plurality of transistors using a silicon substrate for a channel; and
a first transistor layer to a third transistor layer each comprising a plurality of transistors using a metal oxide for a channel,
wherein the first transistor layer comprises a first memory cell comprising a first transistor and a first capacitor,
wherein the second transistor layer comprises a second memory cell comprising a second transistor and a second capacitor,
wherein the third transistor layer comprises a switching circuit and an amplifier circuit,
wherein the first transistor is electrically connected to a first local bit line,
wherein the second transistor is electrically connected to a second local bit line,
wherein the switching circuit is configured to select the first local bit line or the second local bit line and electrically connect the selected local bit line to the amplifier circuit,
wherein the first transistor layer to the third transistor layer are provided over the silicon substrate, and
wherein the third transistor layer is provided between the first transistor layer and the second transistor layer.

2. The semiconductor device according to claim 1, wherein the first local bit line and the second local bit line are provided in a direction perpendicular to a surface of the silicon substrate or a direction substantially perpendicular to the surface of the silicon substrate.

3. The semiconductor device according to claim 1, further comprising a global bit line, wherein the global bit line is configured to electrically connect the amplifier circuit and the driver circuit.

4. The semiconductor device according to claim 3, wherein the global bit line is provided in the direction perpendicular to the surface of the silicon substrate or the direction substantially perpendicular to the surface of the silicon substrate.

5. The semiconductor device according to claim 1, wherein the metal oxide comprises In, Ga, and Zn.

6. A semiconductor device comprising:
a driver circuit comprising a plurality of transistors using a silicon substrate for a channel; and
an element layer in which a plurality of transistor layers are stacked,
wherein the element layer comprises a first transistor layer to a third transistor layer each comprising a plurality of transistors using a metal oxide for a channel,
wherein the first transistor layer comprises a first memory cell comprising a first transistor and a first capacitor,
wherein the second transistor layer comprises a second memory cell comprising a second transistor and a second capacitor,
wherein the third transistor layer comprises a switching circuit and an amplifier circuit,
wherein the first transistor is electrically connected to a first local bit line,
wherein the second transistor is electrically connected to a second local bit line,
wherein the switching circuit is configured to select the first local bit line or the second local bit line and electrically connect the selected local bit line to the amplifier circuit,
wherein the element layer is stacked over the silicon substrate, and
wherein the third transistor layer is provided between the first transistor layer and the second transistor layer.

7. The semiconductor device according to claim 6, wherein the first local bit line and the second local bit line are provided in a direction perpendicular to a surface of the silicon substrate or a direction substantially perpendicular to the surface of the silicon substrate.

8. The semiconductor device according to claim 6, further comprising a global bit line,
wherein the global bit line is configured to electrically connect the amplifier circuit and the driver circuit.

9. The semiconductor device according to claim 8, wherein the global bit line is provided in the direction perpendicular to the surface of the silicon substrate or the direction substantially perpendicular to the surface of the silicon substrate.

10. The semiconductor device according to claim 6, wherein the metal oxide comprises In, Ga, and Zn.

11. An electronic device comprising:
the semiconductor device described in claim 1; and
at least one of an antenna, a battery, an operation switch, a microphone, and a speaker.

12. The semiconductor device according to claim 2, further comprising a global bit line,
wherein the global bit line is configured to electrically connect the amplifier circuit and the driver circuit.

13. The semiconductor device according to claim 7, further comprising a global bit line,
wherein the global bit line is configured to electrically connect the amplifier circuit and the driver circuit.

14. The semiconductor device according to claim 2, wherein the metal oxide comprises In, Ga, and Zn.

15. The semiconductor device according to claim 3, wherein the metal oxide comprises In, Ga, and Zn.

16. The semiconductor device according to claim 4, wherein the metal oxide comprises In, Ga, and Zn.

17. The semiconductor device according to claim 7, wherein the metal oxide comprises In, Ga, and Zn.

18. The semiconductor device according to claim 8, wherein the metal oxide comprises In, Ga, and Zn.

19. The semiconductor device according to claim 9, wherein the metal oxide comprises In, Ga, and Zn.

* * * * *